United States Patent
Yamamoto et al.

(10) Patent No.: US 7,494,923 B2
(45) Date of Patent: Feb. 24, 2009

(54) MANUFACTURING METHOD OF WIRING SUBSTRATE AND SEMICONDUCTOR DEVICE

(75) Inventors: Hiroko Yamamoto, Kanagawa (JP); Osamu Nakamura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/151,003

(22) Filed: Jun. 13, 2005

(65) Prior Publication Data

US 2005/0276912 A1      Dec. 15, 2005

(30) Foreign Application Priority Data

Jun. 14, 2004   (JP)   ............... 2004-175833

(51) Int. Cl.
  *H01L 21/44* (2006.01)
(52) U.S. Cl. ............... 438/662; 438/660; 438/669; 438/676; 257/E21.533; 257/E21.534; 257/E21.535; 257/E21.582
(58) Field of Classification Search ............... 438/652, 438/660, 662, 669; 257/E21.533–535, E21.582
See application file for complete search history.

(56) References Cited

U.S. PATENT DOCUMENTS

| | | | | |
|---|---|---|---|---|
| 4,496,607 A | * | 1/1985 | Mathias | ............... 174/255 |
| 4,685,033 A | * | 8/1987 | Inoue | ............... 361/794 |
| 4,931,323 A | * | 6/1990 | Manitt et al. | ............... 427/555 |
| 5,132,248 A | | 7/1992 | Drummond et al. | ......... 437/173 |
| 5,512,514 A | | 4/1996 | Lee | |
| 5,652,042 A | * | 7/1997 | Kawakita et al. | ............ 428/209 |
| 5,822,856 A | * | 10/1998 | Bhatt et al. | ................. 29/832 |
| 6,294,401 B1 | | 9/2001 | Jacobson et al. | .............. 438/99 |
| 6,313,435 B1 | | 11/2001 | Shoemaker et al. | |
| 6,362,507 B1 | | 3/2002 | Ogawa et al. | ............... 257/350 |
| 6,416,583 B1 | | 7/2002 | Kitano et al. | ............... 118/680 |
| 6,503,831 B2 | | 1/2003 | Speakman | |
| 6,514,801 B1 | | 2/2003 | Yudasaka et al. | ............ 438/151 |
| 6,627,263 B2 | | 9/2003 | Kitano et al. | ............... 427/346 |
| 6,630,274 B1 | | 10/2003 | Kiguchi et al. | |
| 6,713,389 B2 | | 3/2004 | Speakman | ................... 438/674 |
| 6,715,871 B2 | | 4/2004 | Hashimoto et al. | |
| 6,794,220 B2 | | 9/2004 | Hirai et al. | ..................... 438/99 |

(Continued)

FOREIGN PATENT DOCUMENTS

EP      1087428      3/2001

(Continued)

*Primary Examiner*—Michelle Estrada
*Assistant Examiner*—Jarrett J Stark
(74) *Attorney, Agent, or Firm*—Cook Alex Ltd.

(57) ABSTRACT

The present invention provides a method for forming a wiring having a minute shape on a large substrate with a small number of steps, and further a wiring substrate formed by the method. Moreover, the present invention provides a semiconductor device in which cost reduction and throughput improvement are possible due to the small number of steps and reduction of materials and which has a semiconductor element with a minute structure, and further a manufacturing method thereof. According to the present invention, a composition including metal particles and organic resin is irradiated with laser light and a part of the metal particles is baked to form a conductive layer typified by a wiring, an electrode or the like over a substrate. Further, a semiconductor device having the baked conductive layer as a wiring or an electrode is formed.

27 Claims, 31 Drawing Sheets

U.S. PATENT DOCUMENTS

| | | |
|---|---|---|
| 6,810,814 B2 | 11/2004 | Hasei |
| 6,849,109 B2 * | 2/2005 | Yadav et al. ............. 106/31.13 |
| 6,953,951 B2 | 10/2005 | Yamazaki et al. |
| 6,957,608 B1 | 10/2005 | Hubert et al. |
| 6,992,001 B1 * | 1/2006 | Lin ............................ 438/612 |
| 7,061,570 B2 | 6/2006 | Imai |
| 7,183,146 B2 | 2/2007 | Yamazaki et al. |
| 7,288,420 B1 | 10/2007 | Yamazaki et al. |
| 2001/0045974 A1 | 11/2001 | Shoemaker et al. |
| 2002/0070382 A1 | 6/2002 | Yamazaki et al. |
| 2002/0136829 A1 | 9/2002 | Kitano et al. ................ 427/240 |
| 2003/0030689 A1 | 2/2003 | Hashimoto et al. |
| 2003/0054653 A1 | 3/2003 | Yamazaki et al. ........... 438/694 |
| 2003/0059987 A1 | 3/2003 | Sirringhaus et al. ......... 438/149 |
| 2003/0083203 A1 | 5/2003 | Hashimoto et al. |
| 2004/0083446 A1 * | 4/2004 | Hasei ........................ 716/21 |
| 2004/0147066 A1 | 7/2004 | Yamazaki et al. |
| 2004/0147113 A1 | 7/2004 | Yamazaki et al. .......... 438/660 |
| 2004/0207800 A1 * | 10/2004 | Hiruma et al. .............. 349/189 |
| 2004/0212645 A1 * | 10/2004 | Usuda ........................ 347/10 |
| 2004/0253835 A1 | 12/2004 | Kawase ...................... 438/780 |
| 2005/0008880 A1 * | 1/2005 | Kunze et al. ................. 428/447 |
| 2005/0014319 A1 | 1/2005 | Yamazaki et al. |
| 2005/0022374 A1 * | 2/2005 | Hirai et al. .................... 29/825 |
| 2005/0043186 A1 | 2/2005 | Maekawa et al. |
| 2005/0095356 A1 * | 5/2005 | Nakamura et al. ............ 427/58 |
| 2005/0112906 A1 | 5/2005 | Maekawa et al. |
| 2005/0142896 A1 | 6/2005 | Imai et al. |
| 2005/0161783 A1 * | 7/2005 | Hashimoto .................. 257/678 |
| 2005/0239365 A1 * | 10/2005 | Hiraoka ....................... 445/61 |
| 2005/0253524 A1 * | 11/2005 | Ishida ........................ 313/634 |
| 2005/0276912 A1 * | 12/2005 | Yamamoto et al. .......... 427/117 |
| 2006/0068080 A1 * | 3/2006 | Yadav et al. .................... 427/8 |
| 2006/0158482 A1 | 7/2006 | Nakamura et al. |
| 2006/0165546 A1 * | 7/2006 | Yamada et al. ................. 419/6 |
| 2006/0211187 A1 * | 9/2006 | Choi et al. .................. 438/197 |
| 2007/0093002 A1 | 4/2007 | Maekawa et al. |
| 2007/0181945 A1 | 8/2007 | Nakamura |
| 2008/0042212 A1 * | 2/2008 | Kamath et al. .............. 257/369 |

FOREIGN PATENT DOCUMENTS

| | | |
|---|---|---|
| JP | 01089589 A * | 4/1989 |
| JP | 5-338187 | 12/1993 |
| JP | 05-338187 | 12/1993 |
| JP | 6-182980 | 7/1994 |
| JP | 6-237063 | 8/1994 |
| JP | 08-062445 | 3/1996 |
| JP | 10-270843 | 10/1998 |
| JP | 2000-188251 | 7/2000 |
| JP | 2001-179167 | 7/2001 |
| JP | 2002-324966 | 11/2002 |
| JP | 2002-359246 | 12/2002 |
| JP | 2004-055363 | 2/2004 |
| JP | 2004281738 A * | 10/2004 |

* cited by examiner

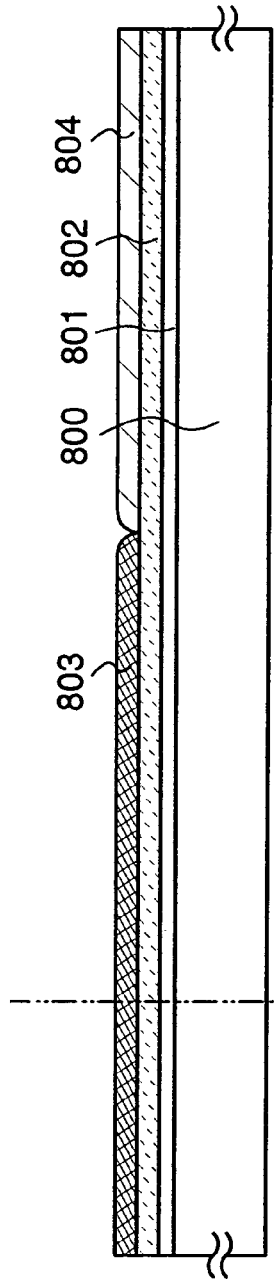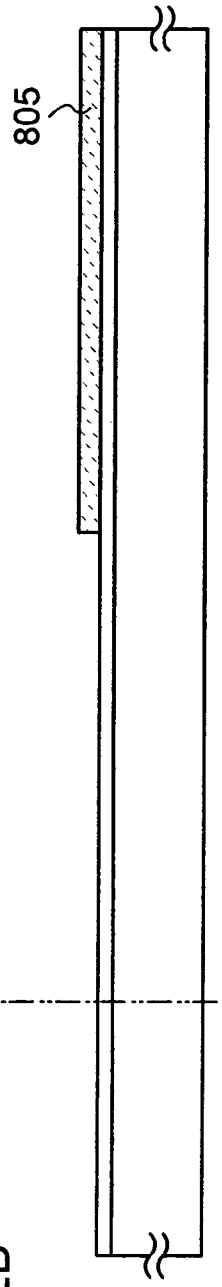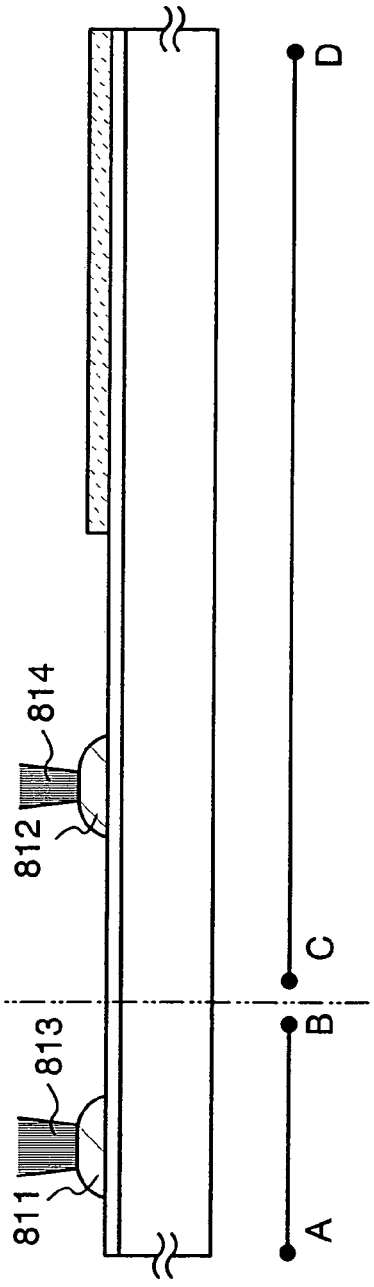

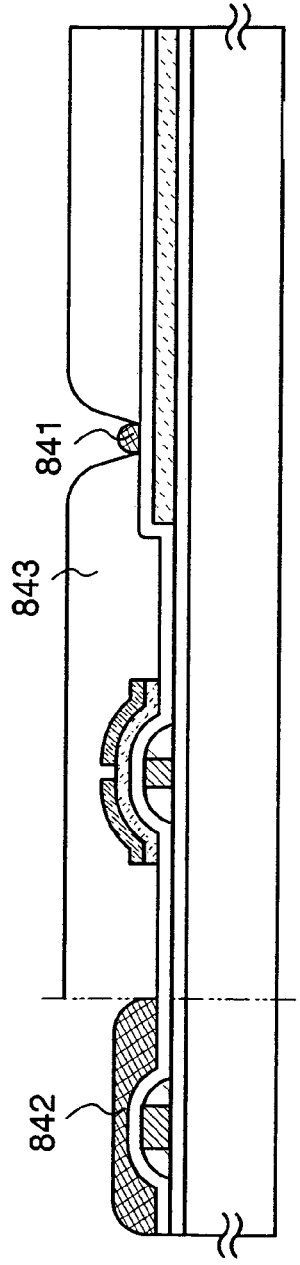
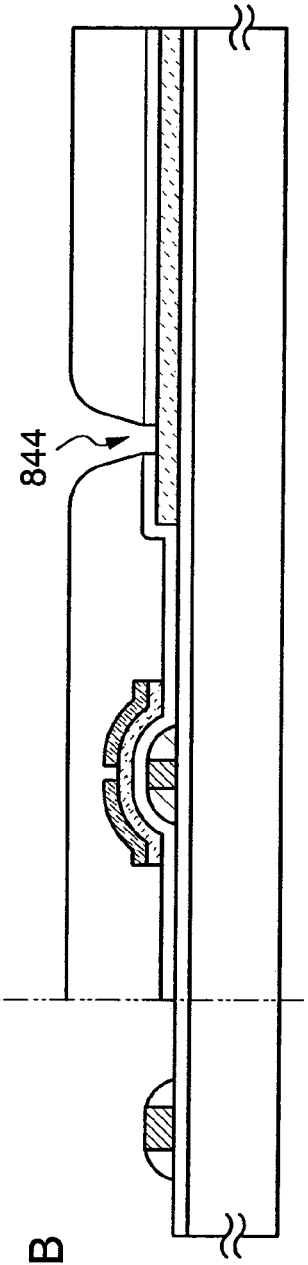
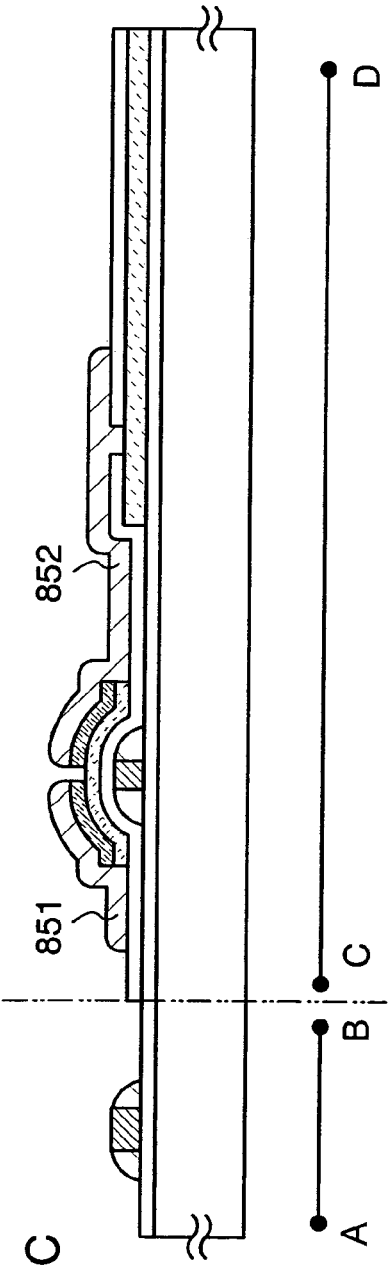
FIG. 14A
FIG. 14B
FIG. 14C

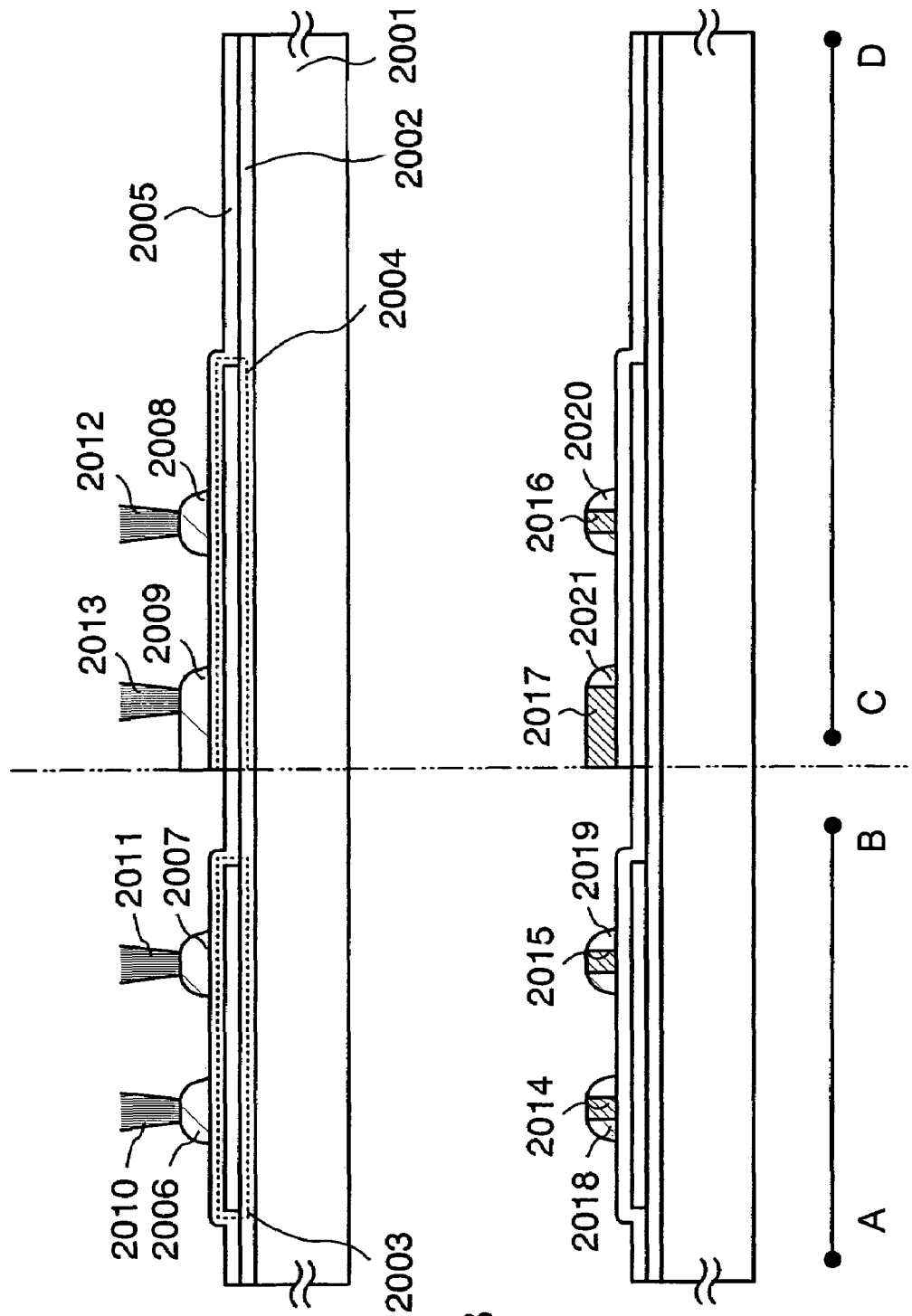

condition 1: sample baked by heating for 30 minutes at 100 °C
condition 2: sample baked by laser light
(wavelength of laser light 532 nm, scan speed 500 mm/sec)

MANUFACTURING METHOD OF WIRING SUBSTRATE AND SEMICONDUCTOR DEVICE

BACKGROUND OF THE PRESENT INVENTION

1. Field of the Present Invention

The present invention relates to a wiring substrate and a semiconductor device having a semiconductor element formed by a droplet discharging method typified by an ink-jet method, and further manufacturing methods thereof.

2. Description of the Related Art

Conventionally, an active matrix driving type display panel or semiconductor integrated circuit including a semiconductor element typified by a thin film transistor (hereinafter, TFT) or a MOS transistor is formed by patterning each thin film with light-exposure process (hereinafter, a photolithography process) using a photomask.

In the photolithography process, resist is applied to a whole substrate, pre-baked, then the substrate is irradiated with ultraviolet rays or the like using a photomask and a resist pattern is formed by development. After that, a thin film existing outside a portion to be a film pattern or a wiring (a film of a semiconductor material, an insulator material, or a conductor material) is etch-removed with the resist pattern as a mask pattern for forming a film-pattern or a wiring.

Reference 1 (Japanese Patent Laid-Open No. 2000-188251) describes a technique for forming a film on a semiconductor wafer with an apparatus that can continuously discharge resist from its nozzle to have a linear shape with a small diameter so as to reduce loss of materials for forming films.

However, when forming a wiring or a film-pattern using a conventional photolithography process, almost all materials of the wiring or the film pattern and a resist material become wasted and the number of steps of forming the wiring or a mask pattern becomes large; therefore throughput is decreased.

A light-exposure apparatus used in the photolithography process has difficulty in exposing a large substrate to light at once. Accordingly, a manufacturing method of a semiconductor device using a large substrate needs a plurality of times of light-exposure, which leads to misalignment with an adjacent pattern and reduction in yield.

It is necessary to discharge a material solution whose droplet diameter is small in order to form a semiconductor element that is minute and occupies a small area by a droplet-discharging method. Reduction in diameter of the discharge opening is required to be small so as to discharge such a material solution. However, in this case, the tip of the discharge opening is clogged with the material solution because a composition of the material solution is attached thereto, dried or solidified therein, and thus it is difficult to discharge a constant amount of material solution continuously or stably. Consequently, there is a problem in that throughput or yield of a semiconductor device using the semiconductor element is reduced.

SUMMARY OF THE INVENTION

The present invention has been made in view of the above described problems. It is an object of the present invention to provide a method for forming a wiring on a large substrate with a small number of steps, and further a wiring substrate formed by the method.

Moreover, it is another object of the present invention to provide a semiconductor device in which cost reduction and throughput improvement are possible due to the small number of steps and reduction of materials and which has a semiconductor element with a minute structure, and further a manufacturing method thereof.

According to the present invention, a composition including metal particles and organic resin that has been formed over a substrate is irradiated with laser light and a part of the metal particles is baked to form the substrate having a conductive layer typified by a wiring, an electrode or the like.

According to the present invention, a semiconductor device having the baked conductive layer as a wiring or an electrode is formed.

The composition is one in which metal particles are dispersed or dissolved in one or a plurality of organic resin to serve as a binder, a solvent, a dispersant or a coating agent. Accordingly, a portion of the organic resin evaporates and meal particles are baked and adhered to each other by laser irradiation onto the composition to form a conductive layer. At the time, the composition remains on one side or opposite sides of the conductive layer.

The width of a beam spot of laser light is adjusted appropriately, thereby forming a conductive layer having a desired width. Accordingly, a conductive layer having a narrower width (typically, 10 µm or less, preferably 0.3 to 1 µm, more preferably 0.5 to 0.8 µm) can be formed by emitting laser light having a beam-spot width narrower than a width of the composition with a laser beam directly-drawing apparatus or the like. A semiconductor element having a short channel structure can be formed using such a conductive layer as a gate electrode, and a semiconductor device that operates at high speed and in which elements are integrated with high density can be manufactured.

As the composition remaining on one side or opposite sides of the conductive layer, metal particles are dispersed in organic resin serving as a solvent. Accordingly, the composition is conductive or insulative depending on the density of metal particles. In other words, the composition provided on a side of the conductive layer is conductive when the density of metal particles is high and the contact area of particles is large. On the other hand, when the density of metal particles is low and the periphery of metal particles is coated with organic resin, the composition remaining on one side or opposite sides of the conductive layer is insulative. Thus, when the composition remaining on one side or opposite sides of the conductive layer is insulative, only the conductive layer irradiated with laser light serves as a wiring or an electrode. Therefore, a stable conductive layer that is resistant to falling down can be formed even when the conductive layer whose aspect ratio is large (longitudinal length>lateral length) is adopted. The coverage of an insulating layer or a semiconductor layer to be formed later can be improved and thus, a highly reliable semiconductor element can be formed.

The present invention has the following structures.

One of the present invention is a wiring substrate including: a wiring formed over a substrate, which is a conductive layer in which first metal particles are baked; and an organic resin layer which is provided on a side of the wiring and in which second metal particles are dispersed, wherein the first metal particles and the second metal particles are formed from the same metal element. In this case, the metal element may include a plurality of metal elements.

One feature of the present invention is a wiring substrate including a wiring and an organic resin layer provided on the sideface thereof, wherein the organic resin layer includes metal particles and the wiring includes the metal particles that are baked. In addition, a conductive layer, an insulating layer or a semiconductor layer to be in contact with the wiring or the organic resin layer may be provided. Note that the organic resin layer is provided only on the opposite sides or one side of the wiring. At this time, the wiring is linear.

The rate of the metal element in the wiring is higher than that in the organic resin layer.

Further, the rate of organic resin in the wiring is lower than that in the organic resin layer.

The cross section of the wiring is a quadrilateral having approximate orthogonal angles or an approximate trapezoid. In the case of the trapezoid-shaped cross section, the width of a wiring contacting with a substrate may be narrower than that of the width of the wiring surface. Alternatively, the width of the wiring contacting with the substrate may be wider than that of the width of the wiring surface.

The width of the wiring is 0.3 µm or more and 1.0 µm or less, preferably 0.5 µm or more and 0.8 µm or less.

One feature of the present invention is a method for manufacturing a wiring substrate, including the steps of: forming a pattern by discharging a composition containing a metal particle and an organic resin over a substrate; and irradiating the pattern with laser light to bake a portion of the metal particle included in the pattern to form a wiring. In this case, irradiation of the laser light is preferably conducted in a direction parallel to a major axis of the pattern. The laser light is continuous wave laser light or pulsed oscillation laser light.

One feature of the present invention is a semiconductor device including a semiconductor element having the wiring as a gate electrode. As the semiconductor element, for example, a TFT, a field effect transistor (FET), a MOS transistor, a bipolar transistor, an organic semiconductor transistor, an MIM element, a memory element, a diode, a photoelectric converter, a capacitor, a resistor and the like can be used. The TFT is, for example, a staggered TFT, an inverted staggered TFT (a channel-etch type TFT or a channel protective type TFT), a top gate coplanar TFT, a bottom gate coplanar TFT and the like.

One feature of the present invention is a method for manufacturing a semiconductor device, including the steps of: forming a pattern by discharging a composition containing a metal particle and an organic resin over a substrate; irradiating the pattern with laser light to bake a portion of the metal particle included in the pattern to form a gate electrode; and forming a thin film over a region of the gate electrode and the pattern that is not irradiated with the laser light.

In the present invention, the semiconductor device is, for example, an integrated circuit, a display device, a wireless tag, an IC tag, and the like that each include a semiconductor element. The display device is, for example, a liquid crystal display device, a light emitting display device, a DMD (Digital Micromirror Device), a PDP (Plasma Display Panel), an FED (Field Emission Display), an electrophoresis display device (electronic paper) and the like.

In the present invention, a display device means a device using a display element, that is, an image-displaying device. Further, a module in which a connector such as a flexible printed circuit (FPC) or a TAB (Tape Automated Bonding) tape or a TCP (Tape Carrier Package) are attached to a display panel, a module in which a printed wiring board is provided for an edge of a TAB tape or a TCP, a module in which an IC (Integrated Circuit) and a CPU are directly mounted on a display element by a COG (Chip On Glass) method are all included in the display device.

According to the present invention, a portion of a composition including metal particles and organic resin is directly irradiated with a laser beam to bake the metal particles, thereby forming a wiring having a minute and narrow width without using a photo mask. In addition, the width of the laser beam is made narrow and a part of the composition is irradiated with the laser beam; therefore, micro fabrication of a film-pattern formed by a droplet-discharging method is possible and a semiconductor element having a minute structure can be formed. Moreover, a semiconductor element having a short channel length can be formed by using the conductive layer as a gate electrode. Therefore, a semiconductor device in which a semiconductor element that operates at high speed is integrated with high density can be formed.

The metal particles contained in the composition dropped by a droplet discharging method are baked without being heat-treated using a furnace or the like, thereby forming the conductor layer. Therefore, it is possible to manufacture a wiring substrate or a semiconductor device using a plastic substrate that has inferior heat-resistance and a flexible substrate. Accordingly, it is possible to manufacture a light and thin semiconductor device and further a liquid crystal television and an EL television having the semiconductor device.

When a droplet discharging method is employed in forming a film pattern, a droplet can be discharged onto an arbitrary position by changing a relative position of a nozzle that is a discharge opening of a droplet including its film material and a substrate. In addition, a thickness and a width of a pattern to be formed can be adjusted depending on a nozzle diameter, the amount of droplets to be discharged, and a relative relationship between movement speed of a nozzle and that of a substrate to be provided with a discharged droplet. Accordingly, a film pattern can be formed in a desired portion with high accuracy by discharging even over a large substrate having a side of 1 m to 2 m or more. Yield can be improved because misalignment with an adjacent film pattern is not caused. As a result, a semiconductor device can be manufactured with the small number of steps and with high yield.

Moreover, a liquid crystal television and an EL television having a semiconductor device that is formed according to the above described manufacturing steps can be manufactured at low cost with high throughput and yield.

BRIEF DESCRIPTION OF THE DRAWINGS

In the accompanying drawings:

FIGS. 12A to 12C are each a cross-sectional view showing a manufacturing step of a semiconductor device according to the present invention;

FIGS. 14A to 14C are each a cross-sectional view showing a manufacturing step of a semiconductor device according to the present invention;

FIGS. 19A and 19B are each a cross-sectional view showing a manufacturing step of a semiconductor device according to the present invention;

DETAILED DESCRIPTION OF THE PRESENT INVENTION

Figure 1A:
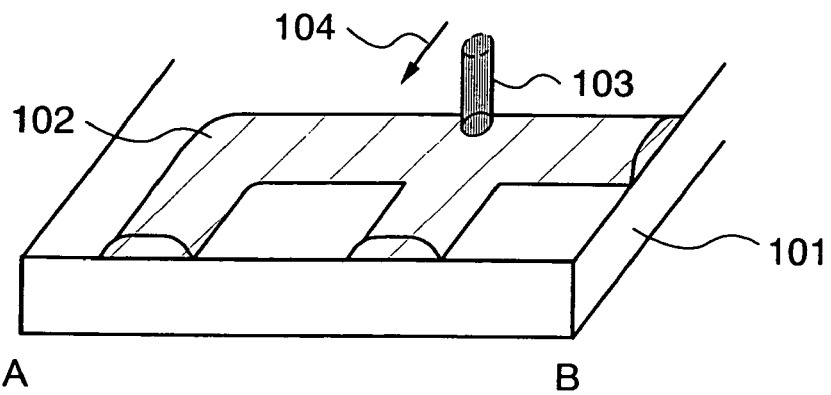
FIGS. 1A to 1D are each a perspective view showing a manufacturing step of a wiring according to the present invention.

Embodiment Modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below. Note that the same reference numerals are used for the same portions through all drawings and detailed description is omitted.

Embodiment Mode 1

In Embodiment Mode 1, a process for forming a wiring having a thin width by irradiation of a laser beam (hereinafter referred to as laser light) is described with reference to FIGS. 1A to 1D, 2 and 3A to 3C.

Figure 2:
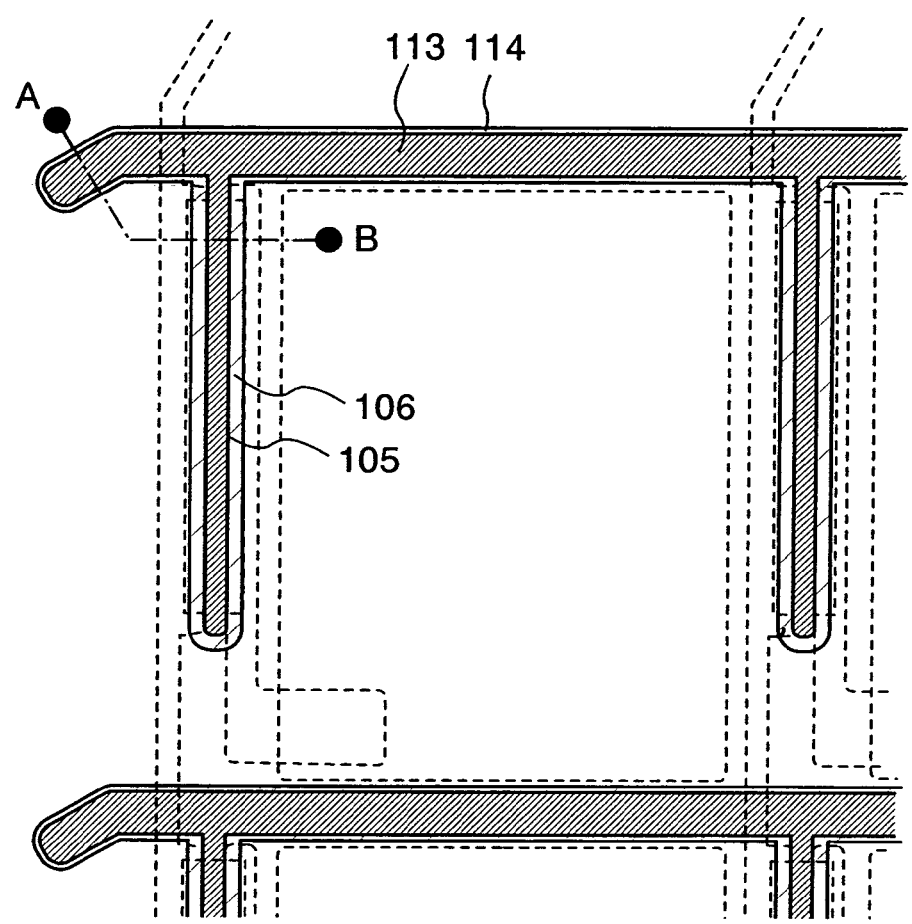
FIG. 2 is a top view showing a manufacturing step of a wiring according to the present invention.

FIG. 2 is a top view of a substrate 101 in which pixels are arranged in matrix. On the substrate 101, a second conductive layer 113 serving as a gate wiring of a semiconductor element that is to be formed later and a first conductive layer 105 serving as a gate electrode to be connected thereto are shown by a solid line. Note that a dashed line shows a source wiring, a semiconductor region, a source electrode, a drain electrode, a pixel electrode and the like of the semiconductor element that is to be formed later.

FIGS. 1A to 1D are each a perspective view of a cross-section taken along A-B in FIG. 2. As shown in FIG. 1A, a first pattern material is discharged on the substrate 101 by a droplet discharging method and dried to form a first pattern 102. Note that the droplet discharging method is a method by which a pattern having a desired shape is formed by discharging droplets of an adjusted composition from a minute opening.

A glass substrate, a quartz substrate, a ceramic substrate such as alumina, a plastic substrate, a silicon wafer, a metal plate and the like can be used as the substrate 101. In the case of a glass substrate as the substrate 101, a glass substrate having a large area can be employed, e.g., 320 mm×400 mm, 370 mm×470 mm, 550 mm×650 mm, 600 mm×720 mm, 680 mm×880 mm, 1000 mm×1200 mm, 1100 mm×1250 mm, 1150 mm×1300 mm.

As representative examples of the plastic substrate, a plastic substrate formed from PET (polyethylene terephthalate), PEN (polyethylene naphthalate), PES (polyether sulfide), polypropylene, polypropylene sulfide, polycarbonate, polyetherimide, polyphenylene sulfide, polyphenylene oxide, polysulfone, or polyphthalamide, or a substrate including an organic material dispersed with inorganic particles of several nanometers in diameter, or the like can be given. In addition, a surface of the substrate is not required to be flat, and may be uneven or have a curved surface.

A conductor (a metal particle) dissolved or dispersed in organic resin is used as a composition to be discharged from a discharge opening as a material of the first pattern. A particle of a metal such as Ag, Au, Cu, Ni, Pt, Pd, Ir, Rh, W, Al, Ta, Mo, Cd, Zn, Fe, Ti, Si, Ge, Zr, or Ba, a minute particle of silver halide, or a dispersant nanoparticle thereof, can be used as the metal particle. Alternatively, a conductive oxide material such as ITO (indium tin oxide), ITO containing silicon oxide, organic indium, organic tin, or zinc oxide (ZnO), which is typically used as a transparent conductive film or the like, can be used. In addition, the first pattern 102 can be formed by stacking conductive layers made of such materials. One or a plurality of organic resin selected from organic resin that can serve as a binder of metal particles, a solvent, a dispersing agent, and a coating agent can be used as the organic resin. Typically, polyimide, acrylic, novolac resin, melamine resin, phenol resin, epoxy resin, silicone resin, furan resion, diallyl phthalate resin, or a known organic resin can be used.

The viscosity of the composition is preferably in the range of 5 mPa·s to 20 mPa·s so that a metal particle can be smoothly discharged from a discharge opening. The surface tension is preferably 40 mN/m. Note that the viscosity of the composition and the like may be appropriately adjusted in accordance with a solvent to be used and intended use. For example, the viscosity of a composition in which ITO, indium tin oxide containing silicon oxide, organic indium, organic tin, or the like is dissolved or dispersed in organic resin is 5 mPa·s to 20 mPa·s, the viscosity of a composition in which silver is dissolved or dispersed in organic resin is 5 mPa·s to 20 mPa·s, and the viscosity of a composition in which gold is dissolved or dispersed in organic resin is 10 mPa·s to 20 mPa·s.

The content of a conductor in a composition is 30 to 70 wt %, preferably 40 to 60 wt %. The content of a conductor in the first pattern is higher than that the content of a conductor in the composition so that the solvent of the composition is dried to form the first pattern.

The diameter of the metal particle is preferably made as small as possible for the purpose of preventing a clogged nozzle and for manufacturing a highly-minute pattern, although it depends on the diameter of each nozzle, a desired shape of a pattern, and the like. Preferably, the diameter is preferably 0.1 μm or less. The metal particle is formed by a known method such as an electrolyzing method, an atomizing method or a wet reduction method and the particle size thereof is typically approximately 0.5 μm to 10 μm. However, when a gas evaporation method is employed, a nanoparticle protected by a dispersant is minute, approximately 7 nm. When each surface of nanoparticles is covered with a coating agent, the nanoparticles do not cohere in the solvent and are uniformly dispersed in the solvent at room temperature, and show a property similar to that of liquid.

The step of discharging the composition may be performed under low pressure. This may be conducted because the organic resin of the composition is evaporated during a period from discharging of a composition till landing of the composition on an object to be treated, and the energy density of the laser light can be decreased in a baking step of metal particles.

Figure 1B:
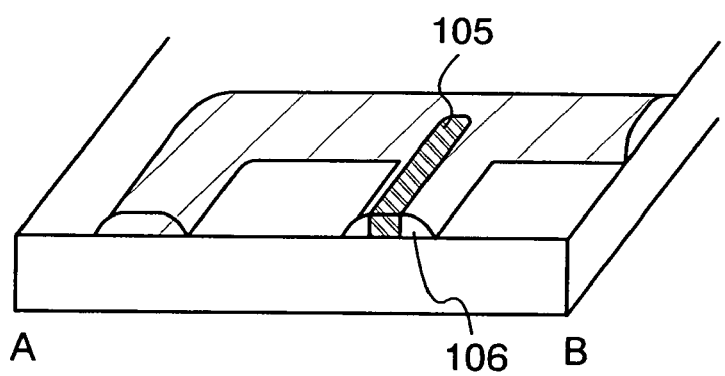

Then, the first pattern 102 is irradiated with laser light 103 with a laser beam directly-drawing apparatus. Here, the laser light is moved in the direction shown by an arrow 104. By this step, the organic resin of the composition in a region that is irradiated with laser light is vaporized to be removed. In addition, fusion between metal particles proceeds by energy of the laser light to form a first conductive layer 105 as shown in FIG. 1B.

The first pattern is irradiated with laser light, so that organic resin in the first pattern is vaporized to be removed. At this time, the content of a conductor in the first conductive layer 105 is higher than that of the first pattern.

When the metal particles are constituted by plural metal elements, the first conductive layer has the same composition as the metal particles. Note that the first conductive layer can be an alloy having a composition different from the metal particles when the energy of the laser light is high. However, in this case, the metal elements contained in the first conductive layer are the same as the metal particles.

A region that is not irradiated with the laser light 103 remains as the first pattern. The first pattern remaining on the opposite sides of the first conductive layer is referred to as a first organic resin layer 106. In addition, the first organic resin layer 106 is provided on the opposite sides of the first conductive layer. However, the present invention is not limited thereto and the first organic resin layer 106 may be provided on only one side of the first conductive layer. The first organic resin layer is conductive or insulative depending on a rate of dispersed metal particles. The atmosphere during laser irradiation is an oxygen atmosphere, a nitrogen atmosphere or atmospheric air. However, it is preferable that laser irradiation be conducted under the oxygen atmosphere in which organic resin dissolving or dispersing metal particles is easily removed.

Figure 11:
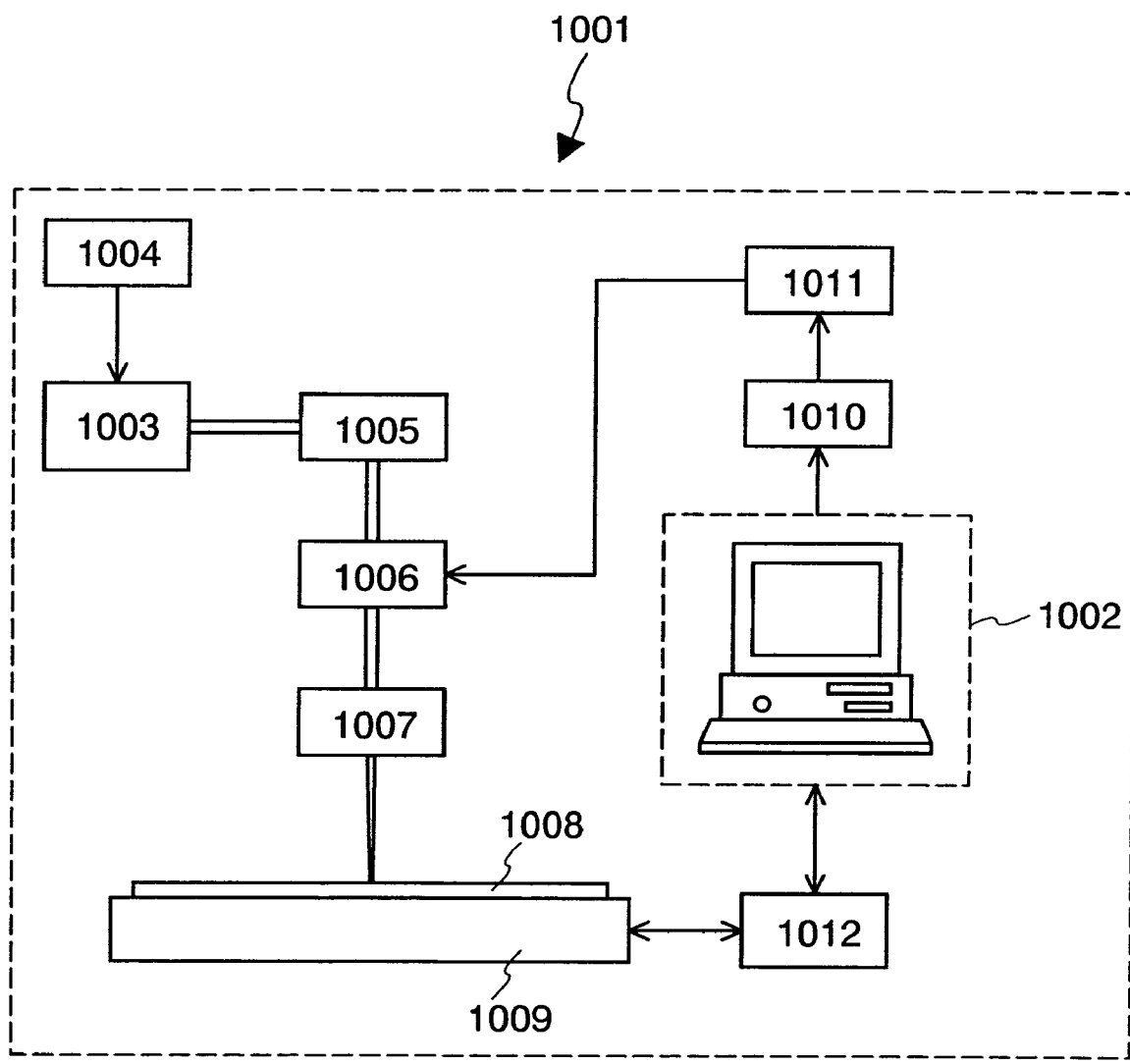
FIG. 11 shows a laser beam directly-drawing apparatus that can be applied to the present invention.

Here, a laser beam directly-drawing apparatus is described with reference to FIG. 11. As shown in FIG. 11, the laser beam directly-drawing apparatus 1001 includes: a personal computer (hereinafter referred to as a PC) 1002 for conducting various types of control in emitting a laser beam; a laser oscillator 1003 for outputting the laser beam; a power source 1004 of the laser oscillator 1003; an optical system (ND filter) 1005 for attenuating the laser beam; an acousto-optic modulator (AOM) 1006 for modulating intensity of the laser beam; an optical system 1007 having a lens for enlarging or reducing the size of a cross section of the laser beam, a mirror for changing a light path, and the like; a substrate movement mechanism 1009 having an X stage and a Y stage; a D/A converter 1010 for analog-digital converting control data outputted from the PC; a driver 1011 for controlling the acousto-optic modulator 1006 in accordance with an analog voltage outputted from the D/A converter; and a driver 1012 for outputting a driving signal for driving the substrate movement mechanism 1009.

A laser oscillator that can oscillate ultraviolet light, visible light, or infrared light can be used as the laser oscillator 1003. An excimer laser of ArF, KrF, XeCl, Xe, or the like, a gas laser of He, He—Cd, Ar, He—Ne, HF, or the like, a solid laser using a crystal such as YAG, $YVO_4$, YLF, or $YAlO_3$ doped with Cr, Nd, Er, Ho, Ce, Co, Ti, or Tm, a semiconductor laser of GaN, GaAs, GaALAs, InGaAsP, or the like can be used as the laser oscillator. Note that it is preferable to apply any of second to fifth harmonics of a fundamental wave to the solid laser.

Subsequently, an irradiation method with the use of the laser beam directly-drawing apparatus is described. When a substrate 1008 is set on the substrate movement mechanism 1009, the PC 1002 detects a position of a marker marked on the substrate with a camera which is not shown in FIG. 11. Next, the PC 1002 generates movement data for moving the substrate movement mechanism 1009 based on position data of the detected marker and data for drawing a pattern that has been inputted in advance. Thereafter, the PC 1002 controls the amount of output light from the acousto-optic modulator 1006 through the driver 1011. Accordingly, after the laser beam outputted from the laser oscillator 1003 is attenuated by the optical system 1005, the amount of the laser beam is controlled by the acousto-optic modulator 1006 to be the predetermined amount. On the other hand, a light path and a beam spot shape of the laser beam outputted from the acousto-optic modulator 1006 is changed by the optical system 1007 and the laser beam is condensed by a lens. Thereafter, a composition (the first pattern) formed over the substrate is irradiated with the laser beam to bake metal particles in the composition. At this time, movement of the substrate movement mechanism 1009 in an X direction and a Y direction is controlled in accordance with the movement data generated by the PC 1002. Consequently, a predetermined position is irradiated with the laser beam, and the metal particles in the composition are baked.

Here, the laser beam is emitted moving the laser beam in X-Y axis direction. In this case, a polygon mirror or a galvano mirror is preferably used as the optical system 1007.

A composition containing Ag (hereinafter, Ag paste) is selectively discharged and a part of the Ag paste is irradiated with a laser beam described above to appropriately bake the Ag particles, and thus the first conductive layer 105 is formed to have a thickness of 600 to 800 nm. Here, the region that is irradiated with the laser beam becomes the first conductive layer. Thus, the width of the first conductive layer becomes almost equal to the width of a beam spot when a laser beam is scanned once. A laser beam with lower wavelength is preferably emitted in order to form the first conductive layer having more minute width. In this embodiment mode, laser light having any wavelength of ultraviolet light to infrared light is used. Consequently, the width of the beam spot can be made thin. The first conductive layer 105 serves as a gate electrode. Therefore, the first pattern 102 is irradiated with the laser light 103 having thinner beam-spot width, and thus a semiconductor element having a short channel structure can be formed. The width of the first conductive layer is 0.3 to 1 μM, preferably 0.5 to 0.8 μm. Consequently, a semiconductor element having a short channel structure can be formed. In addition, the organic resin layer 106 in which metal particles are dispersed is formed on the opposite sides of the first conductive layer 105.

This embodiment mode shows one example of forming the conductive layer by emitting laser light on the first pattern. However, a semiconductor layer or an insulating layer can be formed appropriately instead of the conductive layer. In this case, a semiconductor material or an insulating material may be used appropriately for the first pattern.

Figure 1C:
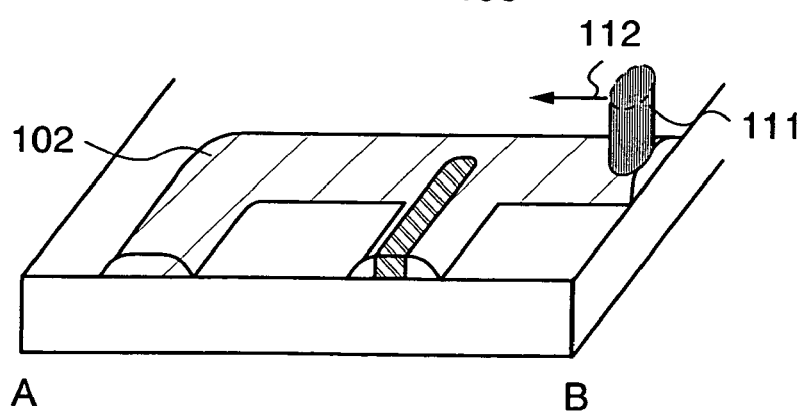
Figure 1D:
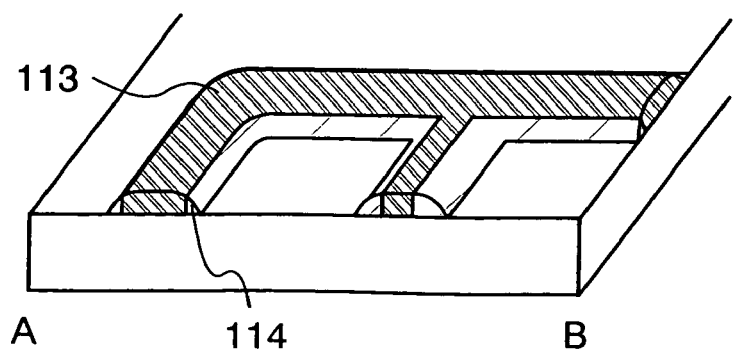

Next, as shown in FIG. 1C, the first pattern 102 is irradiated with laser light 111 so as to overlap a part of the first conductive layer 105. Here, the laser light 111 is moved in the direction shown by an arrow 112. It is preferable to emit the laser light 111 having wider beam width than that of the laser light 103 so as to form a gate wiring. Consequently, as shown in FIG. 1D, a second conductive layer 113 is formed. The second conductive layer 113 is a conductive layer in which metal particles are baked and a second organic resin layer 114 in which metal particles are dispersed is formed on the opposite sides of the second conductive layer 113. Note that the second organic resin layer may be formed on only one side of the second conductive layer.

FIG. 2 is a top view of the substrate at this stage. The first organic resin layer 106 dispersed with metal particles is formed on the opposite sides of the first conductive layer 105 to serve as a gate electrode. The second organic resin layer 114 dispersed with metal particles is formed on the opposite sides of the second conductive layer 113 to serve as a gate wiring. Further, the first conductive layer 105 is connected to the second conductive layer 113.

The cross-sectional shape of the first conductive layer 105 is described with reference to FIGS. 3A to 3C.

Figure 3A:
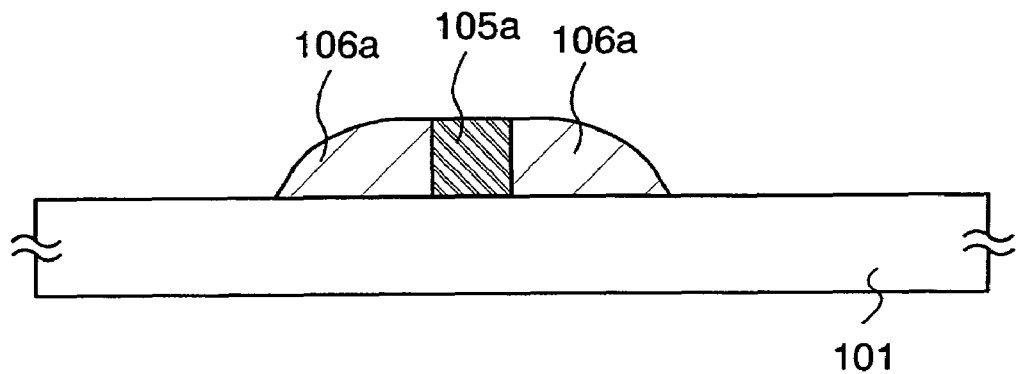
FIGS. 3A to 3C are each a cross-sectional view showing a wiring according to the present invention.

FIG. 3A is an enlarged view of a cross-section of the first conductive layer 105, which is a perpendicular to the scanning direction of laser light (the arrow 104 in FIG. 1A). An organic resin layer 106a dispersed with metal particles is formed on the opposite sides of a first conductive layer 105a. The cross-sectional shape of the first conductive layer 105a is a quadrilateral having approximate orthogonal angles. In other words, the width of a top surface of the first conductive layer is substantially equal to the width of the surface that is in contact with the substrate.

Figure 3B:
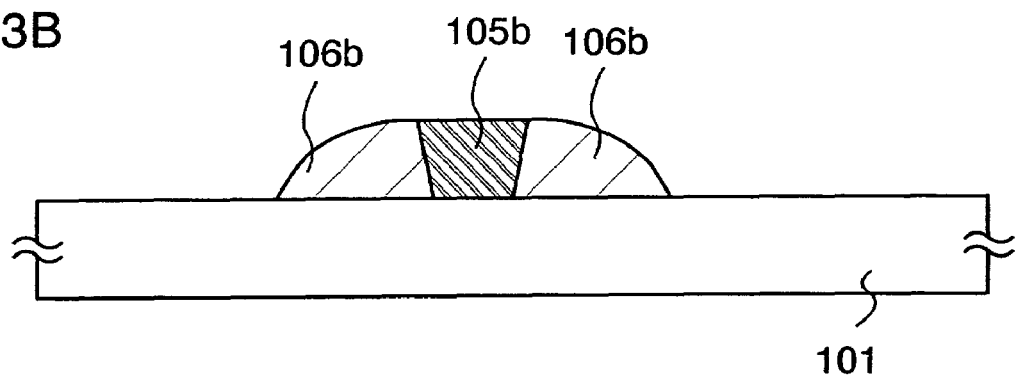

FIG. 3B is an enlarged view of a cross-section similarly to FIG. 3A. An organic resin layer 106b dispersed with metal particles is formed on the opposite sides of a first conductive layer 105b. The cross-section shape of the first conductive layer 105b is substantially a trapezoid shape. In other words, the width of the surface that is in contact with the substrate is narrower than the width of a top surface of the first conductive layer. This shape can be obtained when the energy intensity of the laser beam has a Gaussian shape and the energy distribution of the laser beam to the substrate is convex.

Figure 3C:
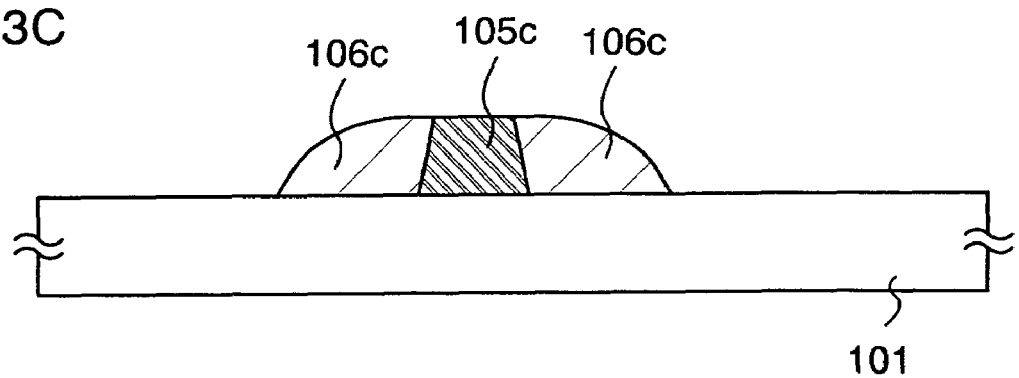

FIG. 3C is an enlarged view of a cross-section similarly to FIG. 3A. An organic resin layer 106c dispersed with metal particles is formed on the opposite sides of a first conductive layer 105c. The cross-sectional shape of the first conductive layer 105c is substantially a trapezoid shape. In other words, the width of the surface of the first conductive layer that is in contact with the substrate is wider than the width of a surface of the first conductive layer. This shape can be obtained when the energy of the emitted laser light is conducted in the horizontal direction (a direction along a substrate surface) and the width of the conductive layer on the substrate 101 side becomes wide.

In FIGS. 3A to 3C, the conductive layers 105a to 105c are formed to be in contact with the substrate surface. However, an organic resin layer dispersed with metal particles may be formed between the first conductive layer and the substrate 101 without being limited to this structure.

Then, FIG. 3I shows a mode of baked metal particles and dispersed metal particles in FIG. 3A. In the first conductive layer 105a irradiated with laser light, large metal particles 151, in which plural metal particles are baked, cohere. Accordingly, the rate of organic resin in the first conductive layer is small. On the other hand, in the organic resin layer 106a dispersed with metal particles, a large number of metal particles 153 are dispersed in the organic resin 152. Thus, the rate of organic resin in the organic resin layer is higher than that in the first conductive layer.

A wiring having a film pattern with a thin width can be formed through the above described steps.

Embodiment Mode 2

Embodiment Mode 2 describes a manufacturing method of a semiconductor element with reference to FIGS. 4A to 4F. In this embodiment mode, a channel etch type TFT of a bottom gate TFT as a semiconductor element is described.

Figure 4A:
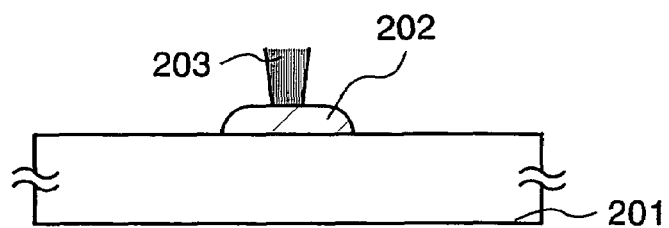
FIGS. 4A to 4F are each a cross-sectional view showing a manufacturing step of a semiconductor device according to the present invention.

As shown in FIG. 4A, a first pattern 202 is formed on a substrate 201 by a droplet discharging method. The material of the first pattern 102 shown in Embodiment Mode 1 can be used appropriately for the material of the first pattern 202.

In this embodiment mode, the first pattern 202 is formed by selectively discharging Ag paste dispersed with silver particles of several nm.

Figure 4B:
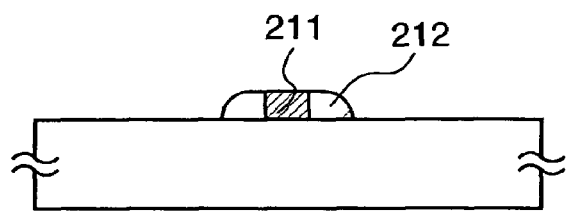

Then, a part of the first pattern 202 is irradiated with laser light 203 using a laser beam directly-drawing apparatus to form a first conductive layer 211 as shown in FIG. 4B. At this time, in a region that is not irradiated with the laser light 203, the Ag paste remains. Hereinafter, the region where the Ag paste remains is shown as an organic resin layer 212 dispersed with metal particles. Fine particles that are conductive overlap one another irregularity three dimensionally, and thus the first conductive layer 211 is formed. In other words, the first conductive layer 211 is constituted by three dimensional aggregate particles. Accordingly, the surface has slight unevenness. In addition, fine particles melt depending on a heating temperature and heating time of the Ag paste and an aggregate of fine particles can be obtained. Since the size of this aggregate increases depending on the heating temperature and the heating time of the Ag paste, the conductive layer has varying heights of elevation on the surface. Note that the region in which fine particles are melted become polycrystalline in some cases. The width of the first conductive layer 211 depends on a diameter of a laser beam. Therefore, the first conductive layer having narrow width can be formed by irradiating the first pattern with laser light having small beam diameter. A TFT having a short channel structure can be formed because the first conductive layer serves as a gate electrode.

At this time, the first pattern is irradiated with a plurality of laser light so as not overlap one another, so that a multigate electrode can be formed. Accordingly, a TFT having a multi gate structure can be formed later. At this time, the plurality of laser light is preferably emitted to be parallel with one another.

Figure 4C:
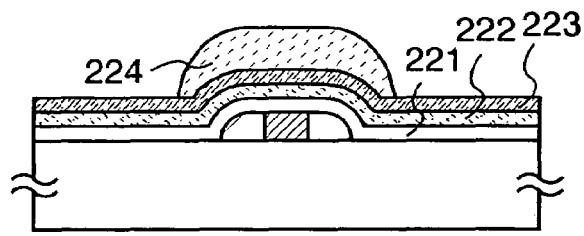

Next, as shown in FIG. 4C, a first insulating layer 221 serving as a gate insulting film, a first semiconductor film 222 and a second semiconductor film 223 that is conductive are formed over the first conductive layer 211 and the organic resin layer 212 dispersed with metal particles. Here, the first insulating layer 221 and films to be formed after the first insulating layer 221 are preferably formed at a temperature lower than the temperature at which organic resin contained in a composition that is a material of the first pattern 202 reacts. If the first insulating layer 221 and the films to be formed after the first insulating layer 221 are formed at a temperature higher than that the reaction temperature of the organic resin, the organic resin reacts to discharge a gas. The films are peeled by this gas and thus, the yield of a semiconductor element and a semiconductor device having the semiconductor element are reduced. Therefore, the yield can be enhanced by forming the films at a temperature lower than the reaction temperature of organic resin.

The first insulating layer 221 is formed as a single layer or a stacked layer of silicon nitride, silicon oxide or other insulating films containing silicon by a thin-film forming method such as a plasma CVD method or a sputtering method. In addition, the first insulating layer preferably has a stacked structure in which a silicon nitride film (silicon nitride oxide film), a silicon oxide film and a silicon nitride film (silicon nitride oxide film) are stacked on the gate electrode side. In this structure, since the gate electrode is in contact with the silicon nitride film, deterioration due to oxidation can be prevented.

The first semiconductor film 222 is formed using a film having any state of semiconductors selected from an amorphous semiconductor (AS), a semi-amorphous semiconductor in which an amorphous state and a crystalline state are mixed (also referred to as a SAS), a microcrystalline semiconductor in which a crystal grain of 0.5 nm to 20 nm can be observed in an amorphous semiconductor, and a crystalline semiconductor. Specifically, a microcrystalline state in which a crystal grain of 0.5 nm to 20 nm can be observed is referred to as microcrystal (μc). In any case, a semiconductor film mainly containing silicon, silicon germanium (SiGe), or the like with a thickness of 10 nm to 60 nm can be used.

The SAS means a semiconductor having an intermediate structure between an amorphous structure and a crystalline structure (including a single crystal and a polycrystal) and having a third state which is stable in terms of free energy. The SAS includes a crystalline region having short-range order and lattice distortion. A crystalline region of 0.5 nm to 20 nm can be observed in at least a part of the film. When silicon is contained as a main component, a Raman spectrum is shifted to the side of a wavenumber lower than 520 cm$^{-1}$. A diffraction peak of (111) or (220) to be caused by a crystal lattice of silicon is observed in X-ray diffraction. In addition, the SAS contains hydrogen or halogen of 1 atomic % or more to terminate a dangling bond.

The SAS can be obtained by performing glow discharge decomposition on a silicide gas. $SiH_4$ is given as a typical silicide gas. In addition, $Si_2H_6$, $SiH_2Cl_2$, $SiHCl_3$, $SiCl_4$, $SiF_4$, or the like can also be used as the silicide gas. The silicide gas may be diluted with hydrogen or fluorine, or hydrogen or fluorine and one or more rare gas elements of helium, argon, krypton and neon, thereby making formation of the SAS easy. At this time, the silicide gas is preferably diluted so that a dilution ratio thereof ranges from 10 times to 1000 times. Alternatively, the SAS can be formed using $Si_2H_6$ and $GeF_4$ diluted with a helium gas. The reactive formation of a film by glow discharge decomposition is preferably performed under a low pressure and may be performed with pressures in the range of approximately 0.1 Pa to 133 Pa. High-frequency powers of 1 MHz to 120 MHz, preferably, 13 MHz to 60 MHz may be supplied to perform glow discharge. A substrate temperature is preferably 300° C. or less, and a recommended substrate temperature is 100° C. to 250° C.

A crystalline semiconductor film can be formed by crystallizing an amorphous semiconductor film or a SAS by heating or laser irradiation. Alternatively, a crystalline semiconductor film may be directly formed. In this case, a crystalline semiconductor film can be directly formed using a fluorine gas such as $GeF_4$ or $F_2$ and a silane gas such as $SiH_4$ or $Si_2H_6$ and utilizing heat or plasma.

The second semiconductor film 223 is conductive. An element belonging to Group 15 of the periodic table, typically, phosphorus or arsenic is added in the case of forming an n-channel TFT. An element belonging to Group 13, typically, boron is added in the case of forming a p-channel TFT. The second semiconductor film is formed by a plasma CVD method using a silicide gas mixed with a gas including an element belonging to Group 13 or 15 such as boron, phosphorus, or arsenic. Further, the second conductive semiconductor film can be formed after forming a semiconductor film, coating the semiconductor film with a solution including an element belonging to Group 13 or 15, and irradiating the solution with a laser beam. A laser beam emitted from a known pulsed laser or continuous wave laser is appropriately used as the laser beam.

Subsequently, a first mask pattern 224 is formed over the second semiconductor film 223. The first mask pattern is preferably formed of a heat resistant high molecular weight material. It is preferably formed by discharging a high molecular weight material which has an aromatic ring or a heterocyclic ring as a main chain and includes at least a highly polar heteroatom group in an aliphatic moiety by a droplet discharging method. As a typical example of such a high molecular weight material, polyimide, polybenzimidazole, or the like can be used. In the case of using polyimide, the first mask pattern 224 can be formed by discharging a solution including polyimide from a discharge opening onto the second semiconductor film 223 and then baking it at 200° C. for 30 minutes.

Figure 4D:
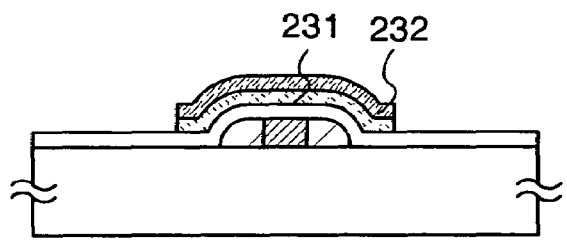
Figure 4E:
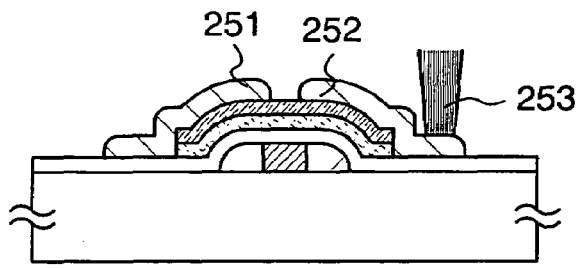

Next, the second semiconductor film 223 is etched using the first mask pattern 224 to form a second semiconductor region 232 as shown in FIG. 4D. Then, the first semiconductor film 222 is etched using the first mask pattern 224 to form a first semiconductor region 231. Thereafter, the first mask pattern is removed.

The first semiconductor film and the second semiconductor film can be etched using a chlorine based gas typified by $Cl_2$, $BCl_3$, $SiCl_4$, $CCl_4$, or the like, a fluorine based gas typified by $CF_4$, $SF_6$, $NF_3$, $CHF_3$, or the like, or $O_2$.

Figure 4F:
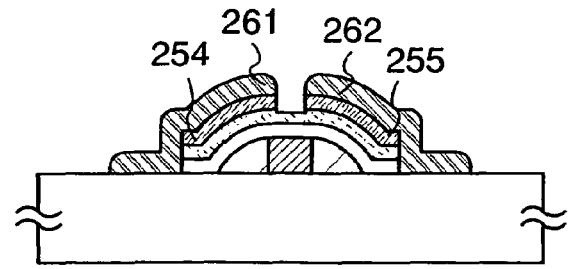

Next, second patterns 251 and 252 to serve as source and drain electrodes are formed using a conductive material over the second semiconductor region 232. Here, a solution of Ag paste dispersed with silver particles of several nm is selectively discharged. Then, parts of the second patterns 251 and 252 are irradiated with laser light using a laser beam directly-drawing apparatus to form second conductive layers 261 and 262 as shown in FIG. 4F. The second conductive layer is a conductive layer in which metal particles are baked, similarly to the first conductive layer. An organic resin layer dispersed with metal particles may be formed on the opposite sides of the second conductive layer.

Then, an exposed portion of the second semiconductor region 232 is etched using the second conductive layers 261 and 262 as masks to be sectioned, thereby forming source and drain regions 254 and 255. At this time, an exposed portion of the first semiconductor region 231 is partially etched in some cases.

When the first semiconductor region is formed from SAS, a structure in which the source and drain regions cover the gate electrode can be employed as in this embodiment mode. In place of the structure, a so-called self alignment structure in which edge portions of the source and drain regions are aligned with edge portions of the gate electrode can also be employed. Further, a structure in which the source and drain regions are formed at a certain distance from the gate electrode without covering it can be employed. This structure can reduce off-current. Thus, in the case of using the TFT having this structure as a switching element of a display device, contrast can be enhanced. Furthermore, a TFT may be formed to have a so-called multi-gate structure in which the second semiconductor region covers a plurality of gate electrodes. This structure can also reduce off-current.

Subsequently, a passivation film is preferably formed over the second conductive layers 261 and 262. The passivation film can be formed using silicon nitride, silicon oxide, silicon nitride oxide, silicon oxynitride, aluminum oxynitride, aluminum oxide, diamond like carbon (DLC), nitrogen-containing carbon (CN), or other insulating materials by a thin film formation method such as a plasma CVD method or a sputtering method.

Through the above described steps, a channel etch type TFT having a gate electrode with narrow width can be manufactured. Since the semiconductor element has a short channel length, the semiconductor element can operate at high speed.

Embodiment Mode 3

Embodiment Mode 3 describes a channel protective type TFT of a bottom gate TFT as a semiconductor element with reference to FIGS. 5A to 5F.

Figure 5A:
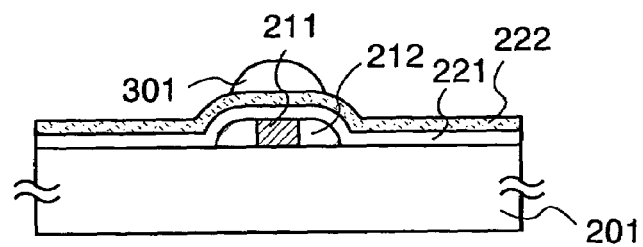
FIGS. 5A to 5F are each a cross-sectional view showing a manufacturing step of a semiconductor device according to the present invention.

As shown in FIG. 5A, a first conductive layer 211 serving as a gate electrode and an organic resin layer 212 dispersed with metal particles, which is formed on the opposite sides of the first conductive layer 211 are formed on a substrate 201 according to the same steps as in Embodiment Mode 2. After that, a first insulating layer 221 to serve as a gate insulating film and a first semiconductor film 222 are formed. Then, a protective film 301 is formed in a region that exists over the first semiconductor film 222 and overlaps the first conductive layer 211. The formation method and material of the protective film 301 can be similar to those of the first mask pattern 224 shown in Embodiment Mode 2.

Figure 5B:
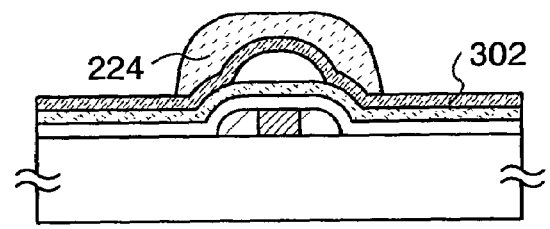

As shown in FIG. 5B, a second semiconductor film (a conductive semiconductor film) 302 is formed. The second semiconductor film 302 can be formed using the same material and formation method as those of the second semiconductor film 223 in Embodiment Mode 2. Next, a first mask pattern 224 is formed.

Figure 5C:
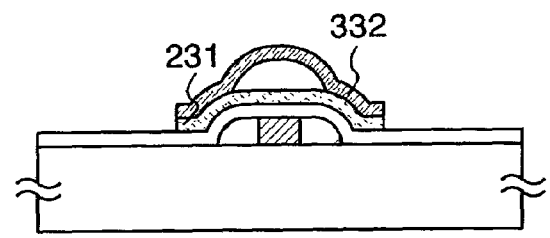

The second semiconductor film is etched using the first mask pattern to form a second semiconductor region 332 as shown in FIG. 5C. In addition, a first semiconductor region 231 is formed by etching the first semiconductor film. After that, the first mask pattern is removed.

Figure 5D:
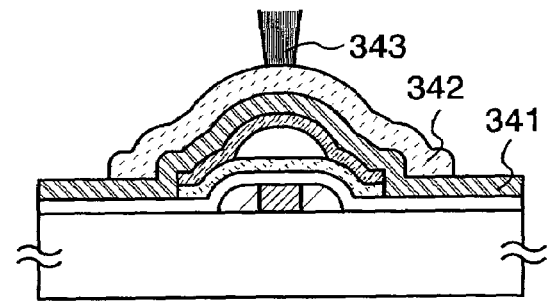

As shown in FIG. 5D, a second conductive layer 341 is formed using a conductive material. One or a plurality of Ag, Au, Cu, Ni, Pt, Pd, Ir, Rh, W, Al, Ta, Mo, Cd, Zn, Fe and Ti can be used as the conductive material. The second conductive layer 341 is formed by a known method such as a CVD method, a sputtering method, a printing method, a droplet discharging method. Here, the second conductive layer 341 is formed by a sputtering method.

Subsequently, a photosensitive resin 342 is discharged or applied over the second conductive layer 341, and then dried. A negative photosensitive resin or a positive photosensitive resin that is sensitive to ultraviolet light to infrared light is used as the photosensitive resin.

Photosensitive resin materials such as epoxy resin, phenol resin, novolac resin, acrylic resin, melamine resin, or urethane resin are used as the photosensitive resin. In addition, photosensitive organic materials such as benzocyclobutene, parylene, flare, polyimide can also be used. As typical positive photosensitive resins, a photosensitive resin having phenol resin or novolac resin and a naphtho quinonediazide compound as a photosensitive agent is given, while as typical negative photosensitive resins, a photosensitive resin using the above mentioned resin or the like as a base resin and having diphenyl silane diol and an acid generation agent is given. In this embodiment mode, a negative photosensitive resin is adopted.

Figure 5E:
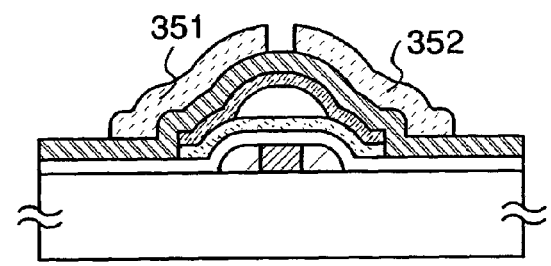

Next, the photosensitive resin 342 is irradiated with a laser beam 343 using a laser beam directly-drawing apparatus, and then developed. As the result thereof, second mask patterns 351 and 352 are formed as shown in FIG. 5E.

Figure 5F:
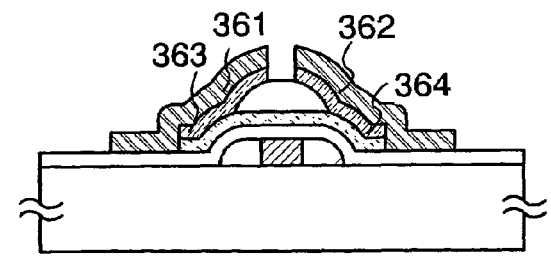

As shown in FIG. 5F, the second conductive layer 341 is etched with the second mask patterns 351 and 352 as masks to form source and drain electrodes 361 and 362. In addition, the second semiconductor region 332 is etched with the second mask pattern as a mask to form source and drain regions 363 and 364. By the steps, the protective film 301 is exposed.

The formation method of the source and drain electrodes is not limited to the method shown in this embodiment mode, and the method shown in Embodiment Mode 2 may be adopted. Further, the forming steps of the source and drain electrodes in this embodiment mode may be applied in Embodiment Mode 2.

Through the above described steps, a channel protective type TFT having a gate electrode with a narrow width can be manufactured. Since the semiconductor element has a short channel length, the semiconductor element can operate at high speed.

Embodiment Mode 4

Embodiment Mode 4 describes a manufacturing method of a staggered type TFT of a top gate TFT with reference to FIGS. 6A to 6F.

Figure 6A:
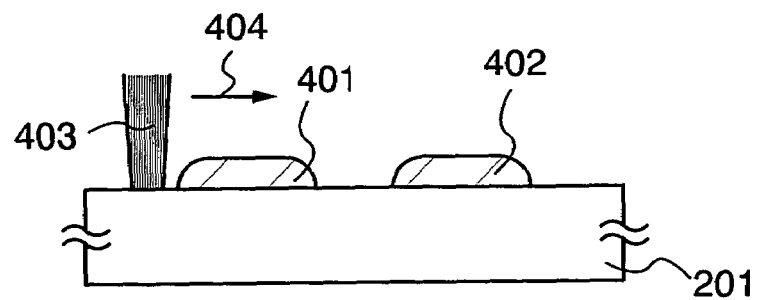
FIGS. 6A to 6F are each a cross-sectional view showing a manufacturing step of a semiconductor device according to the present invention.
Figure 6B:
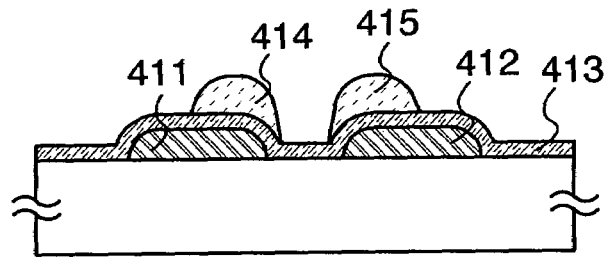

As shown in FIG. 6A, first patterns 401 and 402 are formed on a substrate 201. As the material and formation method thereof, the same material and formation method as those of the first pattern 102 in Embodiment Mode 1 can be used appropriately. Next, the first patterns 401 and 402 are irradiated with laser light 403. Here, laser light is emitted in the direction of an arrow 404 to form first conductive layers 411 and 412 in which metal particles are baked as shown in FIG. 6B.

Then, a first semiconductor film 413 that is conductive is formed over the first conductive layer. The first semiconductor film 413 can be formed using the same material and formation method as those of the second semiconductor film 222 in Embodiment Mode 2. First mask patterns 414 and 415 are formed over the first semiconductor film 413. The first mask patterns can be formed appropriately by the same formation method and material as those of the first mask pattern 224 shown in Embodiment Mode 2.

Figure 6C:
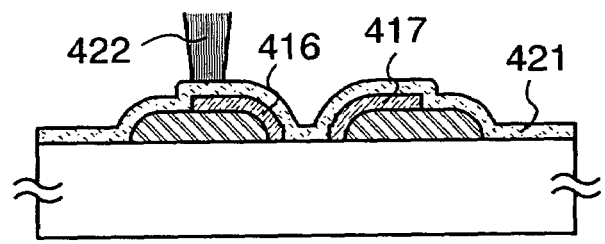

As shown in FIG. 6C, the first semiconductor film is etched using the first mask pattern to form first semiconductor regions 416 and 417. Note that the first semiconductor regions serve as source and drain regions. Then, a second semiconductor film 421 is formed. The second semiconductor film 421 can be formed appropriately by the same formation method and material as those of the first semiconductor film 222 shown in Embodiment Mode 2.

Figure 6D:
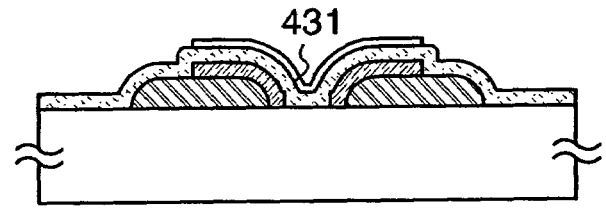
Figure 6E:
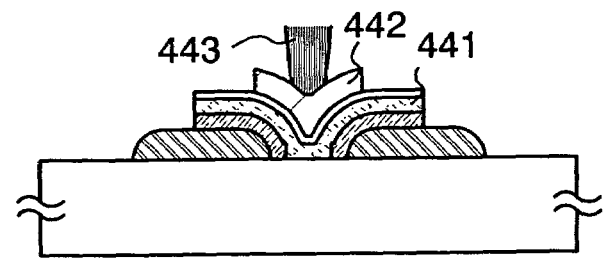

A surface of a part of the second semiconductor film 421 is irradiated with laser light using a laser beam directly-drawing apparatus to form a silicon oxide film 431 as shown in FIG. 6D. The silicon oxide film 431 serves as a mask for etching the second semiconductor film 421. An exposed portion of the second semiconductor film is etched with TMAH (tetramethyl ammonium hydroxide) to form a second semiconductor region 441 as shown in FIG. 6E. Here, the second semiconductor film is irradiated with laser light using a laser beam directly-drawing apparatus to oxygenate a desired region, thereby forming a silicon oxide film. Accordingly, a semiconductor region can be formed in a desired region without a known photolithography process. Irradiated area of the laser light can be reduced by decreasing a spot diameter of the laser beam. In other words, a silicon oxide film having a minute shape and the semiconductor region to be formed using the silicon oxide film as a mask can be formed. Therefore, high integration of a semiconductor element is possible. In addition, the silicon oxide film is formed by one time irradiation of laser light having a shape corresponding to a semiconductor region (a rectangle shape, a circular shape, a desired shape or the like), thereby enhancing throughput.

Figure 6F:
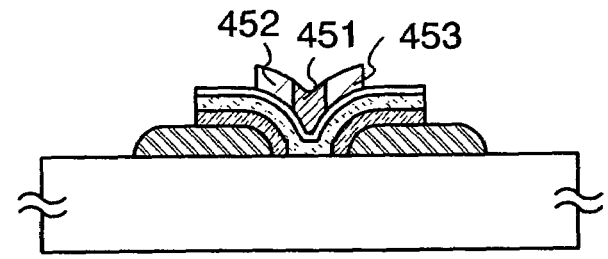

As shown in FIG. 6E, a second pattern 442 is formed over a silicon oxide film 431. The silicon oxide film 431 serves as a gate insulating film. Note that an insulating layer to serve as a gate insulating film may be formed anew, appropriately using the same method and material as the first insulating layer 221 in Embodiment Mode 2, after removing the silicon oxide film 431. The second pattern 442 is irradiated with laser light 443 to form a second conductive layer 451 in which metal particles are baked and organic resin layers 452 and 453 in which metal particles are dispersed as shown in FIG. 6F. The second conductive layer 451 functions as a gate electrode.

A staggered type TFT can be formed through the above described steps.

Embodiment Mode 5

Embodiment Mode 5 describes a manufacturing method of a coplanar type TFT of a top gate TFT with reference to FIGS. 7A to 7E.

Figure 7A:
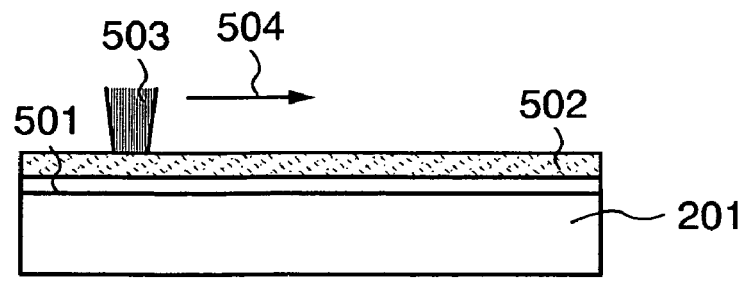
FIGS. 7A to 7E are each a cross-sectional view showing a manufacturing step of a semiconductor device according to the present invention.

As shown in FIG. 7A, a first insulating layer 501 is formed on a substrate 201. The first insulating layer 501 serves as a blocking film for preventing impurities from the substrate from spreading into a semiconductor region to be formed later. Accordingly, a base film of an insulating film such as a silicon oxide film, a silicon nitride film or a silicon oxynitride film is formed as the first insulating film 501. The base film has a structure of a single layer or a stacked layer of two or more layers.

A semiconductor film 502 is formed over the first insulating layer 501. A semiconductor film having an amorphous structure is formed by a known method (such as a sputtering method, an LPCVD method or a plasma CVD method) as the semiconductor film 502. Thereafter, a crystalline semiconductor film obtained by performing a known crystallization treatment (such as a laser crystallization method using laser light emitted from a pulsed laser, a thermal crystallization method, a thermal crystallization method using a metal catalyst such as nickel) or the SAS, the AS, or the like described in Embodiment Mode 2 is formed.

Figure 7B:
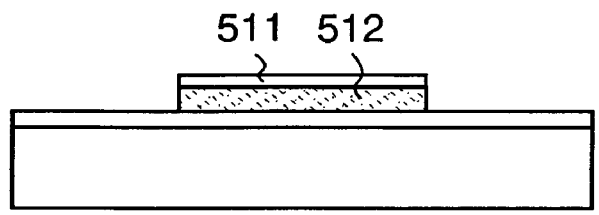

Then, a desired region of the semiconductor film 502 is irradiated with laser light 503 using a laser beam directly-drawing apparatus similarly to Embodiment Mode 4 to form a silicon oxide film 511 as shown in FIG. 7B. Here, a region for forming a semiconductor region later is irradiated with the laser light by scanning the laser light 503 in the direction of an arrow 504.

The semiconductor film 502 is etched with TMAH using the silicon oxide film 511 as a mask to form a semiconductor region 512.

Figure 7C:
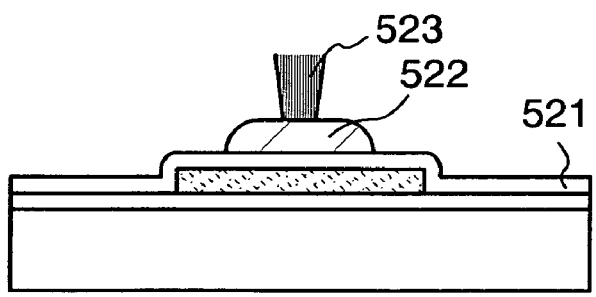

As shown in FIG. 7C, after removing the silicon oxide film 511, a second insulating layer 521 to serve as a gate insulating film is formed over the semiconductor region 512 and the first insulating layer 501. The second insulating layer 521 can be formed using the same material and method as the first insulating layer 221 shown in Embodiment Mode 2.

Figure 7D:
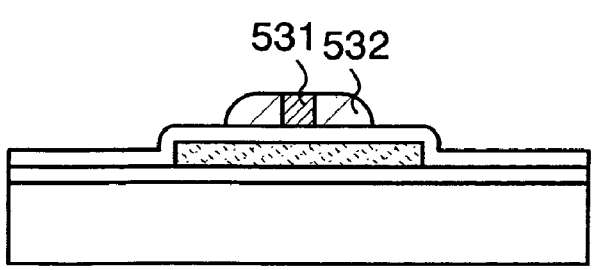

A first pattern 522 is formed. The first pattern is formed using the same material as the first pattern 102 shown in Embodiment Mode 1. Then, a part of the first pattern 522 is irradiated with laser light 523 and thus a first conductive layer 531 in which metal particles are baked and an organic resin layer 532 in which metal particles are dispersed can be formed as shown in FIG. 7D. Note that the first conductive layer 531 serves as a gate electrode.

Figure 7E:
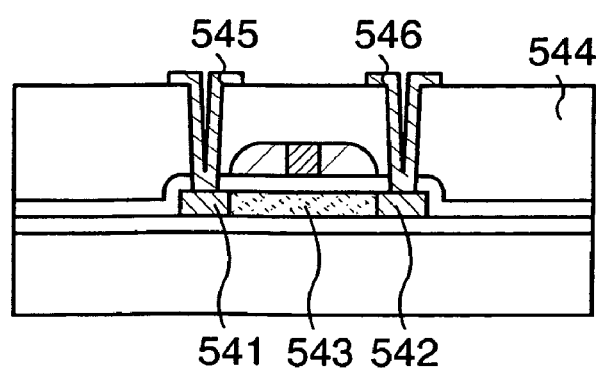

As shown in FIG. 7E, the semiconductor region 512 is doped with impurities using the first conductive layer 531 and the organic resin layer 532 dispersed with metal particles as masks. Then, after forming an insulating film containing hydrogen, the impurity element added into the semiconductor region is activated by heating at 400 to 550° C. In addition, the semiconductor region is hydrogenated to form impurity regions (source and drain regions) 541 and 542. The semiconductor region covered with the first conductive layer 531 and the organic resin layer 532 dispersed with metal particles serves as a channel formation region 543. Note that a GRTA method, an LRTA method, or a laser annealing method can be used as the step of activation or hydrogenation in place of the heat treatment. In addition, gettering can also be performed at the same time as activation in the case where the semiconductor film is crystallized using a metal element which promotes crystallization, typically, nickel.

Note that a single-gate TFT is described in this embodiment mode; however, without being limited thereto, a multi-gate TFT may also be used. In addition, a self alignment TFT is described; however, without being limited thereto, an LDD (Lightly Doped Drain) or GOLD (Gate-drain Overlapped LDD) TFT can also be used. In the LDD structure, a region to which an impurity element is added in low concentration is provided between a channel formation region and a source region or drain region formed by adding an impurity element in high concentration. The region is referred to as an LDD region. The TFT having this structure can reduce an off-current value. In the GOLD structure, the LDD region is overlapped with a gate electrode with a gate insulating film therebetween. The structure is effective in relieving an electric field in the vicinity of the drain and preventing deterioration due to hot carrier injection.

An LDD region may be formed by adding an impurity element into the semiconductor region using the organic resin layer 532 dispersed with metal particles as a sidewall.

Then, a third insulating layer 544 is formed over the substrate. The third insulating layer can be formed of an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular weight material such as polyimide, aromatic polyamide, or polybenzimidazole; an inorganic siloxane polymer including a Si—O—Si bond formed by using a siloxane polymer based material as a starting material, typified by a silica glass; or an organic siloxane polymer insulating material in which hydrogen bonded with silicon is substituted by an organic group such as methyl or phenyl, typified by an alkyl siloxane polymer, an alkyl silsesquioxane polymer, a hydrosilsesquioxane polymer, or a hydroalkyl silsesquioxane polymer. The third insulating layer is formed by a known method such as a CVD method, a coating method, or a printing method. Note that forming the third insulating layer by a coating method can planarize the surface of the third insulating layer and is suitable for a later step of forming a pixel electrode. Here, the third insulating layer 544 is formed by applying alkyl siloxane polymer by a coating method and baked.

A mask pattern is formed by a droplet discharging method and parts of the second insulating layer 544 and the second insulating layer 521 are removed using the mask pattern to expose parts of the impurity regions 541 and 542 of the semiconductor region, and thus opening portions are formed. Second conductive layers 545 and 546 are formed in the opening portions by the method described in Embodiment Mode 2 or 3. The second conductive layers 545 and 546 serves as source and drain electrodes.

A coplanar type TFT having a gate electrode with a narrow width can be formed through the above described steps. Since the semiconductor element has a short channel length, the semiconductor element can operate at high speed.

Embodiment Mode 6

Embodiment Mode 6 describes manufacturing steps of an organic semiconductor transistor with reference to FIGS. 8A to 8D.

Figure 8A:
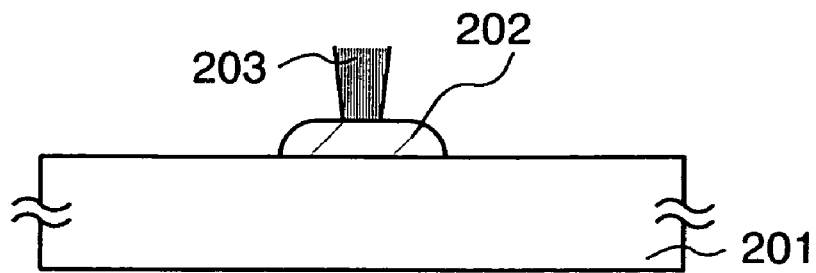
FIGS. 8A to 8D are each a cross-sectional view showing a manufacturing step of a semiconductor device according to the present invention.
Figure 8B:
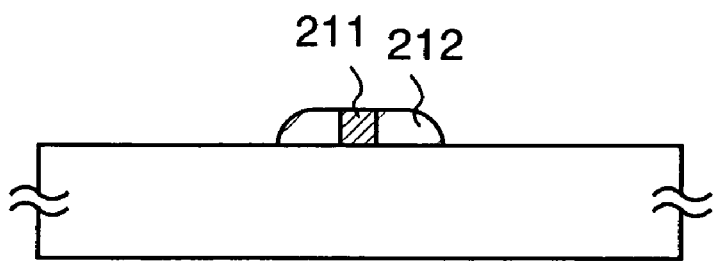

As shown in FIGS. 8A and 8B, after forming a first pattern 202 over a substrate 201 similarly to Embodiment Mode 2, a part of the first pattern 202 is irradiated with laser light 203 to form a first conductive layer 211 in which metal particles are baked and an organic resin layer 212 in which metal particles dispersed are provided on the opposite sides of the first conductive layer 211. Here, plastic is used for the substrate 201.

Figure 8C:
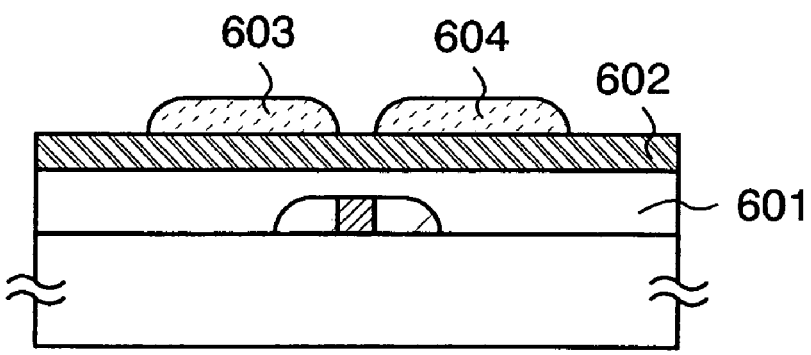

Next, as shown in FIG. 8C, a first insulating layer 601 to serve as a gate insulating film is formed over the substrate 201, the first conductive layer 211 and the organic resin layer 212. The first insulating layer 601 can be formed appropriately using the material and formation method of the first insulating layer 221 shown in Embodiment Mode 2. In addition, the first insulating layer can be formed by applying a solution having an insulating property with a droplet discharging method, a coating method or the like. Further, the first conductive layer 211 may be anodized to form the first insulating layer. As a typical example of the solution having an insulating property, a solution dispersed with inorganic oxide minute particles, polyimide, polyamide, polyester, acrylic, PSG (phosphosilicate glass), BPSG (borophosphosilicate glass), silicate SOG (Spin on Glass), alkoxy silicate SOC, siloxane polymer, or the like can be appropriately used.

At this time, the solution having an insulating property is dried, or baked depending on materials.

Subsequently, a second conductive layer 602 is formed. Here, the second conductive layer 602 can be formed using the same method and material as the second conductive layer 341 shown in Embodiment Mode 3. Then, first mask patterns 603 and 604 are formed over the second conductive layer 602. The mask patterns are formed using the same materials as the first mask pattern 224 shown in Embodiment Mode 2. The first mask patterns 603 and 604 are each a mask pattern for forming source and drain electrodes later.

Figure 8D:
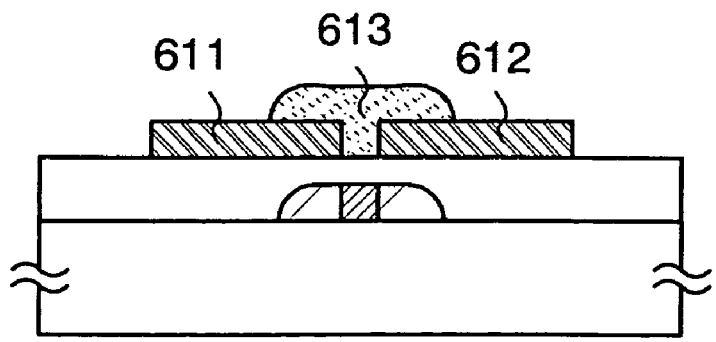

As shown in FIG. 8D, third conductive layers 611 and 612 are formed by etching the second conductive layer 602 with the first mask patterns 603 and 604. The third conductive layers 611 and 612 serve as source and drain electrodes. Then, a semiconductor region 613 is formed between the source electrode and the drain electrode using an organic semiconductor material.

The semiconductor region 613 can be formed appropriately by a printing method, a spray method, a droplet discharging method or the like. An etching step is not required because of this method, and thus the number of steps can be reduced. In addition, a known organic semiconductor material can be used appropriately as the organic semiconductor material. It is preferable to use, typically, a n-conjugated high molecular weight material whose skeleton is formed by a conjugated double bond. Typically, a soluble high molecular weight material such as polythiophene, poly (3-alkylthiophene), a polythiophene derivative, or pentacene can be used.

In addition, the semiconductor region can be formed by forming and treating a soluble precursor. As such an organic semiconductor material formed by using a precursor, polythienylene vinylene, poly (2,5-thienylene vinylene), polyacetyrene, a polyacetylene derivative, polyallylene vinylene, or the like can be given.

When a precursor is converted into an organic semiconductor, a reactive catalyst such as a hydrogen chloride gas is added in addition to a heat treatment. Toluene, xylene, chlorobenzene, dichlorobenzene, anisole, chloroform, dichloromethane, γ-butyl lactone, butyl cellosolve, cyclohexane, NMP(N-methyl-2-pyrrolidone), cyclohexanone, 2-butanone, dioxane, dimethylformamide (DMF), THF (tetrahydrofuran), or the like can be used as a typical solvent for dissolving such a soluble organic semiconductor material.

A contact layer may be provided between the semiconductor region 613 and the conductive layers 611 and 612 serving as source and drain electrodes. As a material of the contact layer, a conductive layer formed of an organic conductive material such as polyacetylene, polyaniline, PEDOT(polyethylenedioxythiophen), or PSS(poly-styrenesulphonate) can be used. A conductive layer formed from a metal element can be used for the contact layer. In this case, many organic semiconductor materials are p-type semiconductors which transport holes as carriers. Therefore, it is preferable to use a metal having a high work function so as to have an ohmic contact with the semiconductor layer. Specifically, it is preferable to use a metal such as gold, platinum, chromium, palladium, aluminum, indium, molybdenum, nickel, or an alloy thereof or the like. The contact layer can be formed using a conductive paste including such a metal or alloy by a printing method or a droplet discharging method.

An organic thin film transistor having a short channel structure can be formed through the above described steps.

Embodiment Mode 7

Embodiment Mode 7 describes a manufacturing method of a semiconductor element in which the positional relation between source and drain electrodes and a semiconductor region is different from that in Embodiment Mode 6 with reference to FIGS. 9A to 9E.

Figure 9A:
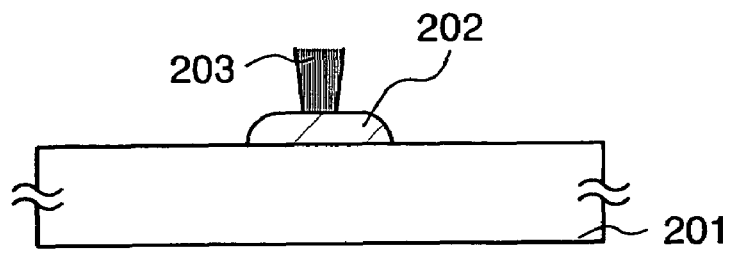
FIGS. 9A to 9E are each a cross-sectional view showing a manufacturing step of a semiconductor device according to the present invention.
Figure 9B:
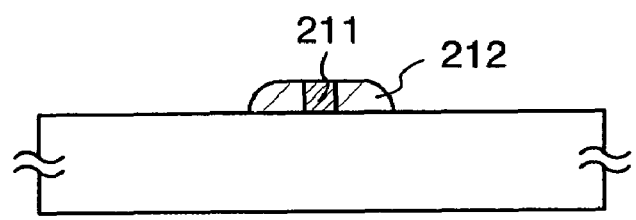

As shown in FIGS. 9A and 9B, a first pattern 202 is formed over a substrate 201 as in Embodiment Mode 2, and then a part of the first pattern 202 is irradiated with laser light 203. Then, a first conductive layer 211 in which metal particles are baked and an organic resin layer dispersed with metal particles on the opposite sides of the first conductive layer 211 are formed.

Figure 9C:
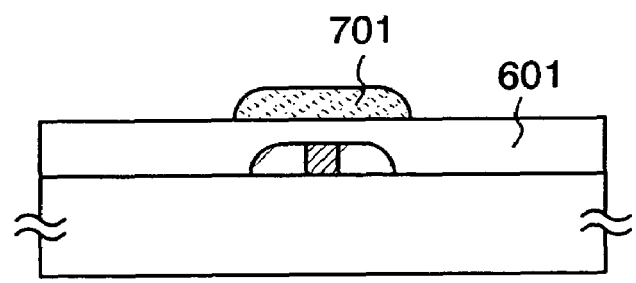

As shown in FIG. 9C, a first insulating layer 601 to serve as a gate insulating film is formed over the substrate 201, the first conductive layer 211 and the organic resin layer 212. A semiconductor region 701 is formed over the first insulating layer 601. The semiconductor region 701 is formed using the material and method shown in Embodiment Mode 6.

Figure 9D:
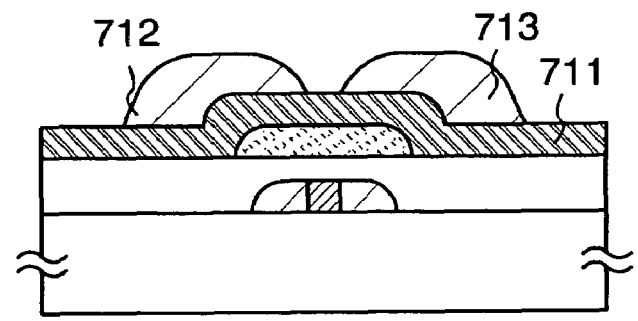

As shown in FIG. 9D, a third conductive layer 711 is formed over the first insulating layer 601 and the semiconductor region 701. Then, first mask patterns 712 and 713 are formed over the second conductive layer 711. The second conductive layer 602 and the first mask patterns 603 and 604 shown in Embodiment Mode 6 can be used appropriately as the second conductive layer 711 and the first mask patterns 712 and 713, respectively. The first mask patterns serve as masks for forming source and drain electrodes to be formed later.

Figure 9E:
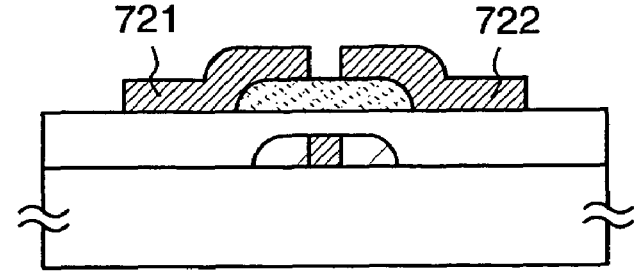

As shown in FIG. 9E, the second conductive layer 711 is etched using the first mask patterns 712 and 713 to form source and drain electrodes 721 and 722. A semiconductor element formed in this embodiment mode has a region in which a semiconductor region 701 is sandwiched between the first insulating layer 601 serving as a gate insulating film and one of the source and drain electrodes 721 and 722.

An organic thin film transistor having a short channel structure can be formed through the above described steps.

Embodiment Mode 8

Figure 10:
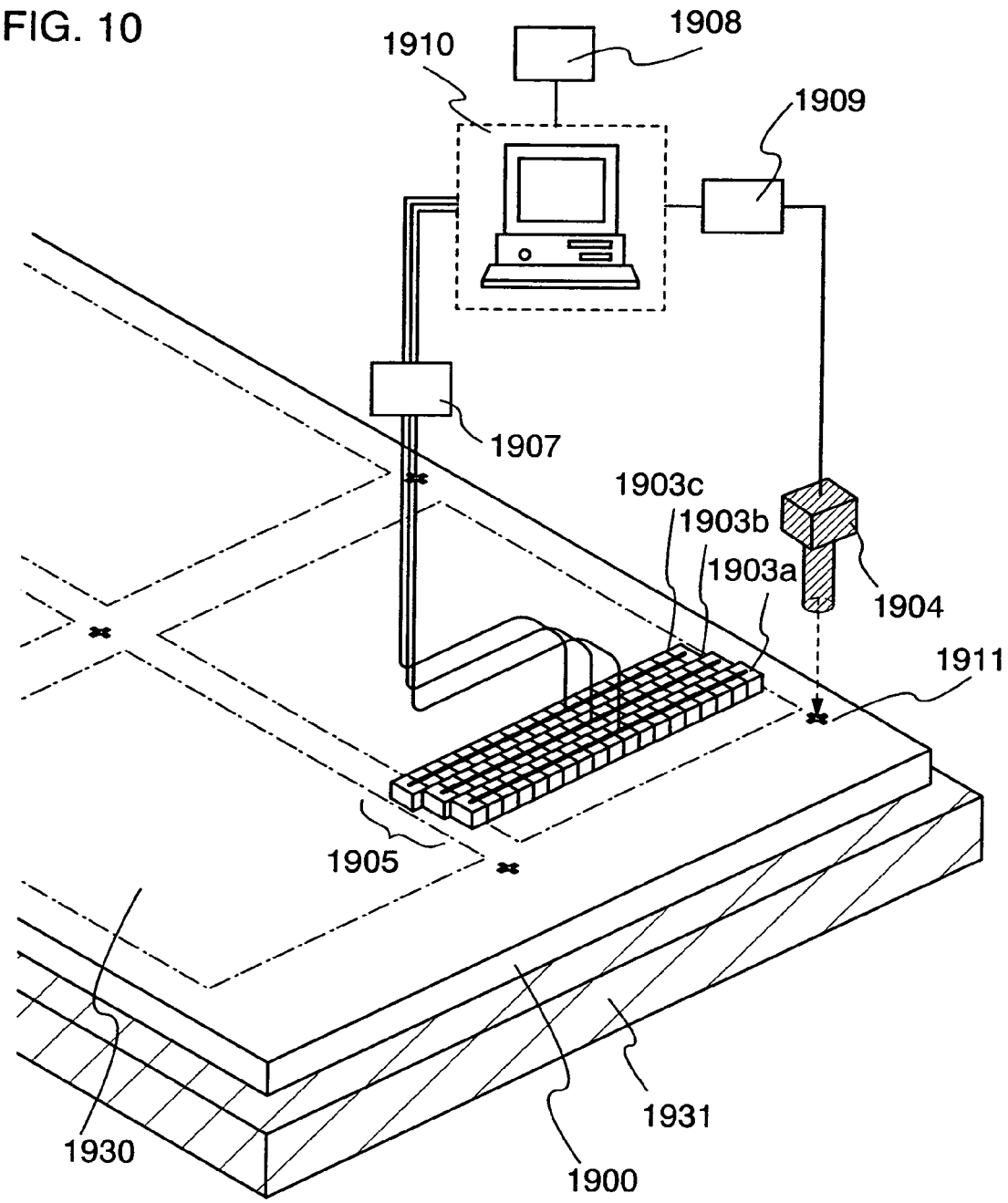
FIG. 10 shows a droplet discharging apparatus that can be applied to the present invention.

A droplet discharging apparatus which can be used for mask pattern formation in the above described embodiment modes is described in Embodiment Mode 8. In FIG. 10, a region where one panel 1930 is to be formed is shown by a dashed line over a substrate 1900.

FIG. 10 shows one mode of a droplet discharging apparatus used to form a pattern of a wiring or the like. A droplet discharging means 1905 has a head, and the head has a plurality of nozzles. The case of having three heads (1903a, 1903b, and 1903c) each of which is provided with ten nozzles is described in this embodiment mode. However, the number of nozzles and heads can be set in accordance with a treatment area, a process, or the like.

The heads are connected to a control means 1907, and the control means controls the heads by a computer 1910, so that a predetermined pattern can be drawn. A timing of drawing may be determined by, for example, using a marker 1911 that is formed over the substrate 1900 or the like fixed on a stage 1931 as a reference point. Alternatively, it may be determined with an edge of the substrate 1900 as a reference point. The reference point is detected by an imaging means 1904 such as a CCD, and changed into a digital converted signal by an image processing means 1909. Then, the digital signal is recognized by the computer 1910, and a control signal is generated and transmitted to the control means 1907. When the pattern is drawn in this manner, a distance between a pattern formation surface and a tip of the nozzle may be set 0.1 cm to 5 cm, preferably, 0.1 cm to 2 cm, more preferably, approximately 0.1 cm. Landing accuracy of a droplet is improved by making the distance short as described above.

At this time, information of a pattern to be formed over the substrate 1900 is stored in a storage medium 1908, and a control signal is transmitted to the control means 1907 based on this information, so that the heads 1903a, 1903b, and 1903c can be individually controlled. In other words, droplets including different compositions can be discharged from each nozzle of the heads 1903a, 1903b, and 1903c. For example, the nozzles of the heads 1903a and 1903b can discharge a droplet including a composition for an insulating film and the nozzles of the head 1903c can discharge a composition for a conductive film.

Further, the nozzles of the head can also be individually controlled. Since the nozzles can be individually controlled, different compositions can be discharged from specific nozzles. For example, one head 1903a can be provided with a nozzle which discharges a droplet including a composition for a conductive film and a nozzle which discharges a droplet including a composition for an insulating film.

Note that the nozzles are connected to a tank filled with compositions.

In the case of performing a droplet discharging treatment on a large area, like a formation step of an interlayer insulating film, droplets including a composition for an interlayer insulating film are preferably discharged from all nozzles. Further, droplets including a composition for an interlayer insulating film are preferably discharged from all nozzles of a plurality of heads. Accordingly, throughput can be improved. Naturally, in the interlayer insulating film formation step, a droplet discharging treatment may be performed on a large area by discharging a droplet including a composition for an interlayer insulating film from one nozzle and by moving the nozzle over the substrate a plurality of times.

Pattern formation on a large mother glass can be performed by moving the head in zigzag or shuttling the head. At this time, the head may be moved relative to the substrate a plurality of times. When the head is moved over the substrate, the head is preferably provided at a slight angle to the moving direction.

When a plurality of panels is formed out of the large mother glass, the head preferably has a width almost equal to that of one panel. This is because a pattern can be formed in the region where one panel 1930 is to be formed by moving the head once; thus, high throughput can be expected.

The head may have a width narrower than that of the panel. At this time, a plurality of heads having a narrow width may be arranged in series to have a width almost equal to that of one panel. Bending of the heads, which is concerned when a width of the head becomes broader, can be prevented from occurring by arranging the plurality of heads having a narrow width in series. Naturally, a pattern may be formed by moving a head having a narrow width a plurality of times.

A piezo method can be employed as a droplet discharging method. The piezo method is utilized also in an inkjet printer since it has superior droplet controllability and a high degree of freedom for ink selection. Note that the piezo method includes a bender type (typically, an MLP (Multi Layer Piezo) type), a piston type (typically, an MLChip (Multi Layer Ceramic Hyper Integrated Piezo Segments) type), a side wall type, and a roof wall type. Further, a droplet discharging method using a thermal method, by which a heating element generates heat to generate bubbles and a solution is pushed out, may be employed depending on a solvent of the solution.

Embodiment 1

In Embodiment 1, a resistance value of a sample formed by forming a pattern using Ag paste and baking the pattern temporarily and a resistance value of a sample formed by forming a pattern using Ag paste and baking Ag particles of the pattern by laser irradiation are described with reference to FIGS. 32A and 32B.

A resistance value of a sample formed by dropping Ag paste on a glass substrate by a droplet discharging method and baking it temporarily according to Condition 1 and a resistance value of a sample baked according to Condition 2 are compared. Obtained results are shown in Table 1, and the graph thereof is shown in FIG. 32A. The shape of each sample whose resistance value is measured is an elliptical shape whose major axis D1 is 1000 μm long and minor axis D2 is 200 μm wide as shown FIG. 32B. Note that Condition 1 is to heat for 30 minutes at 100° C. Condition 2 is to emit laser light oscillated from a continuous wave YVO$_4$ laser (laser power of 2 W, a laser beam diameter of 80 μm, and laser light with wavelength of 532 nm). At this time, the scan speed is 500 mm/sec.

TABLE 1

|  | condition 1 | condition 2 |
| --- | --- | --- |
| resistance value/Ω | 2.00E+07 | 7.77E+01 |
|  | 2.00E+07 | 1.14E+02 |
|  | 1.00E+07 | 1.00E+02 |
|  | 2.00E+07 | 9.56E+01 |
|  | 1.00E+07 | 8.88E+01 |

Figure 32A:
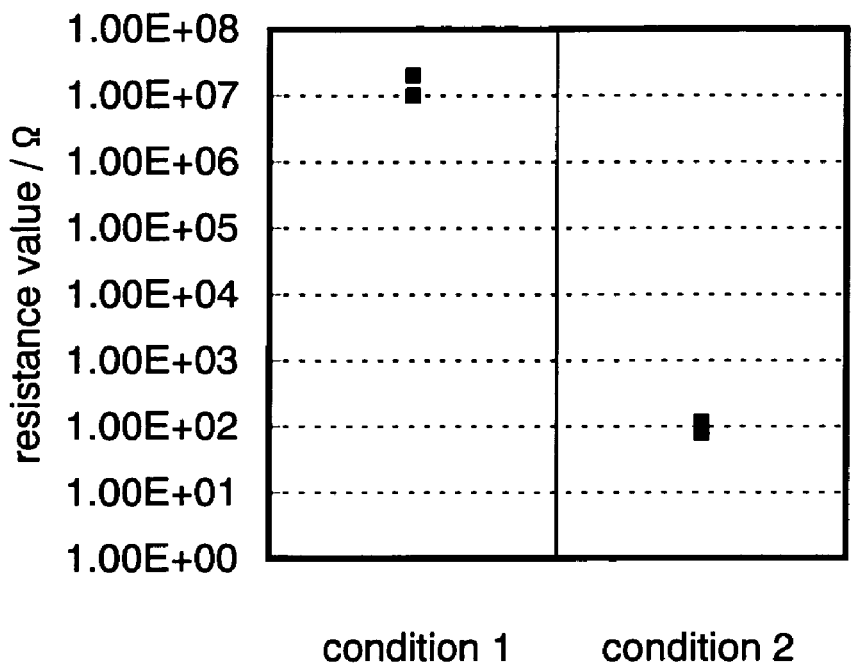
FIGS. 32A and 32B each a view for explaining a resistance value of a wiring according to the present invention.
Figure 32B:
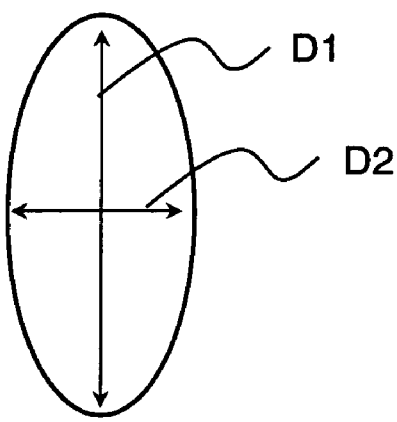

As apparent from Table 1 and FIGS. 32A and 32B, the resistance value of the sample is reduced due to the treatment according to Condition 2. In other words, it is possible to reduce the resistance value by baking metal particles with laser irradiation on paste containing metal particles.

Embodiment 2

Next, manufacturing methods of an active matrix substrate and a display panel including the active matrix substrate are described with reference to FIGS. 12A to 12C, 13A to 13C, 14A to 14C, 15A, 15B and 16. In Embodiment 2, a liquid crystal display panel is taken as an example of the display panel. FIG. 16 is a top view of the active matrix substrate, while FIGS. 12A to 12C, 13A to 13C, 14A to 14C, 15A and 15B each shows a vertical cross-sectional view corresponding to A-B of a connection terminal portion and C-D of a pixel portion.

As shown in FIG. 12A, an insulating film 801 with thickness of 100 nm is formed by oxidizing the surface of a substrate 800 at 400° C. Subsequently, a first conductive layer 802 is formed on the insulating film 801. A light-transmitting conductive film or a reflective conductive film are typical examples of the first conductive layer 802. As materials of the light-transmitting conductive film, indium tin oxide (ITO), zinc oxide (ZnO), indium zinc oxide (IZO), gallium-doped zinc oxide (GZO), indium tin oxide including silicon oxide and the like are given. In addition, as materials of the reflective conductive film, a metal such as aluminum (Al), titanium (Ti), silver (Ag), or tantalum (Ta), a metal material including the metal and nitrogen with a concentration of a stoichiometric composition ratio or less, titanium nitride (TiN) or tantalum nitride (TaN) that is nitride of the metal, aluminum containing nickel of 1% to 20% and the like are given. The first conductive layer 802 is formed appropriately by a sputtering method, an evaporation method, a CVD method, a coating method or the like. Here, an AN100 glass substrate manufactured by Asahi Glass Co., Ltd. is used as the substrate 800. Indium tin oxide (ITO) containing silicon oxide is formed as the first conductive layer 802 by a sputtering method to have a thickness of 110 nm.

Then, a first mask pattern 803 is formed over the first conductive layer 802 by a droplet discharging method. The first mask pattern serves as a mask for forming a second mask pattern (a film serving as a mask for etching a conductive layer) later. Accordingly, the first mask pattern preferably has a low wettability. In other words, it is preferable that the surface of the first mask pattern easily repels the second mask pattern to be formed later. Here, the first mask pattern is formed using a solution in which a fluorine-based silane coupling agent is dissolved in an alcohol solvent.

Subsequently, a second mask pattern 804 is formed by a droplet discharging method. A material having high wettability is discharged by the droplet discharging method to form the second mask pattern 804. Polyimide is discharged by the droplet discharging method and heated to be baked for 30 minutes at 200° C., thereby forming the second mask pattern 804.

Figure 30:
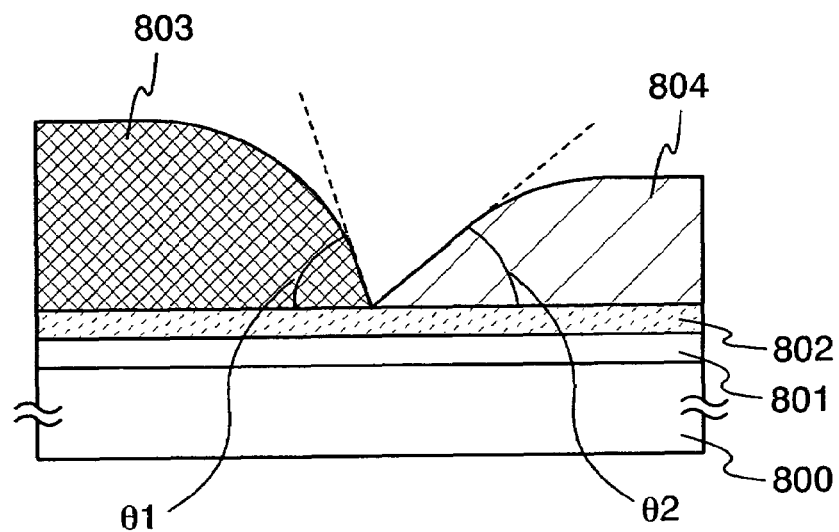
FIG. 30 shows contact angles in a low-wettability region and a high-wettability region.
Figure 31:
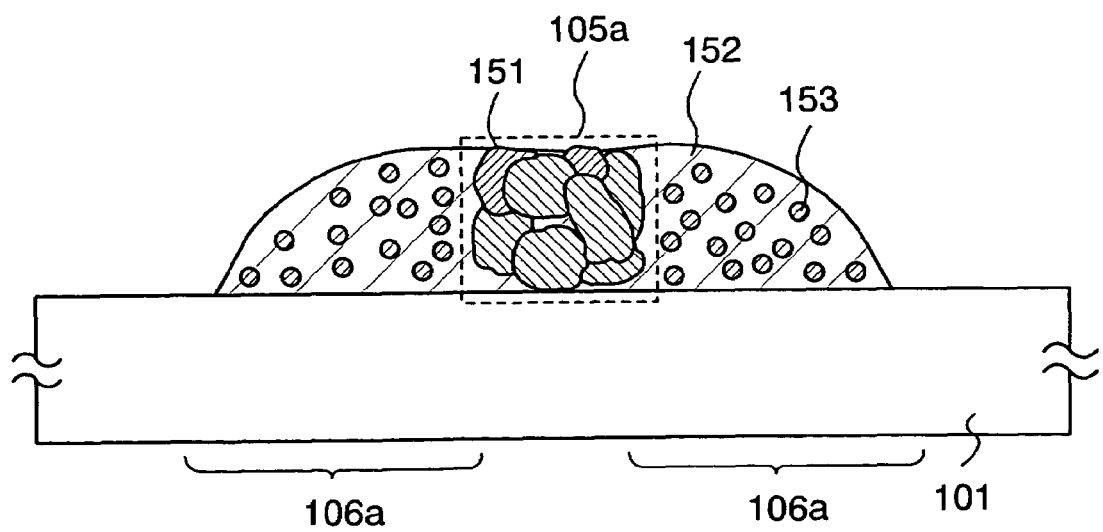
FIG. 31 is a cross-sectional view showing a wiring according the present invention.

A relationship between a region having low wettability and a region having high wettability is described here with reference to FIG. 30. The region having low wettability (here, the first mask pattern 803) means a region having a large contact angle θ1 between the surface and liquid as shown in FIG. 30. Liquid is repelled in a hemispherical shape by the surface. On the other hand, the region having high wettability (here, the second mask pattern 804) means a region having a small contact angle θ2 between the surface and liquid on the surface. Liquid is spread on the surface.

When two regions having different contact angles are in contact with each other, a region having a relatively small contact angle becomes a region having high wettability and a region having a relatively large contact angle becomes a region having low wettability. When the two regions are coated or discharged with a solution, the solution is spread over the region having low wettability and is repelled in a hemispherical shape at the interface with the region having high wettability.

A difference between the contact angle θ1 of the region having low wettability and the contact angle θ2 of the region having high wettability is preferably 30°, desirably, 40° or more. Accordingly, a material of the region having high wettability is repelled in a hemispherical shape by the surface of the region having low wettability. Each mask pattern 803 and 804 can be formed in a self-alignment manner.

Next, after the first mask pattern 803 is removed by ashing using oxygen, the first conductive layer 802 that is not covered with the second mask pattern 804 is removed by etching as shown in FIG. 12B. The second mask pattern 804 is removed to form a second conductive layer 805. The second conductive layer 805 serves as a pixel electrode.

First patterns 811 and 812 are formed as shown in FIG. 12C. The first patterns 811 and 812 are formed by discharging a composition containing organic resin and metal particles such as Ag, Au, Cu, Ni, Pt, Pd, Ir, Rh, W, Al, Ta, Mo, Cd, Zn, Fe, Ti, Si, Ge, Zr, or Ba by a droplet discharging method.

Figure 13A:
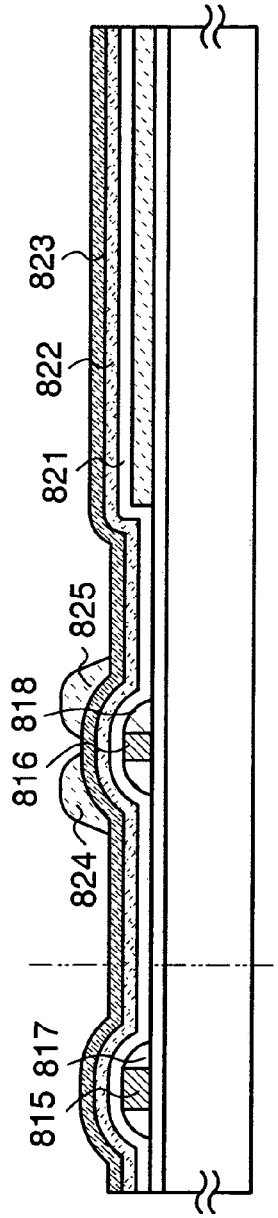
FIGS. 13A to 13C are each a cross-sectional view showing a manufacturing step of a semiconductor device according to the present invention.

Parts of the first patterns 811 and 812 are irradiated with laser light 813 and 814 to form third conductive layers 815 and 816 in which metal particles are baked as shown in FIG. 13A. At this time, regions that are not irradiated with the laser light in the first patterns 811 and 812 are organic resin layers 817 and 818 dispersed with metal particles. The third conductive layers 815 and 816 are to serve as a gate wiring and a gate electrode, respectively.

Then, a gate insulating film 821 is formed by a sputtering method. A silicon nitride oxide film (SiNO, N>O) of 110 nm thick is formed as the gate insulating film 821.

A first semiconductor film 822 and a second semiconductor film 823 that is n-type are formed. An amorphous silicon film of 150 nm thick is formed by a sputtering method as the first semiconductor film 822. Then, an oxide film on the surface of the amorphous silicon film is removed, and then a semi-amorphous silicon film of 50 nm thick is formed as the second semiconductor film 823 by the same method. Here, since the first semiconductor film and the second semiconductor film are formed by a sputtering method, the films can be formed at a room temperature.

Then, third mask patterns 824 and 825 are formed over the second semiconductor film. Polyimide is discharged on the second semiconductor film by a droplet discharging method and heated for 30 minutes at 200° C. to form the third mask patterns. The third mask patterns 824 and 825 are formed over a region where a first semiconductor region is to be formed later.

Figure 13B:
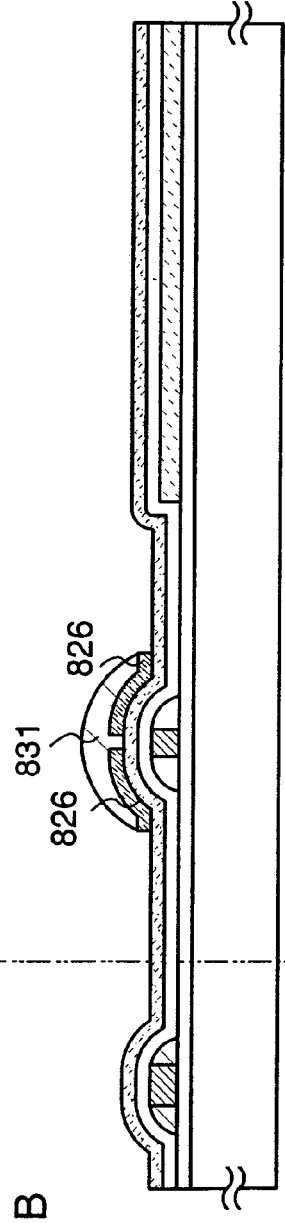

As shown in FIG. 13B, the second semiconductor film 823 is etched using the third mask patterns to form a second semiconductor region 826 (source and drain regions, a contact layer). The second semiconductor film is etched using a mixture gas whose flow ratio of $CF_4:O_2$ is 10:9. After that, the third mask patterns 824 and 825 are removed by a separation liquid.

Figure 13C:
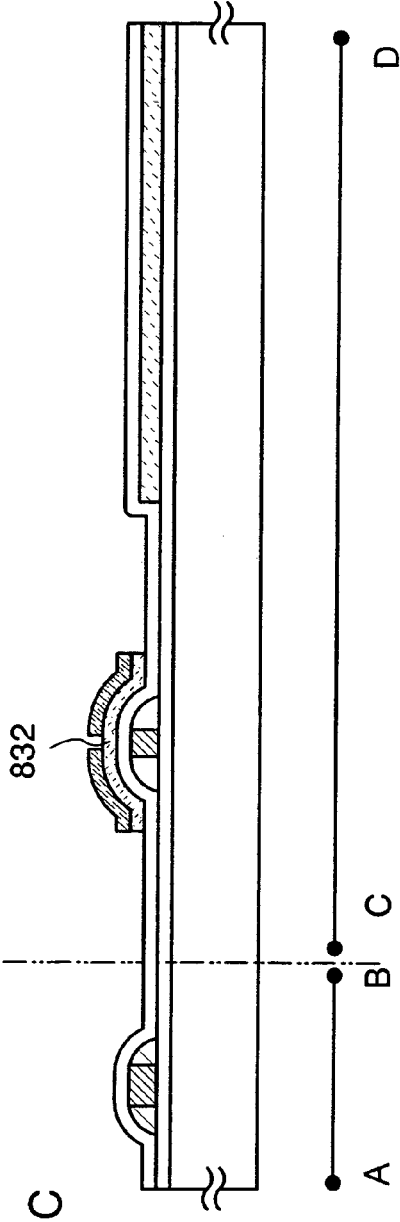

A fourth mask pattern 831 for covering the second semiconductor region 826 and the first semiconductor film 822 formed between the second semiconductor regions is formed. The fourth mask pattern is formed using the same material and method as the third mask pattern. The first semiconductor film 822 is etched using the fourth mask pattern to form a first semiconductor region 832 as shown in FIG. 13C and to expose a part of the gate insulating film 821. The first semiconductor film is etched using a mixture gas whose flow ratio of $CF_4:O_2$ is 10:9, and then ashing using oxygen is conducted. After that, the fourth mask pattern 831 is removed by a separation liquid.

As shown in FIG. 14A, fifth mask patterns 841 and 842 are formed. A solution having low wettability is discharged onto a region where the gate insulating film 821 and the second conductive layer 805 are overlapped and onto a connection terminal portion by a droplet discharging method to form fifth mask patterns. Here, a solution of a fluorine-based silane coupling agent dissolved in an alcohol solvent is used as the solution having low wettability. The fifth mask patterns 841 and 842 are each a protective film for forming a sixth mask pattern used to form a contact hole in a region where a drain electrode is to be connected to the second conductive layer 805. The sixth mask pattern is also a protective film for exposing the conductive layer of the connection terminal portion.

The sixth mask pattern 843 is formed. The sixth mask pattern is a mask for forming a contact hole and is formed by discharging polyimide by a droplet discharging method and heating it at 200° C. for 30 minutes. At this time, the fifth mask pattern 841 is formed of a material having low wettability and the sixth mask pattern 843 is formed of a material having high wettability. Therefore, the sixth mask pattern 843 is not formed in the region where the fifth mask pattern is formed.

The fifth mask patterns 841 and 842 are removed by oxygen ashing to expose a part of the gate insulating film 821. Then, a part of the exposed gate insulating film is etched using the sixth mask pattern 843 to form a contact hole 844. The gate insulating film is etched using $CHF_3$. After that, the sixth mask pattern is removed by oxygen ashing and etching using a separation liquid.

Fourth conductive layers 851 and 852 are formed by a droplet discharging method as shown in FIG. 14C. The fourth conductive layers 851 and 852 serve as source and drain wiring layers. A composition dispersed with Ag (silver) particles is discharged and dried by heating at 100° C. for 30 minutes and thereafter baked by laser irradiation to form the fourth conductive layers 851 and 852.

Through the above described steps, an active matrix substrate can be formed. Note that a plane structure corresponding to a vertical cross-sectional structure taken along line A-B and line C-D in FIG. 14C is shown in FIG. 16, and thus FIG. 16 may be referred to as well.

Figure 15A:
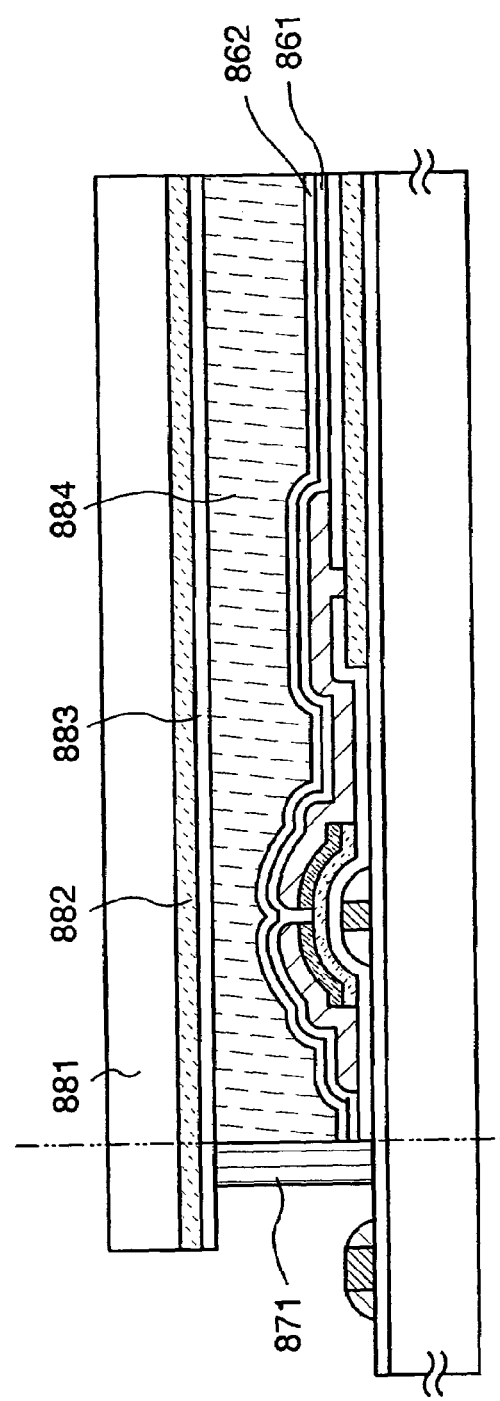
FIGS. 15A and 15B are each a cross-sectional view showing a manufacturing step of a semiconductor device according to the present invention.
Figure 16:
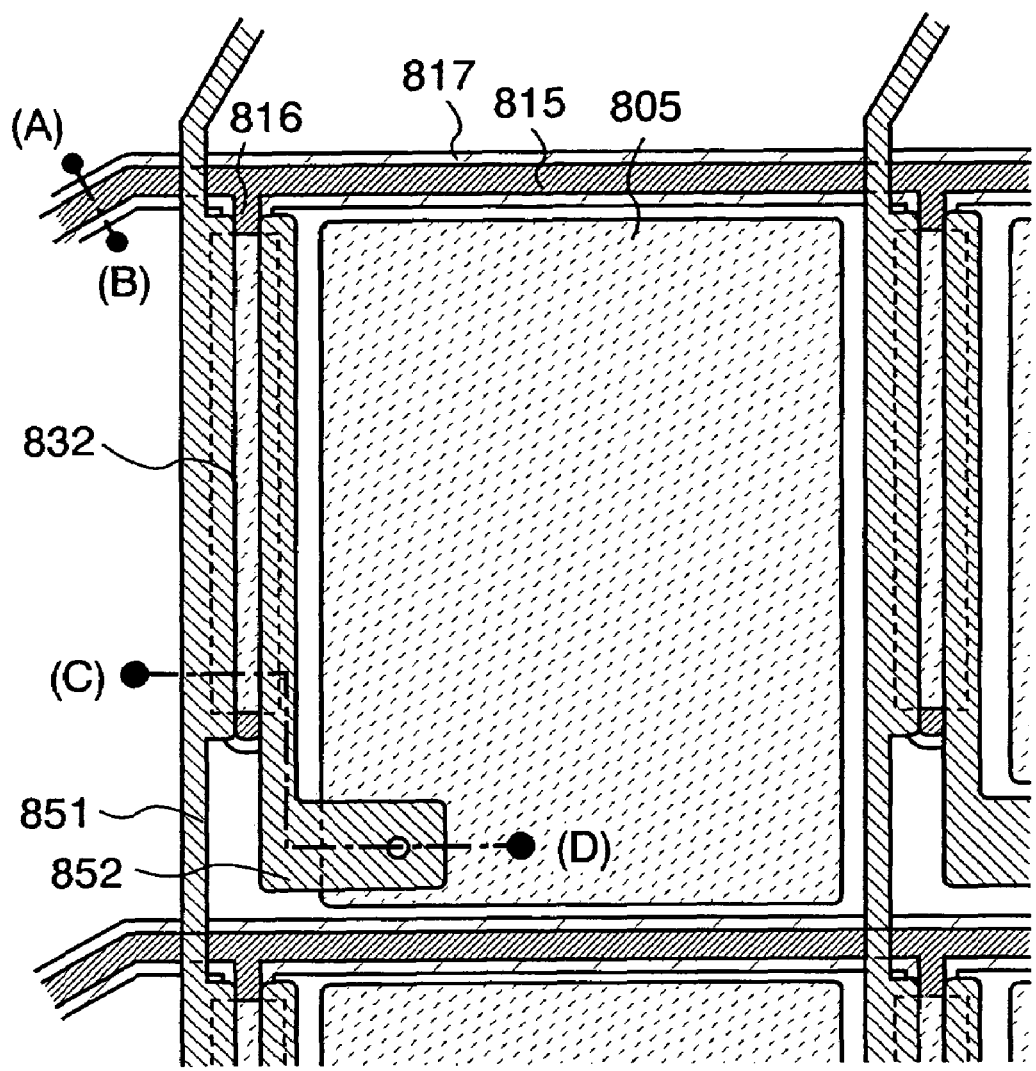
FIG. 16 is a top view showing a manufacturing step of a semiconductor device according to the present invention.

A protective film 861 is formed as shown in FIG. 15A. A silicon nitride film having a thickness of 100 nm is formed as the protective film by a sputtering method using a silicon target and argon and nitrogen (a flow ratio of $Ar:N_2=1:1$) as a sputtering gas.

Subsequently, an insulating film is formed by a printing method or a spin coating method to cover the protective film 861. Then, rubbing is performed to form an orientation film 862. Note that the orientation film 862 can be formed by an oblique evaporation method.

A sealing agent 871 in the shape of a closed loop is formed by a droplet discharging method in a peripheral region of the pixel portion, in an opposite substrate 881 provided with an orientation film 883 and a second pixel electrode (opposite electrode) 882. A liquid crystal material is dropped by a dispenser method (dropping method) inside the closed loop formed by the sealing agent 871.

The sealing agent 871 may be mixed with filler. Moreover, a color filter, a shielding film (black matrix) or the like may be provided for the opposite substrate 881.

Figure 17A:
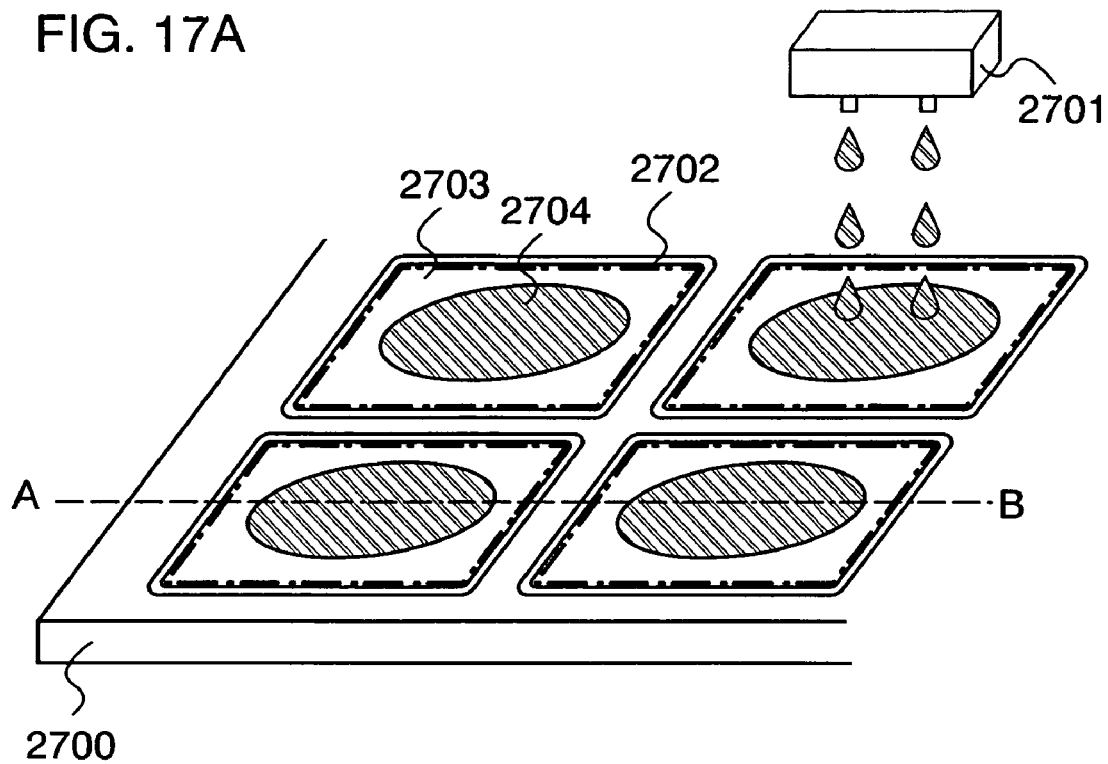
FIGS. 17A and 17B each show a method for dropping a liquid crystal that can be applied to the present invention.
Figure 17B:
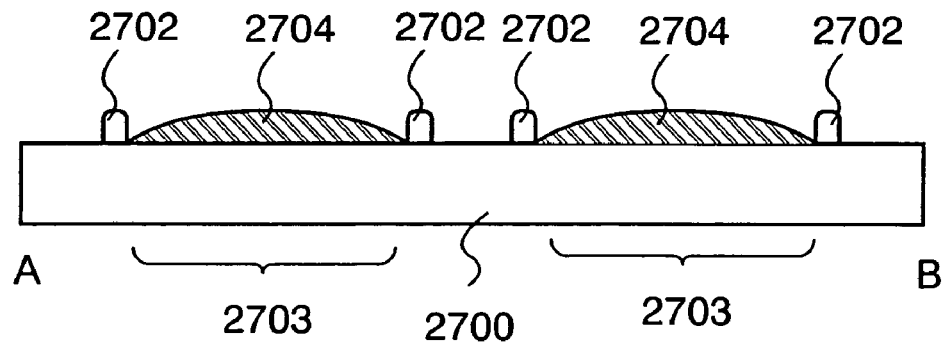

Here, a step of dropping a liquid crystal material is described with reference to FIGS. 17A and 17B. FIG. 17A is a perspective view showing a step of dropping a liquid crystal material with a dispenser 2701, and FIG. 17B is a cross-sectional view taken along a line A-B in FIG. 17A.

A liquid crystal material 2704 is dropped or discharged from the dispenser 2701 to cover a region 2703 surrounded by a sealing agent 2702. A liquid crystal layer can be formed by moving the dispenser 2701 or by moving a substrate 2700 with the dispenser 2701 fixed. In addition, a plurality of dispensers 2701 may be provided to drop the liquid crystal material onto a plurality of regions simultaneously. Consequently, as shown in FIG. 17B, the liquid crystal material 2704 can be selectively dropped or discharged only onto a region surrounded by the sealing agent 2702.

Here, the liquid material is dropped in a pixel portion. However, a substrate having the pixel portion may be attached after a liquid material is dropped on an opposite substrate side.

Subsequently, as shown in FIG. 15A, the opposite substrate 881 provided with the orientation film 883 and the second pixel electrode (opposite electrode) 882 is attached to the active matrix substrate and ultraviolet curing is performed in vacuo. Thus, a liquid crystal layer 884 filled with the liquid crystal material is formed. A dipping method (a pumping method) that injects a liquid crystal material using a capillary phenomenon, after attaching the opposite substrate, can be used as a method for forming the liquid crystal layer 884, instead of a dispenser method (a dropping method).

Figure 15B:
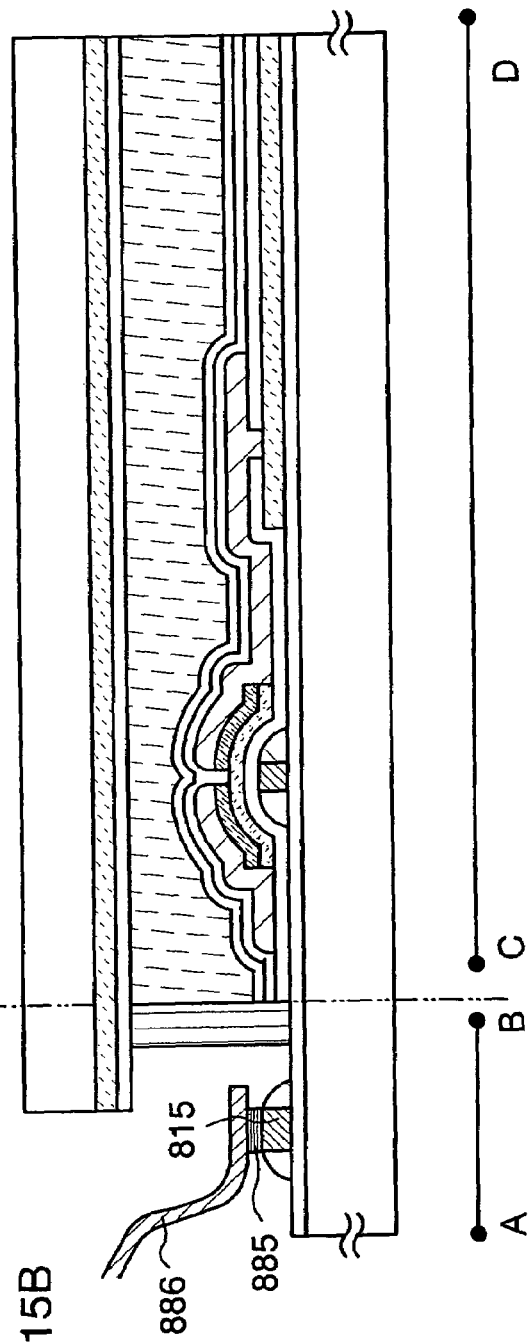

In the case where an insulating film is formed over each edge portion of the third conductive layer 815 and a source wiring layer (not shown), after removing the insulating film, a connection terminal (a connection terminal 886 to be connected to the third conductive layer, and a connection terminal to be connected to the source wiring layer is not shown) is attached with a conductive layer 885 therebetween as shown in FIG. 15B. Further, a connection portion of each wiring layer and connection terminal is preferably sealed with a sealing resin. This structure can prevent moisture from a section from entering and deteriorating the pixel portion. Through the above described steps, a liquid crystal display panel can be formed.

Through the above described steps, a liquid crystal display panel can be manufactured. Note that a protective circuit, typically, a diode or the like for preventing electrostatic damage may be provided between the connection terminal and the source wiring (gate wiring) or in the pixel portion. In this case, electrostatic damage can be prevented by manufacturing it according to a similar step to that of the above-described TFT and connecting the gate wiring layer of the pixel portion to the drain or source wiring layer of the diode.

Note that any of Embodiment Modes 1 to 8 can be applied to this embodiment.

Embodiment 3

A method for manufacturing a light emitting display panel as a display panel is described in Embodiment 3 with reference to FIGS. 19A and 19B, 20A and 20B, 21A and 21B and 22. A plane structure of a pixel portion is shown in FIG. 22, and FIGS. 19A and 19B, 20A and 20B, 21A and 21B and 22 schematically show a vertical cross-sectional structure corresponding to a line A-B and a line C-D of the pixel portion in FIG. 22.

A first insulating layer 2002 is formed over a substrate 2001 to have a thickness of 100 nm to 1000 nm as shown in FIG. 19A. Here, the first insulating layer 2002 is formed by stacking a silicon oxide film of 100 nm thick formed by a plasma CVD method and a silicon oxide film of 480 nm thick formed by a low-pressure thermal CVD method.

An amorphous semiconductor film is formed to have a thickness of 10 to 100 nm. Here, an amorphous silicon film is formed by a low-pressure thermal CVD method to have a thickness of 50 nm. The amorphous silicon film is crystallized. In this embodiment, the amorphous silicon film is irradiated with laser light to form a crystalline silicon film. An unnecessary portion of the crystalline silicon film is removed to form semiconductor regions 2003 and 2004. A second insulating layer 2005 serving as a gate insulating film is formed. Here, a silicon oxide film is formed as the second insulating layer 2005 by a CVD method.

A channel doping step of adding a p-type or n-type impurity element in low concentration to a region to become a channel region of a TFT is entirely or selectively performed. This channel doping step is a step for controlling a threshold voltage of the TFT. Note that boron is added by an ion doping method in which diborane ($B_2H_6$) is plasma-activated without mass separation. Naturally, an ion implantation method with mass separation may be used.

First patterns 2006 to 2009 are formed and then, irradiated with laser light 2010 to 2013 to form first conductive layers 2014 to 2016 serving as gate electrodes and to form a first conductive layer 2017 serving as a capacitor wiring as shown in FIG. 19B. At the same time as this step, organic resin layers 2018 to 2021 dispersed with metal particles are formed in regions that are not irradiated with the laser light 2010 to 2013. Here, Ag paste is discharged by a droplet discharging method and irradiated with the laser light.

Figure 20A:
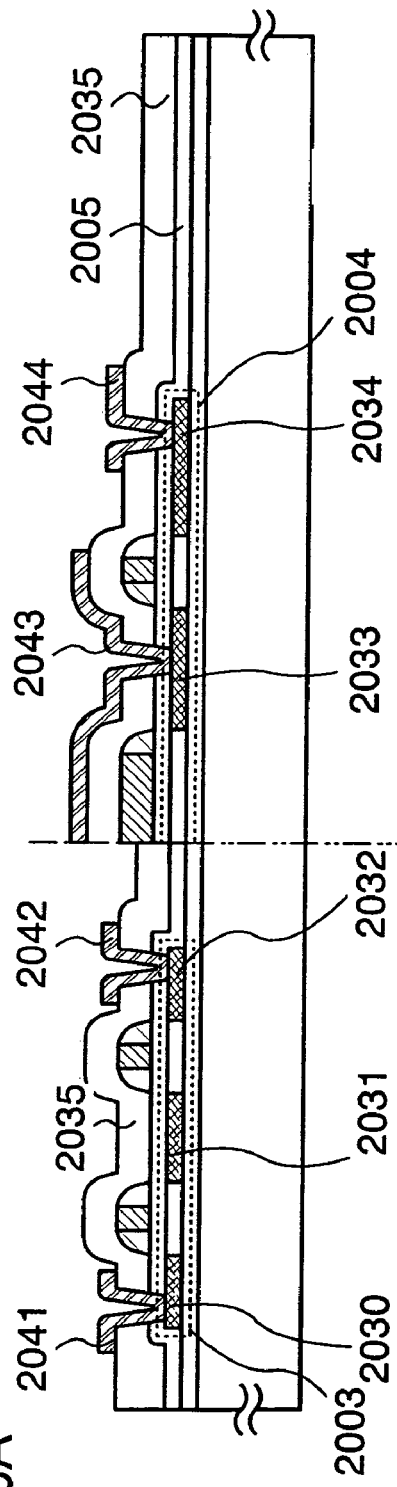
FIGS. 20A and 20B are each a cross-sectional view showing a manufacturing step of a semiconductor device according to the present invention.

As shown in FIG. 20A, high concentration impurity regions 2030 to 2034 are formed by adding phosphorus into a semiconductor region in a self-alignment manner with the first conductive layers 2014 to 2017 and the organic resin layers 2018 to 2021 dispersed with metal particles as masks. The concentration of phosphorus in the high concentration impurity region is adjusted to be $1\times10^{20}$ to $1\times10^{21}$ atoms/cm$^3$ (typically, $2\times10^{20}$ to $5\times10^{20}$ atoms/cm$^3$). Note that regions that are overlapped with the first conductive layers 2014 to 2017 and the organic resin layers 2018 to 2021 dispersed with metal particles in the semiconductor regions 2003 and 2004 become a channel formation region.

A third insulating layer 2035 is formed to cover the first conductive layers 2014 to 2017. Here, an insulating film containing hydrogen is formed. Thereafter, the impurity element added to the semiconductor regions is activated and the semiconductor regions are hydrogenated. Here, a silicon nitride oxide film (SiNO film) obtained by a sputtering method is used as the insulating film containing hydrogen.

Second conductive layers 2041 to 2044 are formed after opening portions are formed to reach the semiconductor regions. The second conductive layers 2041, 2042, 2043 and 2044 serve as a source wiring, a first connection wiring, a power supply line, and a second connection wiring, respectively. In this embodiment, a stacked film having a three-layer structure is formed by sequentially stacking a Ti film, an aluminum-silicon alloy film, and a Ti film by a sputtering method and is etched into a desired shape to form the second conductive layers.

Figure 20B:
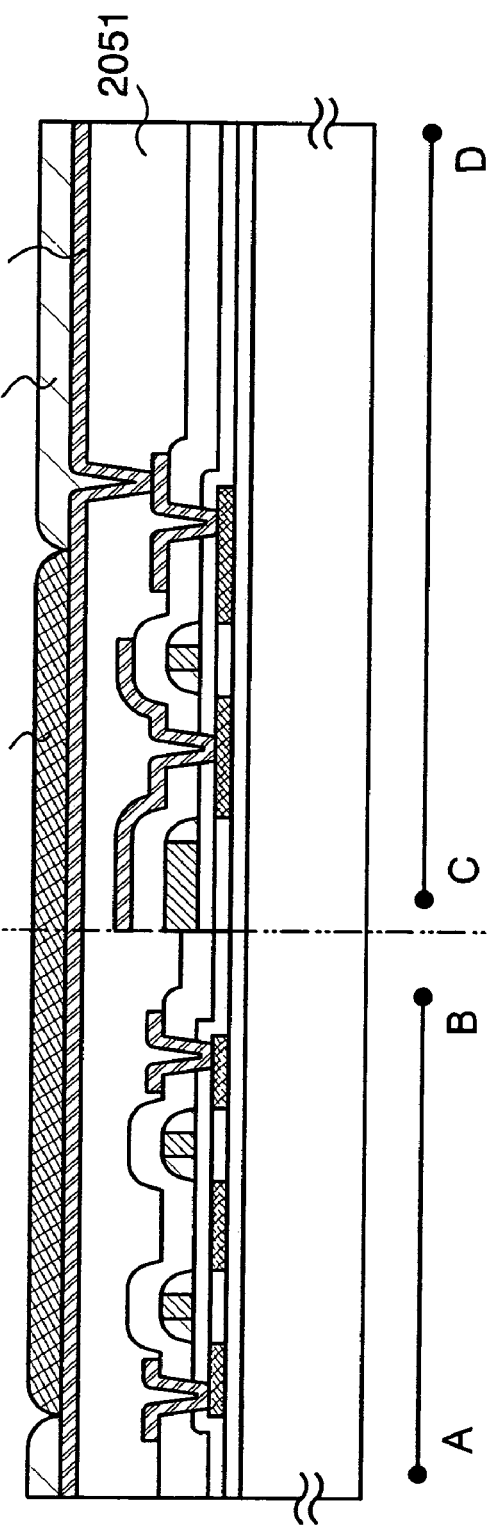

A fourth insulating layer 2051 is formed as shown in FIG. 20B. An insulating layer which can be planarized is preferable for the fourth insulating layer. The insulating layer which can be planarized can be formed appropriately using the same material and method as the third insulating layer 544 shown in Embodiment Mode 5. Here, acrylic resin is formed. Note that stray light from a light emitting element to be formed later is absorbed by the fourth insulating layer, when an organic material in which a material absorbing visible light such as a black pigment or a coloring matter is dissolved or dispersed is used for the fourth insulating layer; thus, the contrast of each pixel can be enhanced.

An opening portion is formed in the fourth insulating layer by known photolithography and etching, and a part of the second conductive layer 2044 (the second connection wiring) is exposed. Then, a third conductive layer 2052 is formed. The third conductive layer 2052 is formed by stacking a reflective conductive film and a transparent conductive film. Here, an aluminum film containing nickel of 1% to 20% and ITO containing silicon oxide are stacked by a sputtering method. Note that the aluminum containing nickel of 1% to 20% is preferable because it is not electrically corroded even when in contact with IFO that is oxide.

A first mask pattern 2053 is formed by a droplet discharging method. A second mask pattern 2054 is formed by a droplet discharging method. The first mask pattern 2053 is formed by discharging a material having low wettability, here, a solution of a fluorine-based silane coupling agent dissolved in an alcohol solvent by a droplet discharging method. Polyimide is discharged by a droplet discharging method and baked by heating it at 200° C. for 30 minutes to form the second mask pattern 2054.

Figure 21A:
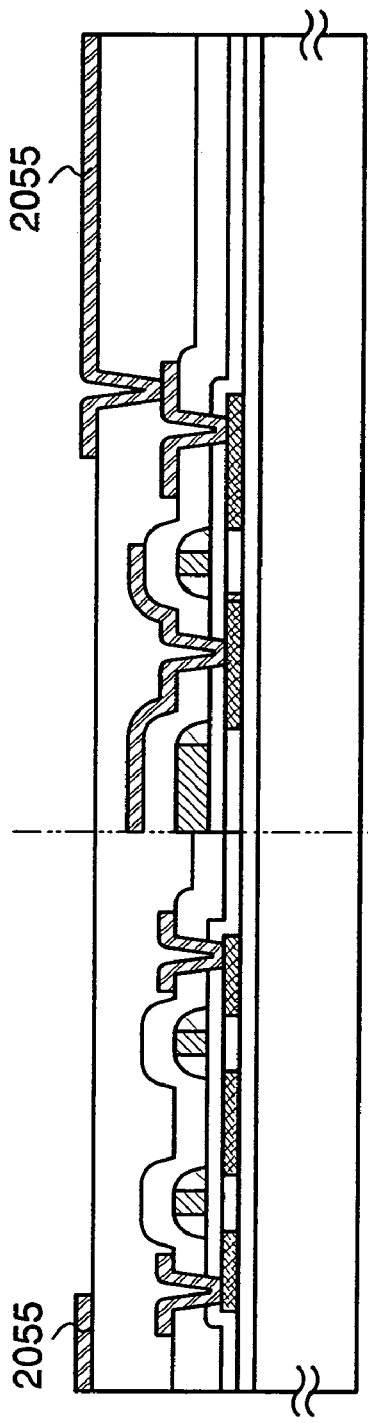
FIGS. 21A and 21B are each a cross-sectional view showing a manufacturing step of a semiconductor device according to the present invention.
Figure 21B:
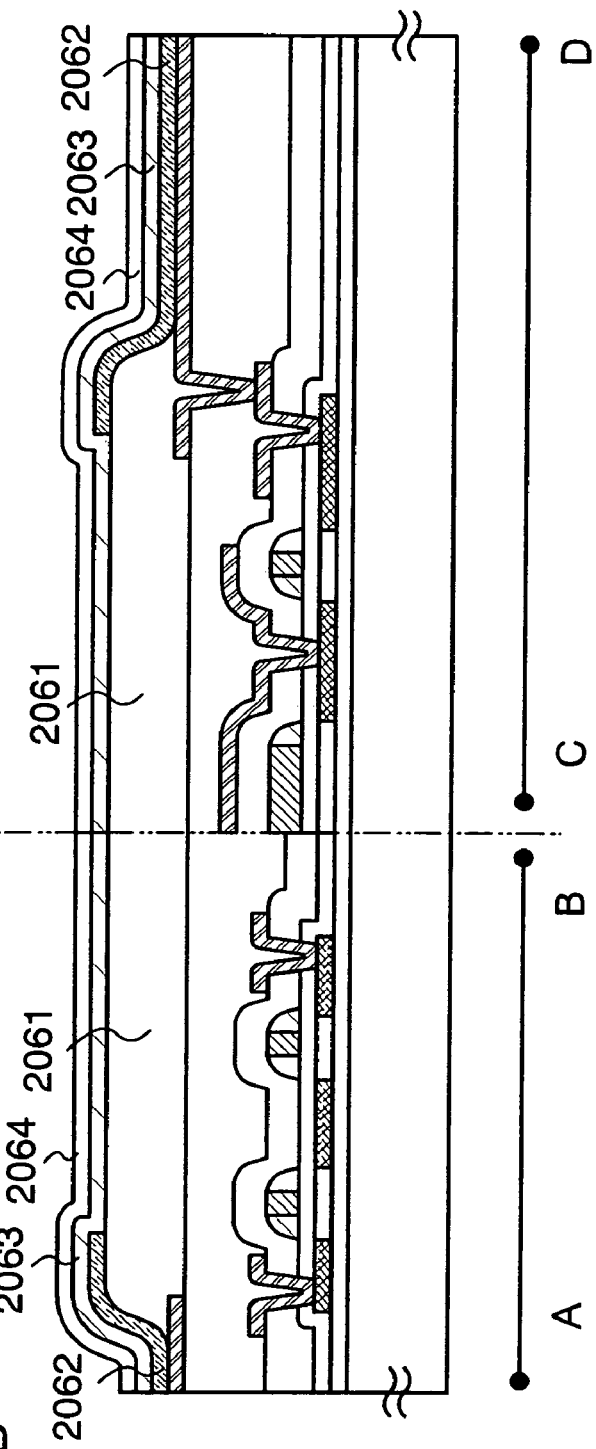
Figure 22:
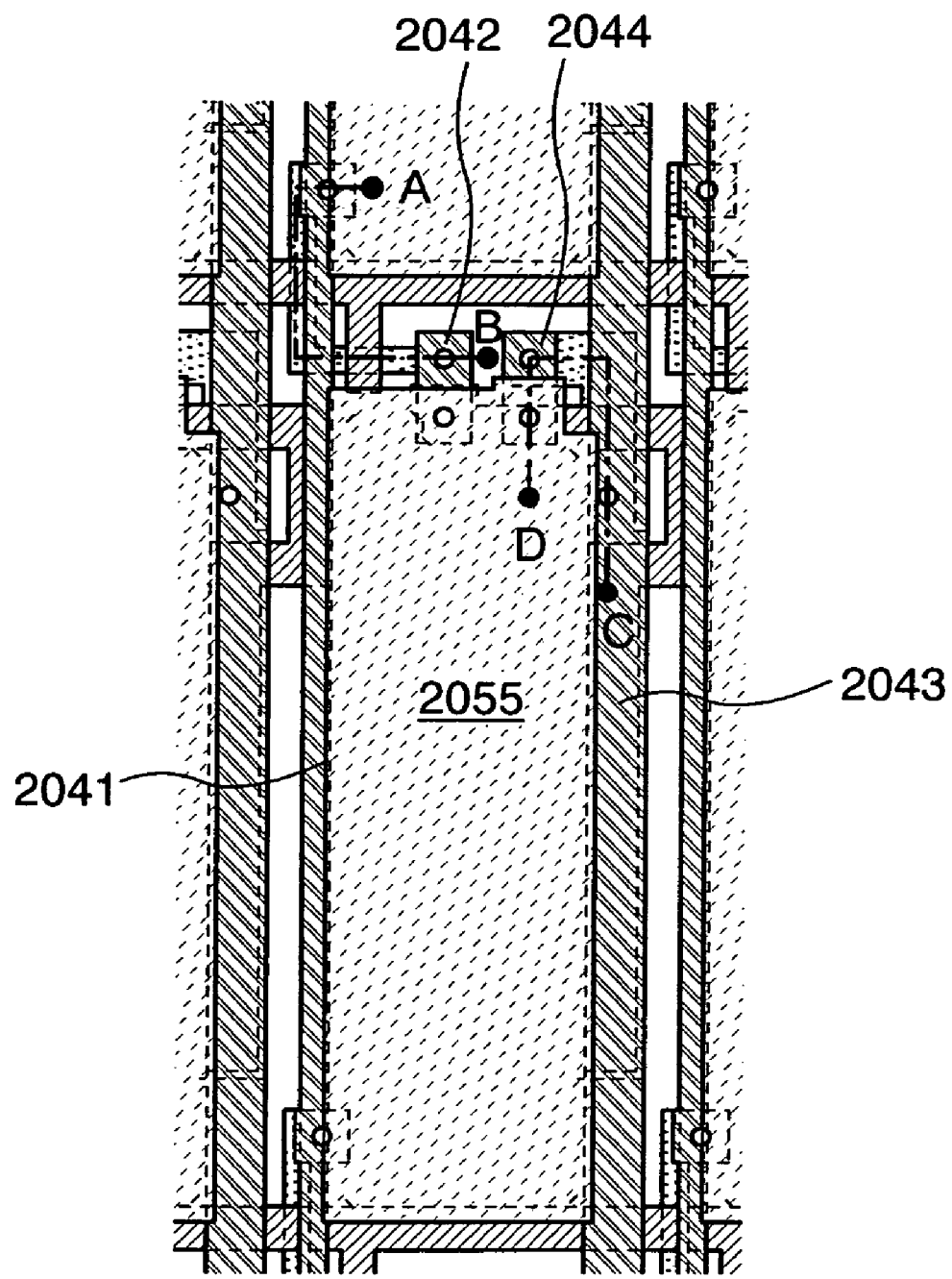
FIG. 22 is a top view showing a manufacturing step of a semiconductor device according to the present invention.

After the first mask pattern 2053 is removed by ashing using oxygen, a portion of the third conductive layer 2052 which is not covered with the second mask pattern 2054 is removed by etching as shown in FIG. 21A. The second mask pattern 2054 is removed to form a fourth conductive layer 2055. The fourth conductive layer 2055 serves as a first pixel electrode. Note that a plane structure corresponding to a vertical cross-sectional structure taken along a line A-B and a line C-D in FIG. 21A is shown in FIG. 22, and thus FIG. 22 may be referred to as well.

A fifth insulating layer 2061 to be a bank (also referred to as a partition wall, a mound or the like) is formed to cover an edge portion of the fifth conductive layer 2055. A photosensitive or non-photosensitive organic material (polyimide, acrylic, polyamide, polyimide amide, and benzocyclobutene or resist) or a SOG film (for example, a SiOx film including an alkyl group) having a thickness of 0.8 μm to 1 μm is used as the fifth insulating layer. It is preferable to form the fifth insulating layer 2061 using a photosensitive material, because a side face thereof becomes such a shape that the radius of curvature continuously changes and an upper-layer thin film is formed without break.

The fifth insulating layer 2061 may be a light shielding insulator in which a material absorbing visible light such as a coloring matter or a black pigment is dissolved or dispersed in the above-described organic material. For example, a material such as COLOR MOSAIC CK (trade name) manufactured by FUJIFILM OLIN Co., Ltd. is used. In this case, the fifth insulating layer serves as a black matrix; thus, the fifth insulating layer can absorb stray light from a light emitting element to be formed later. Accordingly, the contrast of each pixel can be enhanced. Further, the fourth insulating layer 2051 that is also formed of a light-shielding insulator can generate a light-shielding effect when combined with the fifth insulating layer 2061.

A layer including a light emitting material 2062 is formed over the surface of the fourth conductive layer 2055 and over the edge portion of the fifth insulating layer 2061 by an evaporation method, a coating method, a droplet discharging method, or the like. A fifth conductive layer 2063 serving as a second pixel electrode is formed over the layer including a light emitting material 2062. Here, ITO containing silicon oxide is formed by a sputtering method. Accordingly, the fourth conductive layer 2055, the layer including a light emitting material 2062, and the fifth conductive layer 2063 can form a light emitting element. Each material of the conductive layer constracting a light emitting element and the layer including a light emitting material is appropriately selected and each thickness thereof is adjusted.

Note that water adsorbed inside or on the surface of the fifth insulating layer 2061 is removed by performing a heat treatment at 200° C. at atmospheric pressure before forming the layer including a light emitting material 2062. In addition, a heat treatment is preferably performed at 200° C. to 400° C., preferably, 250° C. to 350° C. under low pressure, and the layer including a light emitting material 2062 is preferably formed by a vacuum evaporation method or a droplet discharging method under low pressure without being exposed to atmospheric air.

The layer including a light emitting material 2062 may be formed of a charge injection transport material and a light emitting material containing an organic compound or an inorganic compound. The layer including a light emitting material may include one or plural kinds of layers of a low molecular weight organic compound, an intermediate molecular weight organic compound typified by dendrimer, oligomer, or the like, and a high molecular weight organic compound, which are classified depending on the number of molecules. The layer including a light emitting material may be combined with an electron injection transport or hole injection transport inorganic compound.

As a highly electron transporting material among charge injection transport materials, a metal complex having a quinoline skeleton or a benzoquinoline skeleton such as tris (8-quinolinolato) aluminum[$Alq_3$], tris (4-methyl-8-quinolinolato) aluminum[$Almq_3$], bis(10-hydroxybenzo[h]-quinolinato)beryllium[$BeBq_2$], or bis (2-methyl-8-quinolinolato)-4-phenylphenolato-aluminum[BAlq], or the like can be used.

As a highly hole transporting material, an aromatic amine compound (in other words, a compound having a benzene ring-nitrogen bond) such as 4,4'-bis[N-(1-naphthyl)-N-phenyl-amino]-biphenyl[α-NPD], 4,4'-bis[N -(3-methylphenyl)-N-phenyl-amino]-biphenyl[TPD], 4,4',4"-tris(N,N-diphenyl-amino)-triphenylamine[TDATA], or 4,4',4"-tris[N-(3-methylphenyl)-N-phenyl-amino]-triphenylamine [MTDATA] can be used.

As a highly electron injecting material among charge injection transport materials, a compound of alkali metal or alkaline earth metal such as lithium fluoride (LiF), cesium fluoride (CsF), or calcium fluoride ($CaF_2$) can be specifically used. The highly electron injecting material may be a mixture of a highly electron transporting material such as $Alq_3$ and an alkaline earth metal such as magnesium (Mg).

As a highly hole injecting material among charge injection transport materials, metal oxide such as molybdenum oxide ($MoO_x$), vanadium oxide ($VO_x$), ruthenium oxide ($RuO_x$), tungsten oxide ($WO_x$), or manganese oxide ($MnO_x$) can be used. In addition, a phthalocyanine compound such as phthalocyanine ($H_2Pc$) or copper phthalocyanine (CuPc) can be used.

A light emitting layer may perform color display by providing each pixel with a light emitting layer having a different emission wavelength band. Typically, a light emitting layer corresponding to each color of R (red), G (green), and B (blue) is formed. In this case, color purity can be increased and a pixel portion can be prevented from having a mirror surface (glare) by providing a light emitting side of a pixel with a filter (colored layer) which transmits light of the emission wavelength band. Providing the light emitting side of a pixel with the filter (colored layer) can omit a circularly polarizing plate or the like which is conventionally required and can eliminate the loss of light emitted from the light emitting layer. Further, change in hue, which occurs when a pixel portion (display screen) is obliquely seen, can be reduced.

A light-emitting material forming the light emitting layer includes various materials. As to a low molecular weight organic light emitting material, 4-(dicyanomethylene)2-methyl-6-[2-(1,1,7,7-tetramethyljulolidine-9-yl) ethenyl]-4H-pyran[DCJT], 4-dicyanomethylene-2-tert-butyl-6-[2-(1,1,7, 7-tetramethyljulolidine-9-yl-ethenyl)]-4H-pyran[DCJTB], periflanthene, 2,5-dicyano-1,4-bis[2-(10-methoxy-1,1,7,7-tetramethyljulolidine-9-yl)ethenyl]benzene, N,N'-dimethylquinacridon[DMQd], coumarin 6, coumarin 545T, tris (8-quinolinolate)aluminum [$Alq_3$], 9,9'-bianthryl, 9,10-diphenylanthracene [DPA], 9,10-di(2-naphthyl)anthracene [DNA], or the like can be used. In addition, another material can also be used.

A high molecular weight organic light emitting material is physically stronger than a low molecular weight material and is superior in durability of the element. In addition, a high molecular weight material can be formed by a coating method, and therefore, the element is relatively easily manufactured. A light emitting element using a high molecular weight organic light emitting material basically has the same structure as that of a light emitting element using a low molecular weight organic light emitting material, in other words, a cathode, a layer including a light emitting material and an anode. However, a two-layer structure is employed in many cases when the layer including a light emitting material using a high molecular weight organic light emitting material is formed. This is because it is difficult to form such a stacked structure as that in the case of using a low molecular weight organic light emitting material. Specifically, the light emitting element using a high molecular weight organic light emitting material has a structure of a cathode, a light emitting layer, a hole transport layer and an anode.

The emission color is determined by the material of the light emitting layer. Therefore, a light emitting element which emits desired light can be formed by selecting an appropriate material of the light emitting layer. Polyparaphenylene vinylene, polyparaphenylene, polythiophen, or polyfluorene based material can be used as a high molecular weight light emitting material that can be used to form the light emitting layer.

A derivative of poly (paraphenylene vinylene)[PPV], for example, poly(2,5-dialkoxy-1,4-phenylene vinylene)[RO-PPV], poly(2-(2'-ethyl-hexoxy)-5-metoxy-1,4-phenylene vinylene)[MEH-PPV], poly(2-(dialkoxyphenyl)-1,4-phenylene vinylene)[ROPh-PPV], and the like can be used as the polyparaphenylene-vinylene based light emitting material. A derivative of polyparaphenylene[PPP], for example, poly(2, 5-dialkoxy-1,4-phenylene)[RO-PPP], poly(2,5-dihexoxy-1, 4-phenylene), and the like can be used as the polyparaphenylene based light emitting material. A derivative of polythiophene [PT], for example, poly(3-alkylthiophene) [PAT], poly(3-hexylthiophene)[PHT], poly(3-cyclohexylthiophene)[PCHT], poly(3-cyclohexyl-4-methilthiophene) [PCHMT], poly(3,4-dicyclohexylthiophene)[PDCHT], poly [3-(4-octylphenyl)-thiophene][POPT], poly[3-(4-octylphenyl)-2,2bithiophene][PTOPT], and the like can be used as the polythiophene based light emitting material. A derivative of polyfluorene[PF], for example, poly(9,9-dialkylfluorene)[PDAF], poly(9,9-dioctylfluorene)[PDOF], and the like can be used as the polyfluorene based light emitting material.

In addition, the light emitting layer can be formed to emit monochrome or white light. In the case of using a white light emitting material, a filter (colored layer) which transmits light having a specific wavelength is provided on a light emitting side of a pixel, thereby performing color display.

In order to form a light emitting layer which emits white light, for example, $Alq_3$, $Alq_3$ partially doped with Nile Red that is a red light emitting pigment, p-EtTAZ, and TPD (aromatic diamine) are sequentially stacked by an evaporation method to obtain white light emission. When the light emitting layer is formed by a coating method using spin coating, the layer after coating is preferably baked by vacuum heating. For example, an aqueous solution of poly (ethylene dioxythiophene)/poly (styrene sulfonic acid) (PEDOT/PSS) may be entirely applied and baked to form a film that functions as a hole injection layer. Then, a polyvinyl carbazole (PVK) solution doped with a light emitting center pigment (such as 1,1,4,4-tetraphenyl-1,3-butadiene (TPB), 4-dicyanomethylene-2-methyl-6-(p-dimethylamino-styryl)-4H-pyran (DCM1), Nile Red, or coumarin 6) may be entirely applied and baked to form a film that functions as a light emitting layer.

The light emitting layer can be formed as a single layer. 1,3,4-oxadiazole derivative (PBD) having electron transporting properties may be dispersed in polyvinyl carbazole (PVK) having hole transporting properties. Another method for obtaining white light emission is to disperse PBD of 30 wt % as an electron transporting agent and to disperse four kinds of pigments (TPB, coumarin 6, DCM1, and Nile Red) in appropriate amounts. In addition to the light emitting elements described here that provide white light emission, a light emitting element that can provide red light emission, green light emission, or blue light emission can be manufactured by appropriately selecting materials of the light emitting layer.

Note that properties of hole injection from the anode can be enhanced by interposing a high molecular weight organic light emitting material having hole transporting properties between the anode and the high molecular weight organic light emitting material having light emitting properties. The hole transporting material is generally dissolved into water together with an acceptor material, and the obtained solution is applied by a spin coating method or the like. Since the hole transporting material is insoluble in an organic solvent, a layer stacked with the above-described organic light emitting material having light emitting properties can be formed. A mixture of PEDOT and camphor sulfonic acid (CSA) which serves as an acceptor material, a mixture of polyaniline [PANI] and polystyrene sulfonic acid [PSS] which serves as an acceptor material, and the like can be used as the high molecular weight organic light emitting material having hole transporting properties.

Further, a triplet excitation material containing a metal complex or the like as well as a singlet excitation light emitting material may be used for the light emitting layer. For example, among pixels emitting red, green, and blue light, a pixel emitting red light whose luminance is reduced by half in a relatively short time is made using a triplet excitation light emitting material and pixels emitting the other light are made using a singlet excitation light emitting material. A triplet excitation light emitting material has a characteristic that the material has a good luminous efficiency and consumes less power to obtain the same luminance. When a triplet excitation material is used for a red pixel, only a small amount of current is needed to be applied to the light emitting element. Thus, reliability can be improved. Pixels emitting red and green light may be made using a triplet excitation light emitting material and a pixel emitting blue light may be made using a singlet excitation light emitting material to achieve low power consumption. Lower power consumption can be achieved by forming a light emitting element which emits green light that has high visibility with a triplet excitation light emitting material.

A metal complex used as a dopant is an example of the triplet excitation light emitting material, and a metal complex having platinum that is a third transition series element as a metal center, a metal complex having iridium as a metal center, and the like are known. The triplet excitation light emitting material is not limited to the compounds. A compound having the above-described structure and an element belonging to any one of Groups 8 to 10 of the periodic table as a metal center can also be used.

The above-described materials for forming the layer including a light emitting material are just examples. The light emitting element can be formed by appropriately stacking functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode for a purpose or providing a light emitting material to be dispersed is acceptable as long as it does not apart from the scope of the present invention.

The light emitting element formed with the above-described material emits light by being biased in a forward direction. A pixel of a display device formed with a light emitting element can be driven by a simple matrix system or an active matrix system. In any system, each pixel emits light by applying a forward bias thereto at a specific timing; however, the pixel is in a non-light-emitting state for a certain period. Reliability of the light emitting element can be improved by applying a reverse bias at this non-light-emitting time. In the light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving, in other words, by applying a forward bias and a reverse bias alternately. Thus, reliability of the light emitting device can be improved.

Subsequently, a transparent protective layer 2064 for preventing water penetration is formed to cover the light emitting element. A silicon nitride film, a silicon oxide film, a silicon oxynitride film (a SiNO film (composition ratio: N>O) or a SiON film (composition ratio: N<O)), a thin film containing carbon as its main component (for example, a DLC film or a CN film), or the like, which can be obtained by a sputtering method or a CVD method, can be used as the transparent protective layer 2064.

Through the above described steps, a light emitting display panel can be manufactured. Note that a protective circuit, typically, a diode or the like for preventing electrostatic damage may be provided between the connection terminal and the source wiring layer (gate wiring layer) or in the pixel portion. In this case, electrostatic damage can be prevented by manufacturing the protective circuit according to a similar step to that of the above-described TFT and by connecting the gate wiring layer of the pixel portion to the drain wiring layer or the source wiring layer of the diode.

Note that any of Embodiment Modes 1 to 8 can be applied to this embodiment. In Embodiments 2 and 3, a liquid crystal display panel and a light emitting display panel are described as examples of a display panel; however, the present invention is not limited thereto. The present invention can be appropriately applied to an active type display panel such as a DMD (Digital Micromirror Device), a PDP (Plasma Display Panel), a FED (Field Emission Display), or an electrophoretic display device (electronic paper).

Embodiment 4

A mode of a light emitting element which can be applied to the above described Embodiments is described with reference to FIGS. 23A to 23F.

Figure 23A:
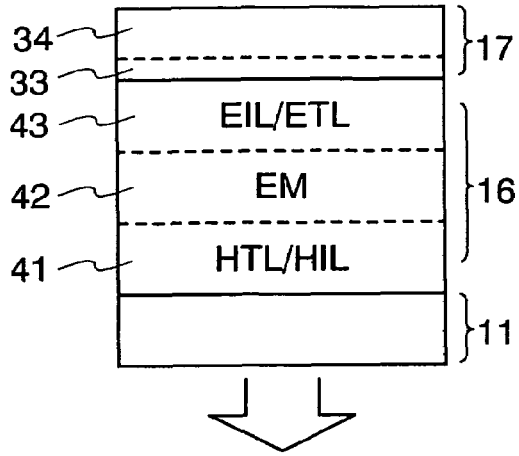
FIGS. 23A to 23F each show a mode of a light-emitting element that can be applied to the present invention.

FIG. 23A shows an example of a light emitting element whose first pixel electrode 11 is formed of a light transmitting oxide conductive material. The first pixel electrode 11 is formed of an oxide conductive material containing silicon oxide with a concentration of 1 atomic % to 15 atomic %. A layer including a light emitting material 16 is formed thereover, in which a hole injection layer or hole transport layer 41, a light emitting layer 42, and an electron transport layer or electron injection layer 43 are stacked. A second pixel electrode 17 is formed with a first electrode layer 33 containing an alkali metal or an alkaline earth metal such as LiF or MgAg and a second electrode layer 34 formed of a metal material such as aluminum. A pixel of this structure can emit light from the first pixel electrode 11 side as indicated by an arrow in FIG. 23A.

Figure 23B:
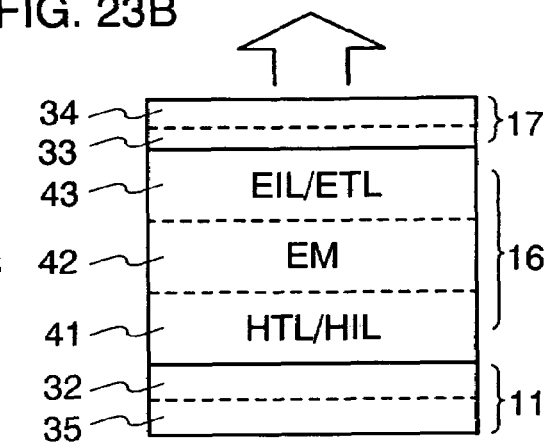

FIG. 23B shows an example of a light emitting element which emits light through a second pixel electrode 17. A first pixel electrode 11 is formed with a first electrode layer 35 formed of a metal such as aluminum or titanium or a metal material containing the metal and nitrogen with concentrations of a stoichiometric composition ratio or less and a second electrode layer 32 formed of an oxide conductive material containing silicon oxide with a concentration of 1 atomic % to 15 atomic %. A layer including a light emitting material 16 is formed thereover, in which a hole injection layer or hole transport layer 41, a light emitting layer 42, and an electron transport layer or electron injection layer 43 are stacked. The second pixel electrode 17 is formed with a third electrode layer 33 containing an alkali metal or an alkaline earth metal such as LiF or CaF and a fourth electrode layer 34 formed of a metal material such as aluminum. Each layer is formed to have a thickness of 100 nm or less so that the layer can transmit light. Accordingly, light can be emitted through the second pixel electrode 17.

Figure 23C:
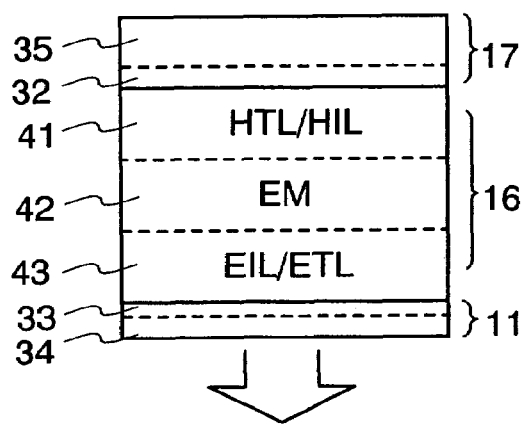
Figure 23D:
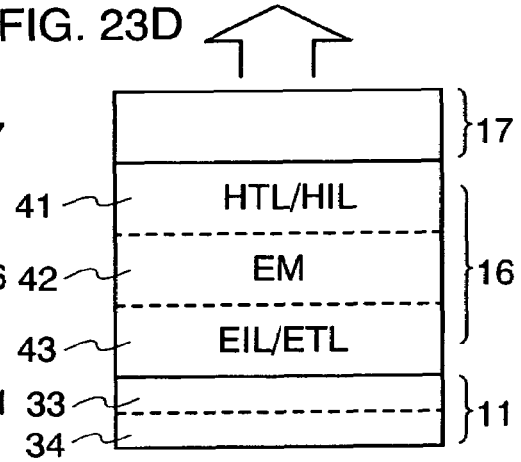
Figure 23E:
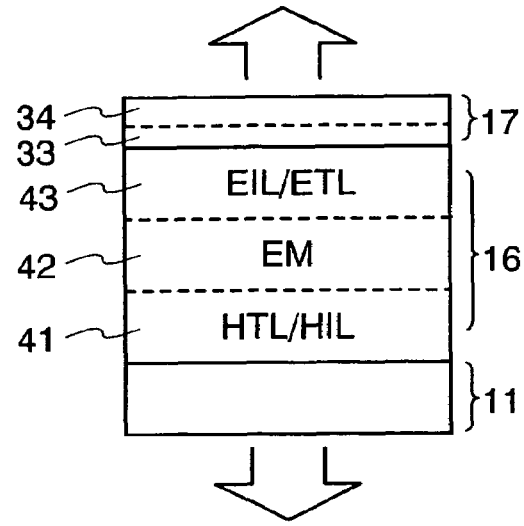

FIG. 23E shows an example of a light emitting element which emits light from both sides, through a first pixel electrode and a second pixel electrode. A light transmitting conductive film having a high work function is used for a first pixel electrode 11. A light transmitting conductive film having a low work function is used for a second pixel electrode 17. Typically, the first pixel electrode 11 may be formed of an oxide conductive material containing silicon oxide with a concentration of 1 atomic % to 15 atomic %, and the second pixel electrode 17 may be formed of a third electrode layer 33 containing an alkali metal or an alkaline earth metal such as LiF or CaF and a fourth electrode layer 34 formed of a metal material such as aluminum, each of which has a thickness of 100 nm or less.

FIG. 23C shows an example of a light emitting element which emits light through a first pixel electrode 11 and a structure in which a layer including a light emitting material 16 is formed by sequentially stacking an electron transport layer or electron injection layer 43, a light emitting layer 42, and a hole injection layer or hole transport layer 41. A second pixel electrode 17 is formed, from the side of the layer including a light emitting material 16, with a second electrode layer 32 formed of an oxide conductive material containing silicon oxide with a concentration of 1 atomic % to 15 atomic % and a first electrode layer 35 formed of a metal such as aluminum or titanium or a metal material containing the metal and nitrogen with a concentration of a stoichiometric composition ratio or less. The first pixel electrode 11 is formed with a third electrode layer 33 containing an alkali metal or an alkaline earth metal such as LiF or CaF and a fourth electrode layer 34 formed of a metal material such as aluminum. Each layer is formed to have a thickness of 100 nm or less so that the layer can transmit light. Accordingly, light can be emitted through the first pixel electrode 11.

FIG. 23D shows an example of a light emitting element which emits light through a second pixel electrode 17 and a structure in which a layer including a light emitting material 16 is formed by sequentially stacking an electron transport layer or electron injection layer 43, a light emitting layer 42, and a hole injection layer or hole transport layer 41 over a first pixel electrode 11. The first pixel electrode 11 is formed to have a similar structure to that shown in FIG. 23A and to be thick enough to reflect light emitted from the layer including a light emitting material 16. The second pixel electrode 17 is formed of an oxide conductive material containing silicon oxide with a concentration of 1 atomic % to 15 atomic %. In this structure, the hole injection layer or hole transport layer 41 is formed of inorganic metal oxide (typically, molybdenum oxide or vanadium oxide). Accordingly, oxygen to be introduced in forming the second pixel electrode 17 is supplied and hole injection properties are improved. Thus, drive voltage can be lowered.

Figure 23F:
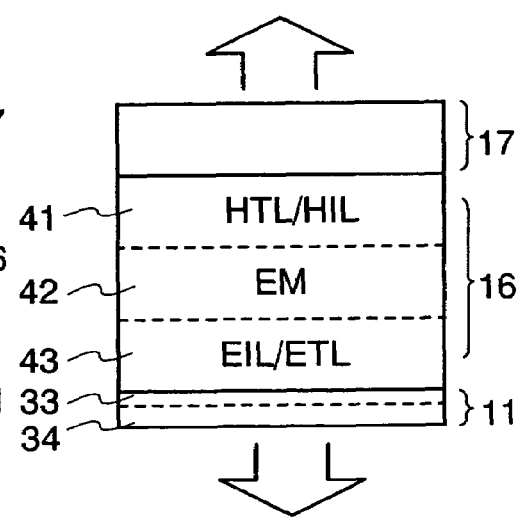

FIG. 23F shows an example of a light emitting element which emits light from both sides, through a first pixel electrode and a second pixel electrode. A light transmitting conductive film having a low work function is used for the first pixel electrode 11. A light transmitting conductive film having a high work function is used for the second pixel electrode 17. Typically, the first pixel electrode 11 is formed with a third electrode layer 33 containing an alkali metal or an alkaline earth metal such as LiF or CaF and a fourth electrode layer 34 formed of a metal material such as aluminum, each of which has a thickness of 100 nm or less, and the second pixel electrode 17 may be formed of an oxide conductive material containing silicon oxide with a concentration of 1 atomic % to 15 atomic %.

Embodiment 5

An equivalent circuit diagram of a pixel of a light emitting display panel described in the above described Embodiment and an operating method thereof are described with reference to FIGS. 24A to 24F. In a display device in which a video signal is digital, a method for operating a light emitting display panel includes a method in which a video signal inputted to a pixel is regulated by voltage and a method in which the video signal is regulated by current. The method in which a video signal is regulated by voltage includes a method in which voltage applied to a light emitting element is constant (CVCV) and a method in which current applied to a light emitting element is constant (CVCC). In addition, the method in which a video signal is regulated by current includes a method in which voltage applied to a light emitting element is constant (CCCV) and a method in which current applied to a light emitting element is constant (CCCC). In this embodiment, a pixel which performs CVCV operation is described with reference to FIGS. 24A and 24B. A pixel which performs CVCC operation is described with reference to FIGS. 24C to 24F.

Figure 24A:
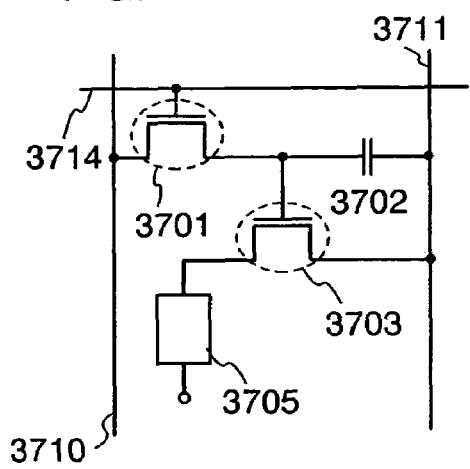
FIGS. 24A to 24F each show an equivalent circuit of a light-emitting element that can be applied to the present invention.
Figure 24B:
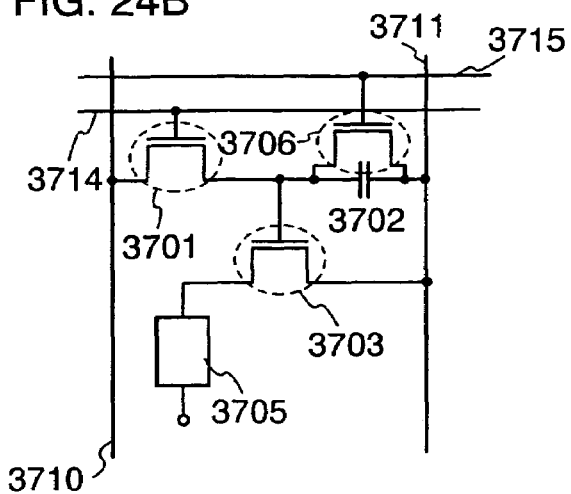

In pixels shown in FIGS. 24A and 24B, a signal line 3710 and a power supply line 3711 are arranged in a column direction and a scanning line 3714 is arranged in a row direction. In addition, the pixels include a switching TFT 3701, a driving TFT 3703, a capacitor element 3702, and a light emitting element 3705.

Note that the switching TFT 3701 and the driving TFT 3703 operate in a linear region when they are turned on. The driving TFT 3703 has a role of controlling voltage application to the light emitting element 3705. It is preferable from the viewpoint of manufacturing steps that both of the TFTs have the same conductivity. In this embodiment, the TFTs are formed to be p-channel TFTs. Further, the driving TFT 3703 may be not only an enhancement mode TFT but also a depletion mode TFT. In addition, a ratio of a channel width W to a channel length L (W/L) of the driving TFT 3703 preferably ranges from 1 to 1000, although it depends on the mobility of the TFT. The higher the W/L is, the more improved electrical characteristics of the TFT are.

In the pixels shown in FIGS. 24A and 24B, the switching TFT 3701 is a TFT for controlling input of a video signal to the pixel. When the switching TFT 3701 is turned on, the video signal is inputted to the pixel. Then, voltage of the video signal is stored in the capacitor element 3702.

In FIG. 24A, an opposite electrode of the light emitting element 3705 is an anode and an electrode connected to the driving TFT 3703 is a cathode, in the case where the power supply line 3711 is Vss and the opposite electrode of the light emitting element 3705 is Vdd, in other words, in the case of FIGS. 23C, 23D and 23F (reverse stacked structure). In this case, luminance variation due to variation in characteristics of the driving TFT 3703 can be suppressed.

In FIG. 24A, an opposite electrode of the light emitting element 3705 is a cathode and an electrode connected to the driving TFT 3703 is an anode, in the case where the power supply line 3711 is Vdd and the opposite electrode of the light emitting element 3705 is Vss, in other words, in the case of FIGS. 23A, 23B and 23E (sequence stacked structure). In this case, voltage of the video signal is held in the capacitor element 3702 and the driving TFT 3703 operates in a linear region by inputting the video signal having higher voltage than Vdd to the signal line 3710. Therefore, luminance variation due to variation in characteristics of the TFT can be suppressed.

The pixel shown in FIG. 24B has a similar structure to that of the pixel shown in FIG. 24A except that a TFT 3706 and a scanning line 3715 are added.

In the TFT 3706, ON or OFF is controlled by the scanning line 3715 that is arranged anew. When the TFT 3706 is turned ON, an electric charge held in the capacitor element 3702 is discharged, and the TFT 3703 is turned OFF. In other words, it is possible to make a state in which current is forced not to flow through the light emitting element 3705 by disposing the TFT 3706. Therefore, the TFT 3706 can be referred to as an erasing TFT. Accordingly, in the structure in FIG. 24B, a lighting period can be started simultaneously with or immediately after a start of a writing period without waiting for writing of signals in all pixels. Consequently, a duty ratio of light emission can be improved.

In the pixel having the operation structure, the value of electric current of the light emitting element 3705 can be determined by the driving TFT 3703 which operates in a linear region. According to the above-described structure, luminance variation of the light emitting element, which is caused by variation in characteristics of the TFT, can be suppressed, and a display device with improved image quality can be provided.

Subsequently, a pixel which performs CVCC operation is described with reference to FIGS. 24C to 24F. The pixel shown in FIG. 24C is provided with a power supply line 3712 and a current control TFT 3704 in addition to the pixel structure shown in FIG. 24A.

Figure 24C:
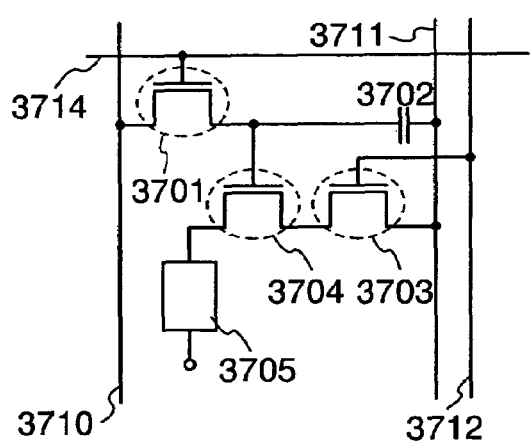
Figure 24D:
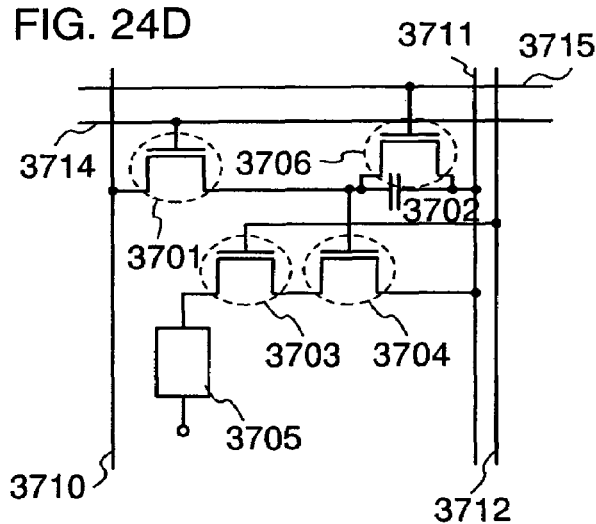
Figure 24E:
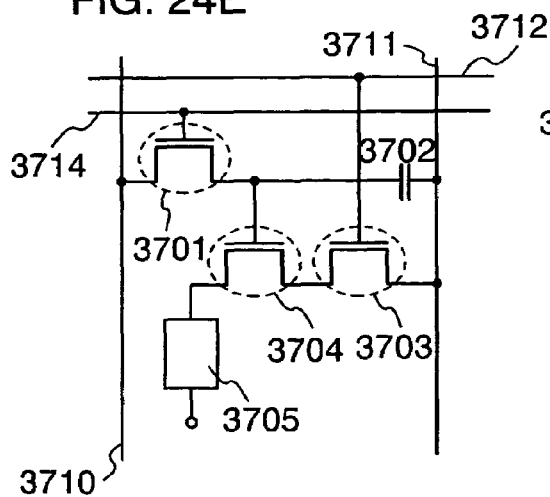

A pixel shown in FIG. 24E is different in the way that a gate electrode of a driving TFT 3703 is connected to a power supply line 3712 arranged in a row direction, but other than that, the pixel has a similar structure to the pixel shown in FIG. 24C. In other words, equivalent circuit diagrams of both of the pixels shown in FIGS. 24C and 24E are the same. However, each power supply line is formed using a conductive layer in a different layer when the power supply line 3712 is arranged in a column direction (FIG. 24C) and when the power supply line 3712 is arranged in a row direction (FIG. 24E). Here, a wiring connected to the gate electrode of the driving TFT 3703 is focused and the circuits are separately shown in FIGS. 24C and 24E to show that the wirings are formed in different layers.

Note that the switching TFT 3701 operates in a linear region and the driving TFT 3703 operates in a saturation region. In addition, the driving TFT 3703 has a role of controlling the value of current flowing through the light emitting element 3705, and the current controlling TFT 3704 operates in a saturation region and has a role of controlling supply of electric current to the light emitting element 3705.

Figure 24F:
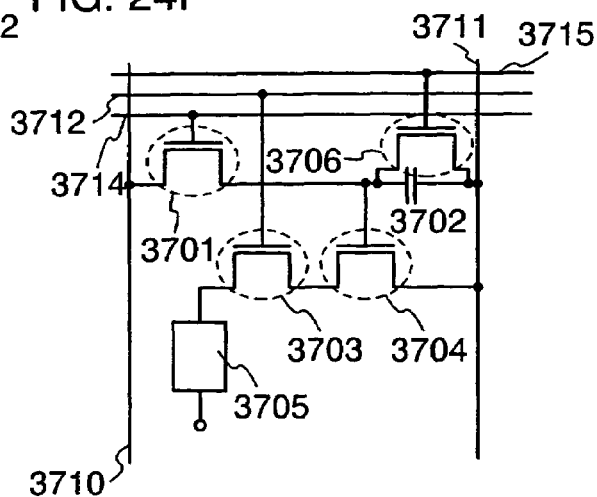

Pixels shown in FIGS. 24D and 24F have the same structure as the pixels shown in FIGS. 24C and 24E except that an erasing TFT 3706 and a scanning line 3715 are added.

Note that the pixels shown in FIGS. 24A and 24B also can perform CVCC operation. In the pixels having the operation structures shown in FIGS. 24C to 24F, Vdd and Vss can be appropriately changed as in the pixels shown in FIGS. 24A and 24B, in accordance with a current flowing direction through the light emitting element.

In the pixel having the above structure, the current controlling TFT 3704 operates in a linear region, so that slight variation in Vgs (gate-source voltage) of the current controlling TFT 3704 does not influence the value of electric current of the light emitting element 3705. In other words, the value of electric current of the light emitting element 3705 can be determined by the driving TFT 3703 which operates in a saturation region. According to the above-described structure, luminance variation of the light emitting element, which is caused by variation in characteristics of the TFT, can be suppressed, and a display device with improved image quality can be provided.

It is preferable to make a semiconductor film of a driving TFT large specifically in the case of forming a thin film transistor having an amorphous semiconductor or the like, since variation of the TFT can be reduced. Since the pixels shown in FIGS. 24A and 24B have a small number of TFTs, an aperture ratio can be increased.

The structure in which the capacitor element 3702 is provided is shown; however, the present invention is not limited thereto. When a gate capacitor or the like can be used as the capacitor that can hold a video signal, the capacitor element 3702 may not be provided.

When the semiconductor region of the thin film transistor is formed of an amorphous semiconductor film, a threshold value is easily shifted. Therefore, a circuit which compensates the threshold value is preferably provided in the pixel or in the periphery of the pixel.

Such an active matrix light emitting device is considered to be advantageous, because low voltage driving is possible since each pixel is provided with TFTs when a pixel density is increased. On the other hand, a passive matrix light emitting device in which TFTs are provided for every column can also be formed. In the passive matrix light emitting device, TFTs are not provided for each pixel; therefore, a high aperture ratio can be obtained.

In the display device according to the present invention, a driving method for screen display is not particularly limited. For example, a dot-sequential driving method, a line-sequential driving method, a plane-sequential driving method, or the like can be used as the driving method. Typically, the line-sequential driving method is employed, and a time-division gray scale driving method or an area gray scale driving method may be appropriately used. In addition, a video signal inputted to a source line of the display device may be an analog signal or a digital signal. A driving circuit or the like may be appropriately designed in accordance with the video signal.

As described above, various pixel circuits can be used.

Embodiment 6

Figure 26A:
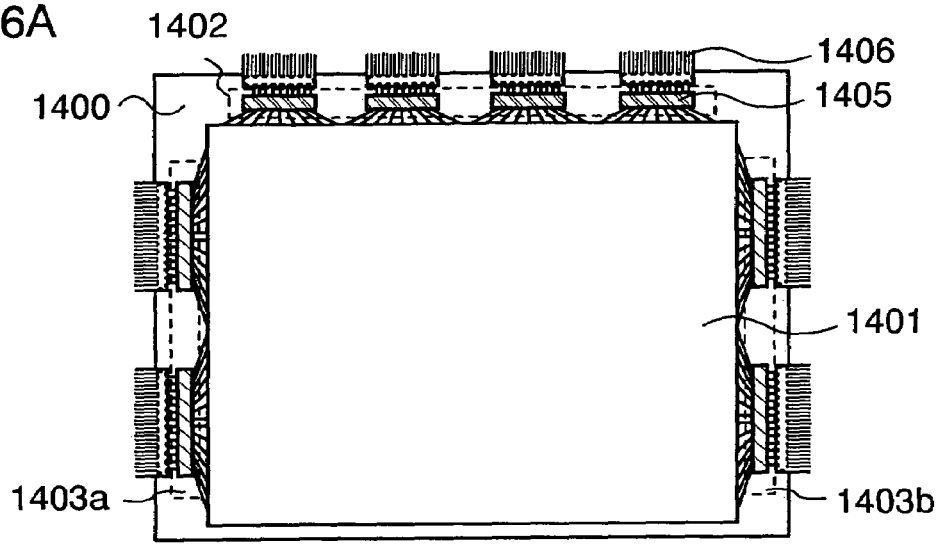
FIGS. 26A to 26C are each a top view showing a mounting method of a driver circuit in a display device according to the present invention.
Figure 26B:
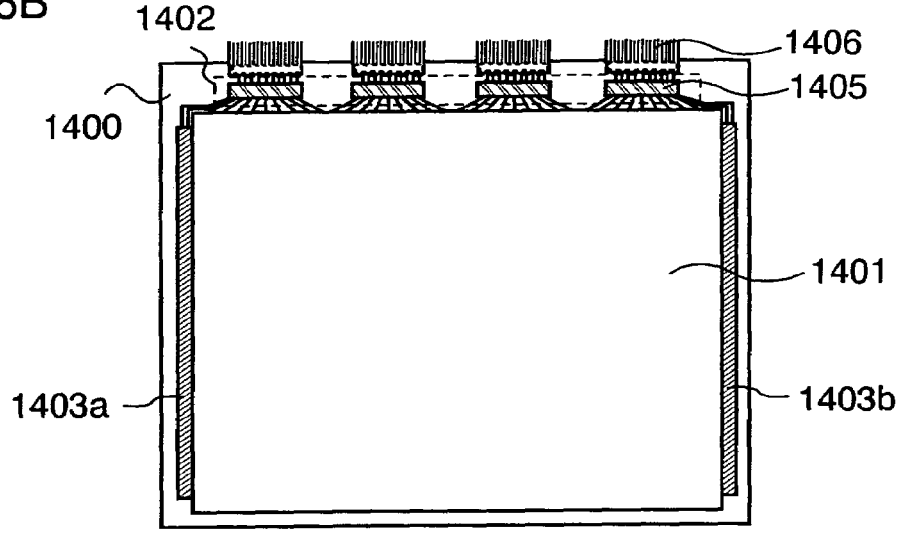
Figure 26C:
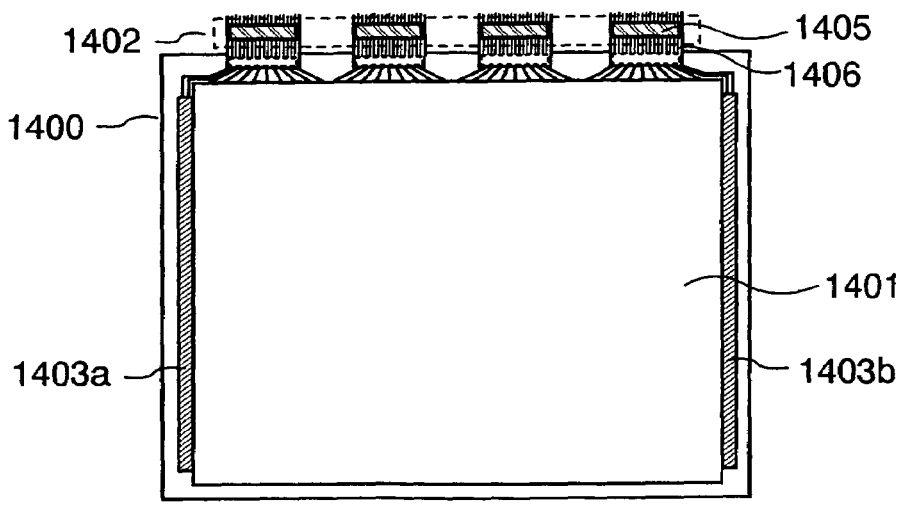

Mounting of a driver circuit on the display panel described in the above-described embodiment is described in Embodiment 6 with reference to FIGS. 26A to 26C.

As shown in FIG. 26A, a signal line driver circuit 1402 and scanning line driver circuits 1403a and 1403b are mounted on the periphery of a pixel portion 1401. In FIG. 26A, an IC chip 1405 is mounted on a substrate 1400 by a known anisotropic conductive adhesive agent, a mounting method using an anisotropic conductive film, a COG method, a wire bonding method, a reflow treatment using a solder bump, or the like as the signal line driver circuit 1402, the scanning line driver circuits 1403a and 1403b, and the like. Here, the COG method is used. Then, the IC chip is connected to an external circuit through an FPC (flexible printed circuit) 1406.

As shown in FIG. 26B, in the case of forming a TFT of a SAS or a crystalline semiconductor, a pixel portion 1401, scanning line driver circuits 1403a and 1403b, and the like may be integrated over a substrate, and a signal line driver circuit 1402 and the like may be separately mounted as an IC chip. In FIG. 26B, an IC chip 1405 is mounted on a substrate 1400 by a COG method as the signal line driver circuit 1402. Then, the IC chip is connected to an external circuit through an FPC 1406.

Further, as shown in FIG. 26C, a signal line driver circuit 1402 and the like may be mounted by a TAB method instead of the COG method. Then, an IC chip is connected to an external circuit through an FPC 1406. In FIG. 26C, the signal line driver circuit is mounted by a TAB method; however, a scanning line driver circuit may be mounted by the TAB method.

When the IC chip is mounted by the TAB method, the pixel portion can be formed to occupy a large area over the substrate, and thus a frame can be narrowed.

The IC chip is formed using a silicon wafer, but an IC in which a circuit is formed over a glass substrate (hereinafter referred to as a driver IC) may be provided in place of the IC chip. Since the IC chip is taken out of a circular silicon wafer, there is limitation on the shape of a mother substrate. On the other hand, the driver IC has a glass mother substrate and there is no limitation on the shape. Thus, productivity can be improved. Therefore, the geometry of the driver IC can be freely set. For example, when the driver IC is formed to have a long side of 15 mm to 80 mm in length, the necessary number of the driver ICs can be reduced as compared with the case of mounting the IC chip. Accordingly, the number of connection terminals can be reduced and yield in manufacturing can be improved.

The driver IC can be formed using a crystalline semiconductor formed over a substrate, and the crystalline semiconductor may be formed by continuous wave laser light irradiation. A semiconductor film formed by continuous wave laser light irradiation has few crystal defects and has crystal grains with large grain diameters. Accordingly, a transistor having such a semiconductor film has favorable mobility and response speed and thus high-speed drive can be performed, which is suitable for the driver IC.

Embodiment 7

Figure 18:
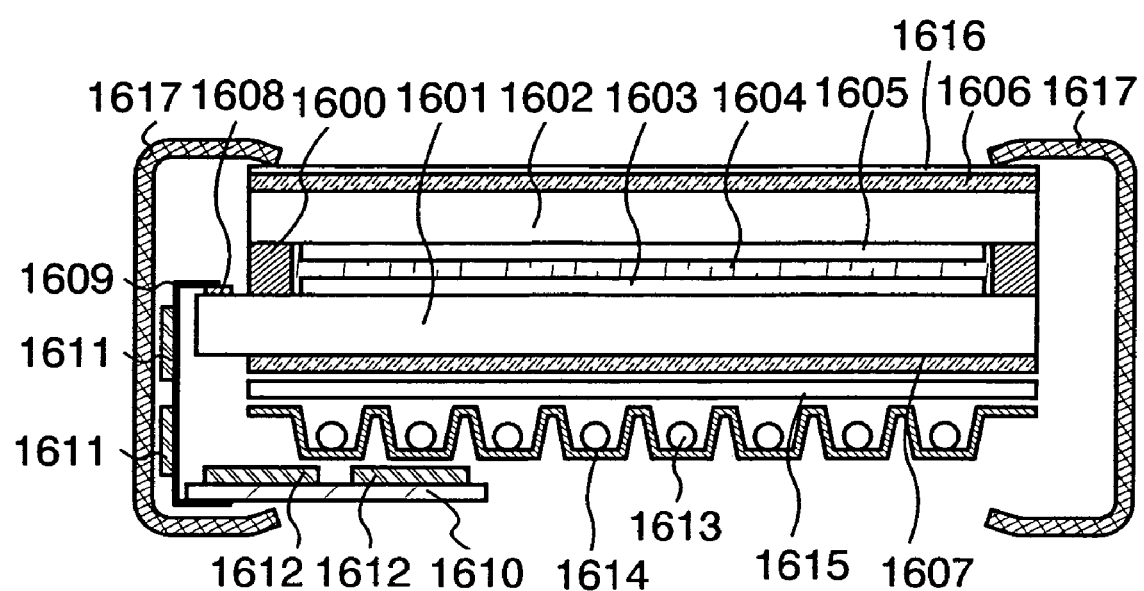
FIG. 18 shows a structure of a liquid crystal display module according to the present invention.

A display module is described in Embodiment 7. Here, a liquid crystal module is described as an example of a display module with reference to FIG. 18.

An active matrix substrate 1601 and an opposite substrate 1602 are fixed to each other with a sealing agent 1600 and a pixel portion 1603 and a liquid crystal layer 1604 are provided therebetween to form a display region.

A colored layer 1605 is necessary to perform color display. In the case of an RGB system, the colored layer corresponding to each color of red, green, and blue is provided corresponding to each pixel. Polarizing plates 1606 and 1607 are provided outside the active matrix substrate 1601 and the opposite substrate 1602. In addition, a protective film 1616 is formed on the surface of the polarizing plate 1606, which relieves impact from outside.

A connection terminal 1608 provided for the active matrix substrate 1601 is connected to a wiring substrate 1610 through an FPC 1609. The FPC or a connection wiring is provided with a pixel driver circuit (an IC chip, a driver IC, or the like) 1611, and an external circuit 1612 such as a control circuit or a power supply circuit is incorporated in the wiring substrate 1610.

A cold cathode fluorescent tube 1613, a reflecting plate 1614, and an optical film 1615 are a backlight unit and serve as a light source to project light on a liquid crystal display panel. The liquid crystal panel, the light source, the wiring substrate, the FPC, and the like are held and protected by a bezel 1617.

Note that any of Embodiment Modes 1 to 8 can be applied to this embodiment.

Embodiment 8

Figure 25A:
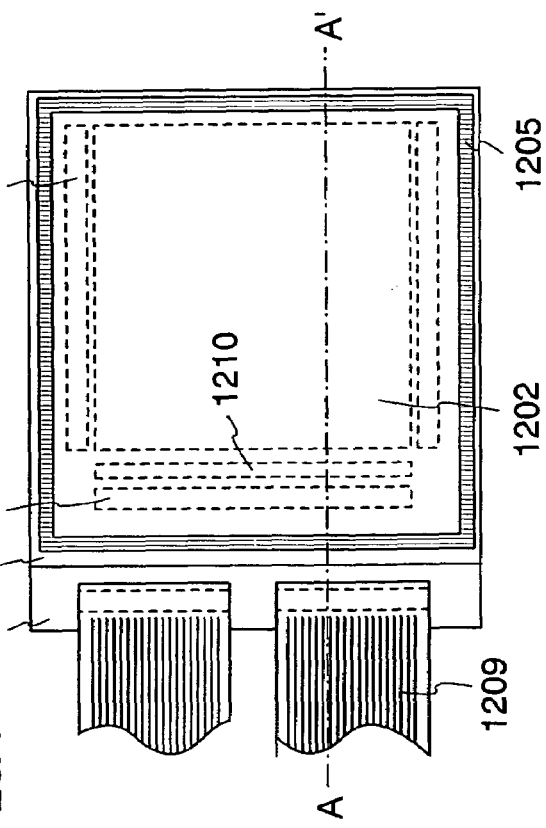
FIGS. 25A and 25B each show a structure of a light-emitting display panel according to the present invention.
Figure 25B:
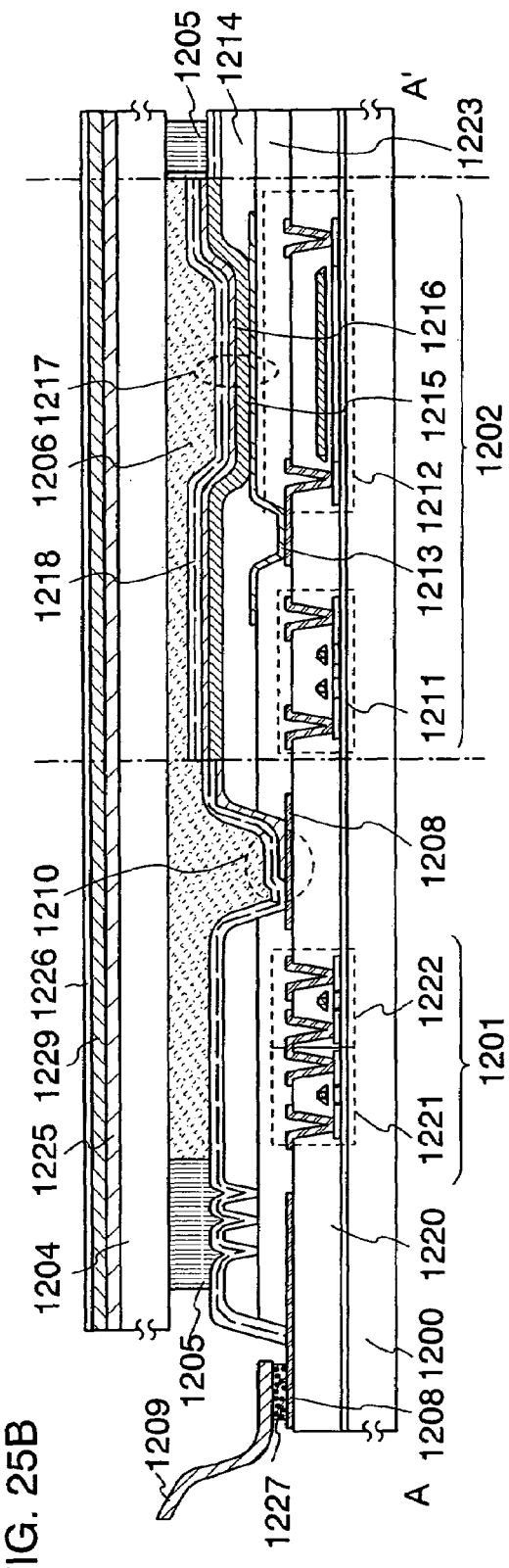

An appearance of a light emitting display module is described in Embodiment 8 as an example of a display module with reference to FIGS. 25A and 25B. FIG. 25A is a top view of a panel in which a first substrate and a second substrate are sealed with a first sealing agent 1205 and a second sealing agent. FIG. 25B corresponds to a cross-sectional view taken along a line A-A' in FIG. 25A.

In FIG. 25A, reference numeral 1201 shown in dashed line denotes a signal line (source line) driver circuit; 1202, a pixel portion; and 1203, a scanning line (gate line) driver circuit. In this embodiment, the signal line driver circuit 1201, the pixel portion 1202, and the scanning line driver circuit 1203 are in a region sealed with the first sealing agent 1205 and the second sealing agent. A high-viscosity epoxy resin including filler is preferably used as the first sealing agent 1205. A low-viscosity epoxy resin is preferably used as the second sealing agent. The first sealing agent 1205 and the second sealing agent are preferably materials which transmit as little water or oxygen as possible.

A drying agent may be provided between the pixel portion 1202 and the first sealing agent 1205. Moreover, in the pixel portion, a drying agent may be provided over a scanning line or a signal line. It is preferable to use a substance which adsorbs water ($H_2O$) by chemical adsorption like an oxide of an alkaline earth metal such as calcium oxide (CaO) or barium oxide (BaO) as the drying agent. However, without being limited thereto, a substance which adsorbs water by physical adsorption, such as zeolite or silica gel, may also be used.

The drying agent can be fixed to the second substrate 1204 with a granular substance of the drying agent contained in a highly moisture permeable resin. As the highly moisture permeable resin, an acrylic resin can be used, such as ester acrylate, ether acrylate, ester urethane acrylate, ether urethane acrylate, butadiene urethane acrylate, special urethane acrylate, epoxy acrylate, amino resin acrylate, or acrylic resin acrylate. In addition, an epoxy resin can be used, such as a bisphenol A type liquid resin, a bisphenol A type solid resin, a bromine-containing epoxy resin, a bisphenol F type resin, a bisphenol AD type resin, a phenol resin, a cresol type resin, a novolac resin, a cyclic aliphatic epoxy resin, an Epi-Bis type epoxy resin, a glycidyl ester resin, a glycidyl amine resin, a heterocyclic epoxy resin, or a modified epoxy resin. In addition, another substance may be used. For example, an inorganic material such as siloxane polymer, polyimide, PSG (phosphosilicate glass), BPSG (borophosphosilicate glass), or the like may be used.

The entry of moisture into a display element and the deterioration caused thereby can be suppressed without decreasing an aperture ratio by providing the drying agent in a region overlapped with the scanning line or by fixing the drying agent to the second substrate with a granular substance of the drying agent contained in the highly moisture permeable resin.

Note that reference numeral 1210 denotes a connection wiring for transmitting a signal to be inputted to the signal line driver circuit 1201 and the scanning line driver circuit 1203, and the signal line driver circuit 1201 and the scanning driver circuit 1203 receive a video signal or a clock signal from an FPC (flexible printed wiring) 1209 that is an external input terminal through the connection wiring 1208.

Subsequently, a cross-sectional structure is described with reference to FIG. 25B. A driver circuit and a pixel portion 1202 are formed over a first substrate 1200 and a plurality of semiconductor elements typified by a TFT are included. A signal line driver circuit 1201 as the driver circuit and a pixel portion are shown. Note that the signal line driver circuit 1201 is formed using a CMOS circuit which is a combination of an n-channel TFT 1221 and a p-channel TFT 1222.

In this embodiment, TFTs of the signal line driver circuit, the scanning line driver circuit, and the pixel portion are formed over one substrate. Therefore, the volume of a light emitting display device can be reduced.

The pixel portion 1202 has a plurality of pixels each including a switching TFT 1211, a driving TFT 1212, and a first pixel electrode (anode) 1213 made of a reflective conductive film which is electrically connected to the drain of the driving TFT 1212.

An interlayer insulating film 1220 of the TFTs 1211, 1212, 1221, and 1222 can be formed of a material containing an inorganic material (such as silicon oxide, silicon nitride, and silicon oxynitride) or an organic material (such as polyimide, polyamide, polyimide amide, benzocyclobutene, and siloxane polymer) as its main component. When the interlayer insulating film is formed of siloxane polymer, it becomes an insulating film having a skeleton structure formed by the bond of silicon and oxygen and including hydrogen or/and alkyl group in a side chain.

An insulator (referred to as a bank, a partition wall, a barrier, a mound, or the like) 1214 is formed at both edge portions of the first pixel electrode (anode) 1213. The insulator 1214 is formed to have a curved surface at an upper edge portion or a lower edge portion thereof in order to increase the coverage of a film to be formed over the insulator 1214. The insulator 1214 may be formed of a material containing an inorganic material (such as silicon oxide, silicon nitride, and silicon oxynitride) or an organic material (such as polyimide, polyamide, polyimide amide, benzocyclobutene, and siloxane polymer) as its main component. The insulator 1214 may be covered with a protective film (planarizing layer) formed of an aluminum nitride film, an aluminum nitride oxide film, a thin film containing carbon as its main component, or a silicon nitride film. Stray light from a light emitting element to be formed can be absorbed by the insulator 1214 by using, as the insulator 1214, an organic material in which a material absorbing visible light, such as a black pigment or a coloring matter is dissolved or dispersed. Thus, the contrast of each pixel is enhanced. Further, the interlayer insulating film 1220 formed of a light-shielding insulator can generate a light-shielding effect when combined with the insulator 1214.

A layer including a light emitting material 1215 is selectively formed over the first pixel electrode (anode) 1213 by evaporating an organic compound material.

Thus, a light emitting element 1217 including the first pixel electrode (anode) 1213, the layer including a light emitting material 1215, and a second pixel electrode (cathode) 1216 is formed. The light emitting element 1217 emits light to the side of the second substrate 1204.

The light-emitting element 1217 can appropriately have the structure described in Embodiment 5.

A protective stacked layer 1218 is formed to seal the light emitting element 1217. The protective stacked layer is a stacked layer of a first inorganic insulating film, a stress relaxation film, and a second inorganic insulating film. The protective stacked layer 1218 and the second substrate 1204 are attached to each other with the first sealing agent 1205 and the second sealing agent 1206. Note that the second sealing agent is preferably dropped using an apparatus for dropping a sealing agent like the apparatus for dropping liquid crystal shown in FIGS. 15A and 15B described in Embodiment 3. After the sealing agent is applied onto the active matrix substrate by being dropped or discharged from a dispenser, the second substrate is attached to the active matrix substrate and ultraviolet curing is performed in vacuo. In this manner, sealing can be performed.

A polarizing plate 1225 is fixed on the surface of the second substrate 1204, and a half-wave or quarter-wave retardation plate 1229 and an anti-reflective film 1226 are formed on the surface of the polarizing plate 1225. Alternatively, the half-wave or quarter-wave retardation plates 1229 and the polarizing plate 1225 may be sequentially formed from the side of the second substrate 1204. The retardation plate and the polarizing plate can prevent external light from being reflected by the pixel electrode. When the first pixel electrode 1213 and the second pixel electrode 1216 are formed of a light transmitting or semi-light transmitting conductive film and the interlayer insulating film 1223 is formed of a material which absorbs visible light or an organic material in which a material absorbing visible light is dissolved or dispersed, external light is not reflected by each pixel electrode. Therefore, the retardation plate and the polarizing plate may not be used.

A connection wiring 1208 is electrically connected to an FPC 1209 by an anisotropic conductive film or an anisotropic conductive resin 1227. Further, a connection portion of each wiring layer and a connection terminal is preferably sealed with a sealing resin. This structure can prevent water from a section from entering and deteriorating the light emitting element.

Note that a space between the second substrate 1204 and the protective stacked layer 1218 may be filled with an inert gas, for example, a nitrogen gas. The entry of water or oxygen can be further prevented.

A colored layer can be provided between the pixel portion 1202 and the polarizing plate 1225. In this case, full color display can be performed by providing the pixel portion with a light emitting element which can emit white light and by separately providing the second substrate 1204 with colored layers showing RGB. In addition, full color display can be performed by providing the pixel portion with a light emitting element which can emit blue light and by separately providing a color conversion layer or the like. In addition, each pixel portion can be provided with light emitting elements which emit red, green, and blue light, and the colored layer can be used. Such a display module has high color purity of each RBG and can perform high-definition display.

A light emitting display module may be formed using a substrate of a film, a resin, or the like for either the first substrate 1200 or the second substrate 1204 or both thereof. A display device can be reduced in weight, size, and thickness by sealing without using an opposite substrate in this manner.

Note that any of Embodiment Modes 1 to 8 can be applied to this embodiment. A liquid crystal display module and a light emitting display module are described as an example of a display module in this embodiment; however, the present invention is not limited thereto. The present invention can be appropriately applied to a display module such as a DMD (Digital Micromirror Device), a PDP (Plasma Display Panel), a FED (Field Emission Display), or an electrophoretic display device (electronic paper).

Embodiment 9

Figure 28:
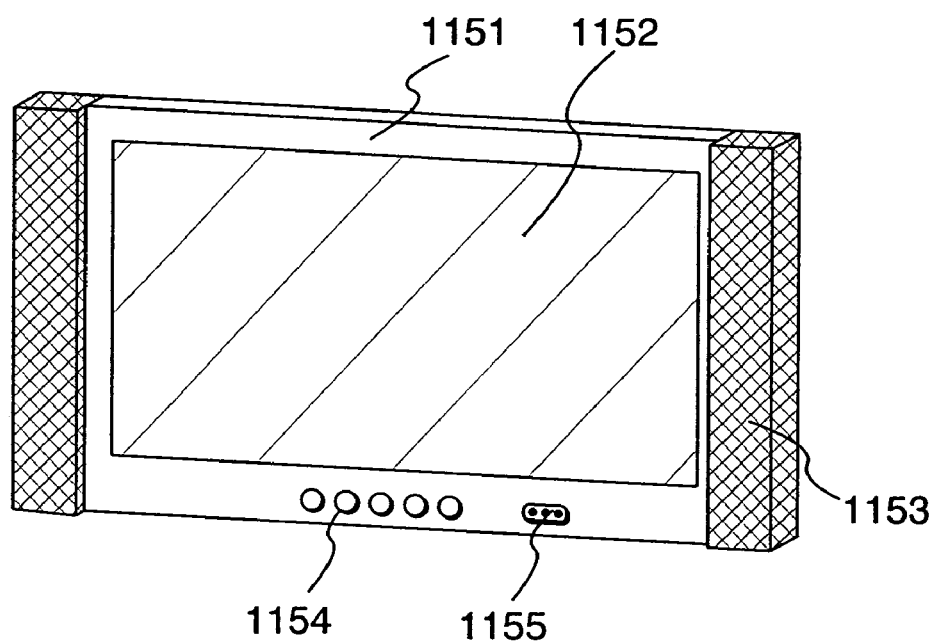
FIG. 28 shows an example of an electronic device.
Figure 29A:
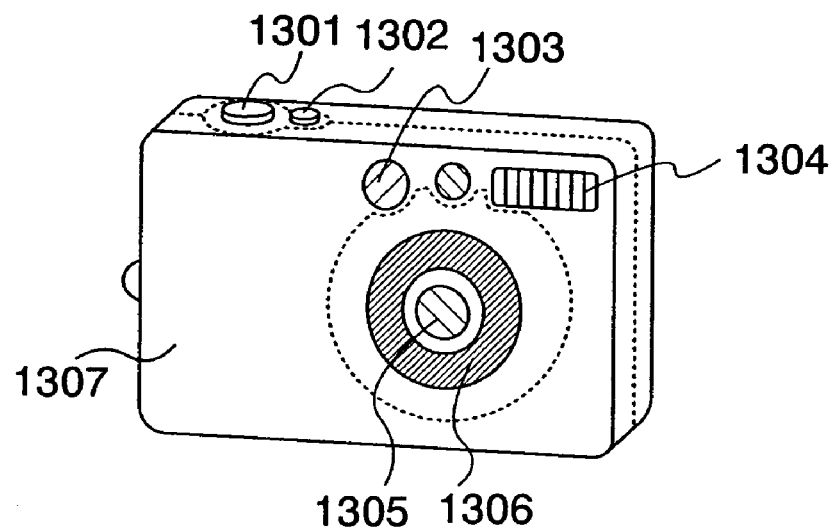
FIGS. 29A and 29B each show an example of an electronic device.
Figure 29B:
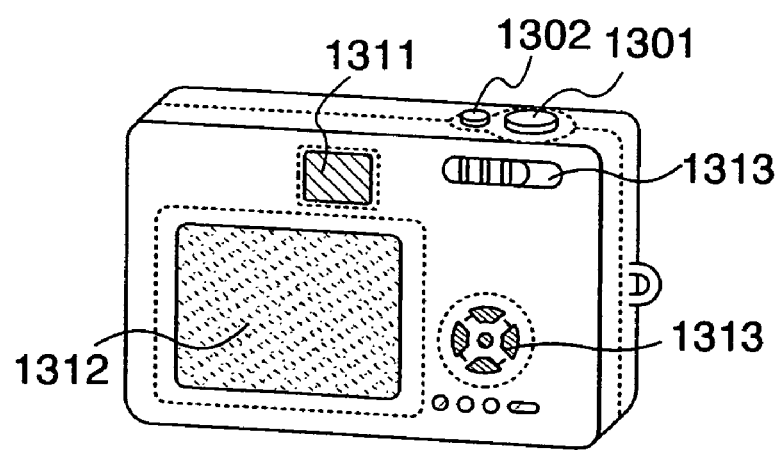

Various electronic devices can be manufactured by incorporating the display device described in the above described embodiment into a chassis. Examples of electronic devices can be given as follows: a television set, a camera such as a video camera or a digital camera, a goggle type display (head mounted display), a navigation system, an audio reproducing device (a car audio, an audio component, or the like), a personal computer, a game machine, a personal information terminal (a mobile computer, a cellular phone, a portable game machine, an electronic book, or the like), an image reproducing device provided with a recording medium (specifically, a device capable of reproducing a recording medium such as a Digital Versatile Disc (DVD) and having a display that can display the image), and the like. Here, a television set and a block diagram thereof are shown in FIG. 27 and FIG. 28, respectively and a digital camera is shown in FIGS. 29A and 29B as typical examples of the electronic devices.

Figure 27:
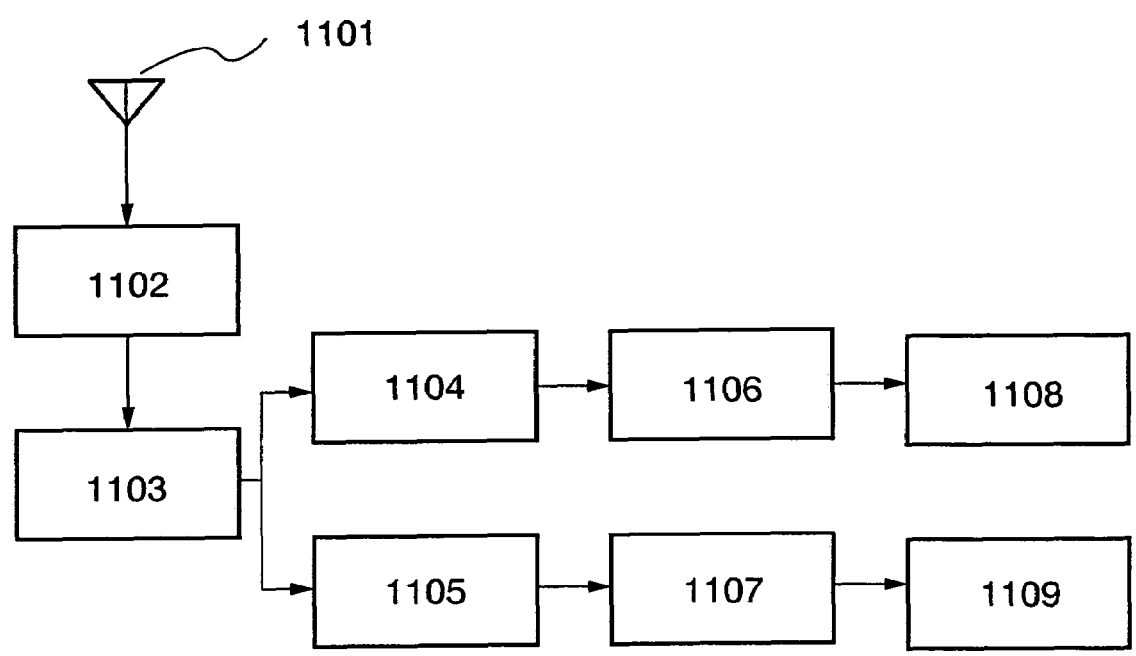
FIG. 27 is a block diagram showing an example of an electronic device.

FIG. 27 shows a typical structure of a television set that receives analog television broadcasting. In FIG. 27, the airwaves for television broadcasting received by an antenna 1101 are inputted to a tuner 1102. The tuner 1102 generates and outputs intermediate frequency (IF) signals by mixing the high frequency television signals inputted from the antenna 1101 with local repetition frequency signals that are controlled in accordance with the desired reception frequency.

The IF signals taken out by the tuner 1102 are amplified to required voltage by an intermediate frequency amplifier (IF amplifier) 1103. Thereafter, the amplified IF signals are detected by a video detection circuit 1104 and an audio detection circuit 1105. The video signals outputted from the video detection circuit 1104 are separated into luminance signals and chrominance signals by a video processing circuit 1106. Further, the luminance signals and the chrominance signals are subjected to the predetermined video signal processing to become video signals, so that the video signals are outputted to a video output portion 1108 of the display device of the present invention, typically, a liquid crystal display device, a light emitting display device, a DMD (Digital Micromirror Device), a PDP (Plasma Display Panel), a FED (Field Emission Display), an electrophoretic display device (electronic paper), or the like. Note that a television using a liquid crystal display device as a display device is a liquid crystal television, and a television using a light emitting display device is an EL (Electro Luminescence) television. The same applies to the case of using another display device.

The signals outputted from the audio detection circuit 1105 are subjected to processing such as FM demodulation by an audio processing circuit 1107 to become audio signals. The audio signals are then appropriately amplified to be outputted to an audio output portion 1109 of a speaker or the like.

The television set according to the present invention may be applicable to digital broadcastings such as terrestrial digital broadcasting, cable digital broadcasting, and BS digital broadcasting as well as analog broadcastings such as terrestrial broadcasting in a VHF band, a UHF band, or the like, cable broadcasting, and BS broadcasting.

FIG. 28 is a front perspective view of the television set, which includes a chassis 1151, a display portion 1152, a speaker portion 1153, an operational portion 1154, a video input terminal 1155, and the like. The television set shown in FIG. 28 has the structure as shown in FIG. 27.

The display portion 1152 is an example of the video output portion 1108 in FIG. 27, which displays images.

The speaker portion 1153 is an example of the audio output portion in FIG. 27, which outputs sound.

The operational portion 1154 is provided with a power source switch, a volume switch, a channel selection switch, a tuning switch, a selection switch, and the like to turn ON and OFF the television set, select images, control sound, select a tuner, and the like by holding the switches down. Note that the above-described selection can be carried out also by a remote-control operation unit, although not shown.

The video input terminal 1155 inputs video signals received from outside, e.g., from a VTR, a DVD, a game machine, or the like, to the television set.

In the case where the television set described in this embodiment is a wall-mounted television set, a portion for hanging on walls is provided at the rear of the body thereof.

A television set can be manufactured at low cost with high throughput and yield by applying the display device that is one example of a semiconductor device of the present invention to the display portion of the television set. Further, a television set can be manufactured at low cost with high throughput and yield by applying a semiconductor device of the present invention to a CPU controlling a video detection circuit, video processing circuit, an audio detection circuit, or an audio processing circuit of the television set. Consequently, the television set can be used for various intended purposes, in particular, a large area display medium such as a wall-mounted television set, an information display board used in a railway station, airport, or the like, and an advertisement display board on the street, and the like.

FIGS. 29A and 29B show an example of a digital camera. FIG. 29A is a front perspective view of the digital camera, and FIG. 29B is a rear perspective view thereof. In FIG. 29A, the digital camera includes a release button 1301, a main switch 1302, a viewfinder window 1303, flash 1304, a lens 1305, a lens barrel 1306, and a chassis 1307.

In FIG. 29B, the digital camera also includes a viewfinder eyepiece 1311, a monitor 1312, and an operational button 1313.

When the release button 1301 is held halfway down, a focus adjustment mechanism and an exposure adjustment mechanism are operated. Subsequently, holding the release button all the way down releases a shutter.

The digital camera is turned ON or OFF by pressing or turning the main switch 1302.

The viewfinder window 1303 is provided above the lens 1305 on the front face of the digital camera, and is used to check a shooting range and a focusing point through the viewfinder eyepiece 1311 shown in FIG. 29B.

The flash 1304 is provided at the upper portion of the front face of the digital camera. In the case of photographing a subject of the low luminance level, auxiliary light is emitted simultaneously when the release button is held down and the shutter is opened.

The lens 1305 is provided on the front of the digital camera. The lens includes a focusing lens, a zoom lens, and the like. A shooting optical system includes the lens along with a shutter and an aperture, which are not shown in the drawing. An image sensing device such as a CCD (Charge Coupled Device) is provided at the rear of the lens.

The lens barrel 1306 is used for shifting the lens position to focus the focusing lens, the zoom lens, and the like on a subject. At the time of taking a picture, the lens barrel is protruded from the body so that the lens 1305 is shifted toward a subject. At the time of carrying the digital camera, the lens 1305 is stored inside the main body to be compact. Note that, although the lens barrel can be protruded to take a close-up picture of a subject in this embodiment, the present invention is not limited to the structure. The present invention may be applied to a digital camera which can take a close-up picture without protruding a lens barrel due to a structure of a shooting optical system inside the chassis 1307.

The viewfinder eyepiece 1311 is provided at the upper portion of the rear of the digital camera, through which the shooting range and the focusing point are checked by sight.

The operational button 1313 is a button for various kinds of functions and is provided at the rear of the digital camera. The operational button includes a setup button, a menu button, a display button, a functional button, a selection button, and the like.

A digital camera can be manufactured at low cost with high throughput and yield by applying the display device that is one example of semiconductor devices of the present invention to a monitor. In addition, a semiconductor device of the present invention is applied to a CPU that conducts a related process according to input operation of various functional buttons, a main switch, a release button and the like; a circuit that conducts an automatic focusing operation and an automatic focus adjusting operation; a driving control circuit of electronic flash; a timing control circuit that controls driving of a CCD; an imaging circuit generating a video signal from a photoelectric-converted signal by an image sensing device such as a CCD; an A/D conversion circuit that converts a video signal generated in the imaging circuit to a digital signal; a CPU controlling each circuit such as a memory interface that writes video data to a memory and reads video data; and the like, and therefore, a digital camera can be manufactured at low cost with high throughput and yield.

What is claimed is:

1. A method for manufacturing a semiconductor device, comprising the steps of:
   forming a pattern by discharging a composition comprising metal particles and an organic resin over a substrate by a droplet discharging method;
   irradiating a portion of the pattern with laser light to bake a portion of the metal particles included in the pattern to form a wiring wherein a remaining portion of the pattern not irradiated with the laser light remains adjacent to side surfaces of the wiring, and
   forming an insulating layer over the wiring and the remaining portion.

2. The method for manufacturing a semiconductor device according to claim 1, wherein irradiation of the laser light is conducted in a direction parallel to a major axis of the pattern.

3. The method for manufacturing a semiconductor device according to claim 1, wherein the laser light is continuous laser light.

4. The method for manufacturing a semiconductor device according to claim 1, wherein the laser light is pulsed laser light.

5. The method for manufacturing a semiconductor device according to claim 1, wherein the remaining portion has a round corner.

6. The method for manufacturing a semiconductor device according to claim 1, wherein the pattern is formed under low pressure.

7. A method for manufacturing a semiconductor device, comprising the steps of:
- forming a pattern by discharging a composition comprising an organic resin and metal particles dispersed in the organic resin by a droplet discharging method;
- irradiating a selected portion of the pattern with laser light to increase a conductivity of The selected portion of the pattern and form a wiring wherein a remaining portion of the pattern not irradiated with the laser light remains adjacent to side surfaces of the wiring, and
- forming an insulating layer over the wiring and the remaining portion.

8. The method for manufacturing a semiconductor device according to claim 7, wherein the laser light is continuous laser light.

9. The method for manufacturing a semiconductor device according to claim 7, wherein the laser light is pulsed laser light 10. The method for manufacturing a semiconductor device according to claim 7, wherein the pattern is formed under low pressure.

11. The method for manufacturing a semiconductor device according to claim 7, wherein the remaining portion has a round corner.

12. method for manufacturing a semiconductor device, comprising the steps of:
- forming a pattern by discharging a composition comprising an organic resin and metal particles dispersed in the organic resin by a droplet discharging method;
- removing a portion of the organic resin and melting a portion of the metal particles by irradiating a selected portion of the pattern with laser light to form a wiring wherein a remaining portion of the pattern not irradiated with the laser light remains adjacent to side surfaces of the wiring, and
- forming an insulating layer over the wiring and the remaining portion.

13. The method for manufacturing a semiconductor device according to claim 12, wherein the pattern is formed under low pressure.

14. The method for manufacturing a semiconductor device according to claim 12, wherein the remaining portion has a round corner.

15. A method for manufacturing a semiconductor device, comprising the steps of:
- forming a pattern by discharging a composition comprising metal particles and an organic resin over a substrate;
- irradiating a portion of the pattern with laser light to bake a portion of the metal particles included in the pattern to form a gate electrode wherein a remaining portion of the pattern not irradiated with the laser light remains as sidewalls adjacent to side surfaces of the gate electrode,
- forming an insulating layer over the gate electrode and the sidewalls.

16. The method for manufacturing a semiconductor device according to claim 15, wherein irradiation of the laser light is conducted in a direction parallel to a major axis of the pattern.

17. The method for manufacturing a semiconductor device according to claim 15, wherein the laser light is continuous laser light.

18. The method for manufacturing a semiconductor device according to claim 15, wherein the laser light is pulsed laser light.

19. The method for manufacturing a semiconductor device according to claim 15, wherein the pattern is formed under low pressure.

20. The method for manufacturing a semiconductor device according to claim 15,
- wherein a semiconductor layer is formed over the substrate,
- wherein a gate insulating layer is formed over the semiconductor layer, and
- wherein the gate electrode is formed over the gate insulating layer.

21. The method for manufacturing a semiconductor device according to claim 20, further comprising the step of forming an LDD region by using the sidewalls.

22. The method for manufacturing a semiconductor device according to claim 15, wherein the sidewalls have a round corner.

23. A method for manufacturing a semiconductor device, comprising the steps of:
- forming a pattern by discharging a composition comprising an organic resin and metal particles over a substrate;
- irradiating a portion of the pattern with laser light to bake a portion of the metal particles included in the pattern to form a gate electrode wherein a remaining portion of the pattern not irradiated with the laser light remains adjacent to side surfaces of the gate electrode,
- forming a gate insulating layer over the gate electrode and the remaining portion, and
- forming a semiconductor layer over the gate insulating layer.

24. The method for manufacturing a semiconductor device according to claim 23, wherein the laser light is continuous laser light.

25. The method for manufacturing a semiconductor device according to claim 23, wherein the laser light is pulsed laser light.

26. The method for manufacturing a semiconductor device according to claim 23, wherein the pattern is formed under low pressure.

27. The method for manufacturing a semiconductor device according to claim 23, wherein the remaining portion has a round corner.

* * * * *